United States Patent
Tsushima et al.

(10) Patent No.: US 11,451,003 B2
(45) Date of Patent: Sep. 20, 2022

(54) LASER GAS REGENERATING APPARATUS AND ELECTRONIC DEVICE MANUFACTURING METHOD

(71) Applicant: Gigaphoton Inc., Tochigi (JP)

(72) Inventors: Hiroaki Tsushima, Oyama (JP); Satoshi Tanaka, Oyama (JP); Yousuke Fujimaki, Oyama (JP); Takeshi Asayama, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 50 days.

(21) Appl. No.: 17/009,160

(22) Filed: Sep. 1, 2020

(65) Prior Publication Data

US 2020/0403371 A1 Dec. 24, 2020

Related U.S. Application Data

(63) Continuation of application No. PCT/JP2018/039236, filed on Oct. 22, 2018.

(30) Foreign Application Priority Data

Apr. 24, 2018 (JP) .................. PCT/JP2018/016600

(51) Int. Cl.
*H01S 3/036* (2006.01)
*G03F 7/20* (2006.01)
*H01S 3/225* (2006.01)

(52) U.S. Cl.
CPC .......... *H01S 3/036* (2013.01); *G03F 7/70025* (2013.01); *G03F 7/7055* (2013.01); *H01S 3/2251* (2013.01); *H01S 3/2256* (2013.01)

(58) Field of Classification Search
CPC .... G03F 7/70025; G03F 7/7055; H01S 3/036; H01S 3/08004; H01S 3/08009;
(Continued)

(56) References Cited

U.S. PATENT DOCUMENTS

| | | |
|---|---|---|
| 5,450,436 A | 9/1995 | Mizoguchi et al. |
| 6,188,710 B1 | 2/2001 | Besaucele et al. |

(Continued)

FOREIGN PATENT DOCUMENTS

| | | |
|---|---|---|
| JP | H06-177461 A | 6/1994 |
| JP | H09-097951 A | 4/1997 |

(Continued)

OTHER PUBLICATIONS

International Search Report issued in PCT/JP2018/039236; dated Jan. 15, 2019.

(Continued)

*Primary Examiner* — Deoram Persaud

(74) *Attorney, Agent, or Firm* — Studebaker & Brackett PC

(57) ABSTRACT

A laser gas regenerating apparatus regenerates a discharged gas discharged from at least one ArF excimer laser apparatus and supplies the regenerated gas to the at least one ArF excimer laser apparatus connected to a first laser gas supply source that supplies a first laser gas and to a second laser gas supply source that supplies a second laser gas. The laser gas regenerating apparatus includes a data obtaining unit that obtains data on a supply amount of the second laser gas supplied to the at least one ArF excimer laser apparatus; a xenon adding unit that adds, to the regenerated gas, a third laser gas; and a control unit that controls, based on the supply amount, an addition amount of the third laser gas by the xenon adding unit.

40 Claims, 37 Drawing Sheets

(58) Field of Classification Search
CPC .............. H01S 3/09702; H01S 3/0971; H01S 3/10069; H01S 3/104; H01S 3/1306; H01S 3/134; H01S 3/225; H01S 3/2251; H01S 3/2256
See application file for complete search history.

(56) References Cited

U.S. PATENT DOCUMENTS

| | | |
|---|---|---|
| 6,584,131 B1 | 6/2003 | Kakizaki |
| 9,478,934 B1 | 10/2016 | Donaldson et al. |
| 2002/0122449 A1 | 9/2002 | Tanaka et al. |
| 2006/0193997 A1 | 8/2006 | Bykanov |
| 2016/0248215 A1 | 8/2016 | Suzuki et al. |
| 2018/0191122 A1 | 7/2018 | Suzuki et al. |
| 2018/0241170 A1 | 8/2018 | Suzuki et al. |
| 2018/0354795 A1 | 12/2018 | Suzuki et al. |

FOREIGN PATENT DOCUMENTS

| | | |
|---|---|---|
| JP | 2001-111142 A | 4/2001 |
| JP | 2002-270935 A | 9/2002 |
| WO | 2015/075840 A1 | 5/2015 |
| WO | 2017/072863 A1 | 5/2017 |
| WO | 2017/081819 A1 | 5/2017 |
| WO | 2017071866 A1 | 5/2017 |

OTHER PUBLICATIONS

International Preliminary Report on Patentability and Written Opinion issued in PCT/JP2018/039236; dated Oct. 27, 2020.

*Prior Art*

*Prior Art*

*Prior Art*

*Prior Art*

Prior Art

*Prior Art*

LASER GAS REGENERATING APPARATUS AND ELECTRONIC DEVICE MANUFACTURING METHOD

CROSS-REFERENCE TO RELATED APPLICATIONS

The present application is a continuation application of International Application No. PCT/JP2018/039236, filed on Oct. 22, 2018, claiming the priority to International Application No. PCT/JP2018/016600, filed on Apr. 24, 2018, the entire contents of which are hereby incorporated by reference.

BACKGROUND

1. Technical Field

The present disclosure relates to a laser gas regenerating apparatus and an electronic device manufacturing method.

2. Related Art

Recently, improvement in resolution of semiconductor exposure apparatuses (hereinafter simply referred to as "exposure apparatuses") has been desired due to miniaturization and high integration of semiconductor integrated circuits. For this purpose, exposure light sources configured to output light with shorter wavelengths have been developed. As the exposure light source, a gas laser apparatus is generally used instead of a conventional mercury lamp. For example, as a gas laser apparatus for exposure, a KrF excimer laser apparatus configured to output an ultraviolet laser beam with a wavelength of 248 nm and an ArF excimer laser apparatus configured to output an ultraviolet laser beam with a wavelength of 193 nm are used.

As next generation exposure technology, immersion exposure is practically used in which a gap between an exposure lens of an exposure apparatus and a wafer is filled with a liquid. In the immersion exposure, a refractive index between the exposure lens and the wafer changes to reduce an apparent wavelength of light from an exposure light source. When the immersion exposure is performed using the ArF excimer laser apparatus as the exposure light source, the wafer is irradiated with ultraviolet light with a wavelength of 134 nm in water. This technology is referred to as ArF immersion exposure (or ArF immersion lithography).

The KrF excimer laser apparatus and the ArF excimer laser apparatus have a large natural oscillation range of about 350 to 400 pm. Thus, if a projection lens is made of a material that transmits ultraviolet light such as KrF and ArF laser beams, chromatic aberration may occur, thereby reducing resolution. Then, a spectral line width of a laser beam output from the gas laser apparatus needs to be narrowed to the extent that the chromatic aberration can be ignored. For this purpose, a line narrow module (LNM) having a line narrow element (such as etalon or grating) is sometimes provided in a laser resonator of the gas laser apparatus to narrow the spectrum line width. A laser apparatus in which the spectrum line width is narrowed is hereinafter referred to as a line narrow laser apparatus.

LIST OF DOCUMENTS

Patent Documents

Patent Document 1: US Published Patent Application No. 2016/0248215
Patent Document 2: International Publication No. 2017/072863
Patent Document 3: International Publication No. 2017/071866
Patent Document 4: U.S. Pat. No. 6,188,710
Patent Document 5: U.S. Pat. No. 5,450,436
Patent Document 6: US Published Patent Application No. 2002/0122449
Patent Document 7: U.S. Pat. No. 6,584,131
Patent Document 8: International Publication No. 2017/081819
Patent Document 9: Japanese Unexamined Patent Application Publication No. 09-097951
Patent Document 10: U.S. Pat. No. 9,478,934
Patent Document 11: US Published Patent Application No. 2006/0193997

SUMMARY

A laser gas regenerating apparatus according to one aspect of the present disclosure is configured to regenerate a discharged gas discharged from at least one ArF excimer laser apparatus and to supply the regenerated gas to the at least one ArF excimer laser apparatus, the at least one ArF excimer laser apparatus being connected to a first laser gas supply source configured to supply a first laser gas containing argon gas, neon gas, and xenon gas with a first concentration and to a second laser gas supply source configured to supply a second laser gas containing argon gas, neon gas, and fluorine gas. The laser gas regenerating apparatus includes a data obtaining unit configured to obtain data on a supply amount of the second laser gas supplied to the at least one ArF excimer laser apparatus; a xenon adding unit configured to add, to the regenerated gas, a third laser gas containing argon gas, neon gas, and xenon gas with a second concentration higher than the first concentration; and a control unit configured to control, based on the supply amount, an addition amount of the third laser gas by the xenon adding unit.

A laser gas regenerating apparatus according to another aspect of the present disclosure is configured to regenerate a discharged gas discharged from at least one KrF excimer laser apparatus and to supply the regenerated gas to the at least one KrF excimer laser apparatus, the at least one KrF excimer laser apparatus being connected to a first laser gas supply source configured to supply a first laser gas containing krypton gas, neon gas, and xenon gas with a first concentration and to a second laser gas supply source configured to supply a second laser gas containing krypton gas, neon gas, and fluorine gas. The laser gas regenerating apparatus includes a data obtaining unit configured to obtain data on a supply amount of the second laser gas supplied to the at least one KrF excimer laser apparatus; a xenon adding unit configured to add, to the regenerated gas, a third laser gas containing krypton gas, neon gas, and xenon gas with a second concentration higher than the first concentration; and a control unit configured to control, based on the supply amount, an addition amount of the third laser gas by the xenon adding unit.

A laser gas regenerating apparatus according to a further aspect of the present disclosure is configured to regenerate a discharged gas discharged from at least one ArF excimer laser apparatus and to supply the regenerated gas to the at least one ArF excimer laser apparatus, the at least one ArF excimer laser apparatus being connected to a first laser gas supply source configured to supply a first laser gas containing argon gas, neon gas, and xenon gas with a first concentration and to a second laser gas supply source configured to supply a second laser gas containing argon gas, neon gas, and fluorine gas. The laser gas regenerating apparatus includes a data obtaining unit configured to obtain data on an exhaust amount of a laser gas exhausted outside without being regenerated, among discharged gases discharged from the at least one ArF excimer laser apparatus; a xenon adding unit configured to add, to the regenerated gas, a third laser gas containing argon gas, neon gas, and xenon gas with a second concentration higher than the first concentration; and a control unit configured to control, based on the exhaust amount, an addition amount of the third laser gas by the xenon adding unit.

A laser gas regenerating apparatus according to a further aspect of the present disclosure is configured to regenerate a discharged gas discharged from at least one KrF excimer laser apparatus and to supply the regenerated gas to the at least one KrF excimer laser apparatus, the at least one KrF excimer laser apparatus being connected to a first laser gas supply source configured to supply a first laser gas containing krypton gas, neon gas, and xenon gas with a first concentration and to a second laser gas supply source configured to supply a second laser gas containing krypton gas, neon gas, and fluorine gas. The laser gas regenerating apparatus includes a data obtaining unit configured to obtain data on an exhaust amount of a laser gas exhausted outside without being regenerated, among discharged gases discharged from the at least one KrF excimer laser apparatus; a xenon adding unit configured to add, to the regenerated gas, a third laser gas containing krypton gas, neon gas, and xenon gas with a second concentration higher than the first concentration; and a control unit configured to control, based on the exhaust amount, an addition amount of the third laser gas by the xenon adding unit.

An electronic device manufacturing method according to one aspect of the present disclosure includes generating a laser beam with an excimer laser system, the excimer laser system including at least one ArF excimer laser apparatus connected to a first laser gas supply source configured to supply a first laser gas containing argon gas, neon gas, and xenon gas with a first concentration and to a second laser gas supply source configured to supply a second laser gas containing argon gas, neon gas, and fluorine gas, and a laser gas regenerating apparatus configured to regenerate a discharged gas discharged from the at least one ArF excimer laser apparatus and to supply the regenerated gas to the at least one ArF excimer laser apparatus, the laser gas regenerating apparatus including a data obtaining unit configured to obtain data on a supply amount of the second laser gas supplied to the at least one ArF excimer laser apparatus, a xenon adding unit configured to add, to the regenerated gas, a third laser gas containing argon gas, neon gas, and xenon gas with a second concentration higher than the first concentration, and a control unit configured to control, based on the supply amount, an addition amount of the third laser gas by the xenon adding unit; outputting the laser beam to an exposure apparatus; and exposing a photosensitive substrate to the laser beam within the exposure apparatus.

An electronic device manufacturing method according to another aspect of the present disclosure includes generating a laser beam with an excimer laser system, the excimer laser system including at least one KrF excimer laser apparatus connected to a first laser gas supply source configured to supply a first laser gas containing krypton gas, neon gas, and xenon gas with a first concentration and to a second laser gas supply source configured to supply a second laser gas containing krypton gas, neon gas, and fluorine gas, and a laser gas regenerating apparatus configured to regenerate a discharged gas discharged from the at least one KrF excimer laser apparatus and to supply the regenerated gas to the at least one KrF excimer laser apparatus, the laser gas regenerating apparatus including a data obtaining unit configured to obtain data on a supply amount of the second laser gas supplied to the at least one KrF excimer laser apparatus, a xenon adding unit configured to add, to the regenerated gas, a third laser gas containing krypton gas, neon gas, and xenon gas with a second concentration higher than the first concentration, and a control unit configured to control, based on the supply amount, an addition amount of the third laser gas by the xenon adding unit; outputting the laser beam to an exposure apparatus; and exposing a photosensitive substrate to the laser beam within the exposure apparatus.

An electronic device manufacturing method according to a further aspect of the present disclosure includes generating a laser beam with an excimer laser system, the excimer laser system including at least one ArF excimer laser apparatus connected to a first laser gas supply source configured to supply a first laser gas containing argon gas, neon gas, and xenon gas with a first concentration and to a second laser gas supply source configured to supply a second laser gas containing argon gas, neon gas, and fluorine gas, and a laser gas regenerating apparatus configured to regenerate a discharged gas discharged from the at least one ArF excimer laser apparatus and to supply the regenerated gas to the at least one ArF excimer laser apparatus, the laser gas regenerating apparatus including a data obtaining unit configured to obtain data on an exhaust amount of a laser gas exhausted outside without being regenerated, among discharged gases discharged from the at least one ArF excimer laser apparatus, a xenon adding unit configured to add, to the regenerated gas, a third laser gas containing argon gas, neon gas, and xenon gas with a second concentration higher than the first concentration, and a control unit configured to control, based on the exhaust amount, an addition amount of the third laser gas by the xenon adding unit; outputting the laser beam to an exposure apparatus; and exposing a photosensitive substrate to the laser beam within the exposure apparatus.

An electronic device manufacturing method according to a further aspect of the present disclosure includes generating a laser beam with an excimer laser system, the excimer laser system including at least one KrF excimer laser apparatus connected to a first laser gas supply source configured to supply a first laser gas containing krypton gas, neon gas, and xenon gas with a first concentration and to a second laser gas supply source configured to supply a second laser gas containing krypton gas, neon gas, and fluorine gas, and a laser gas regenerating apparatus configured to regenerate a discharged gas discharged from the at least one KrF excimer laser apparatus and to supply the regenerated gas to the at least one KrF excimer laser apparatus, the laser gas regenerating apparatus including a data obtaining unit configured to obtain data on an exhaust amount of a laser gas exhausted outside without being regenerated, among discharged gases discharged from the at least one KrF excimer laser apparatus, a xenon adding unit configured to add, to the regenerated gas, a third laser gas containing krypton gas, neon gas, and xenon gas with a second concentration higher than the first concentration, and a control unit configured to control, based on the exhaust amount, an addition amount of the third laser gas by the xenon adding unit; outputting the laser beam to an exposure apparatus; and exposing a photosensitive substrate to the laser beam within the exposure apparatus.

BRIEF DESCRIPTION OF THE DRAWINGS

With reference to the accompanying drawings, some embodiments of the present disclosure will be described below merely by way of example.

DESCRIPTION OF EMBODIMENTS

Figure 1:
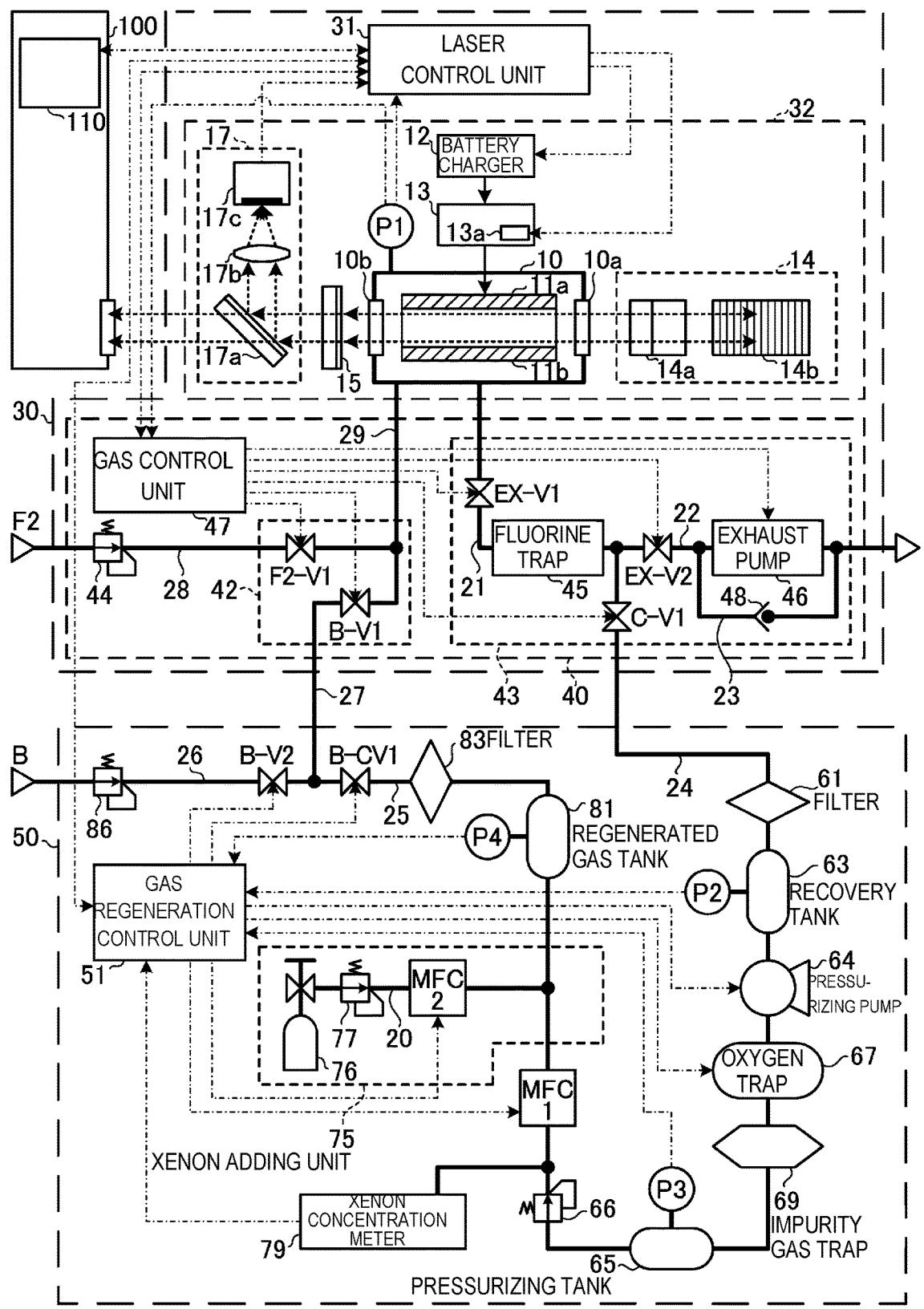
FIG. 1 schematically shows configurations of an excimer laser apparatus 30 and a laser gas regenerating apparatus 50 according to a comparative example.

Contents
1. Excimer laser apparatus and laser gas regenerating apparatus according to comparative example
  1.1 Configuration
    1.1.1 Excimer laser apparatus
      1.1.1.1 Laser oscillation system
      1.1.1.2 Laser gas control system
    1.1.2 Laser gas regenerating apparatus
  1.2 Operation
    1.2.1 Operation of laser oscillation system
      1.2.1.1 Energy control
    1.2.2 Operation of laser gas control system
      1.2.2.1 Initial setting of gas control parameter
      1.2.2.2 Gas pressure control
      1.2.2.3 Partial gas exchange
    1.2.3 Operation of laser gas regenerating apparatus
      1.2.3.1 Main flow
      1.2.3.2 Initial setting subroutine of gas regeneration
      1.2.3.3 Gas recovering/pressurizing subroutine
      1.2.3.4 Gas purifying/adjusting subroutine
      1.2.3.5 Inert regenerated gas storing/supplying subroutine
  1.3 Gas flow
  1.4 Problem
2. Laser gas regenerating apparatus configured to add xenon-containing gas based on fluorine-containing gas supply amount
  2.1 Configuration
  2.2 Operation
    2.2.1 Derivation of proportionality constant
    2.2.2 Processing of gas regeneration control unit
  2.3 Effect 3. Laser gas regenerating apparatus configured to receive fluorine-containing gas supply amount from excimer laser apparatus
   3.1 Configuration
   3.2 Processing of gas regeneration control unit
   3.3 Processing of gas control unit
   3.4 Effect
4. Laser gas regenerating apparatus configured to add xenon-containing gas based on gas exhaust amount
   4.1 Configuration
   4.2 Operation
      4.2.1 Derivation of proportionality constant
      4.2.2 Processing of gas regeneration control unit
   4.3 Effect
5. Laser gas regenerating apparatus configured to receive exhaust amount from excimer laser apparatus
   5.1 Configuration
   5.2 Processing of gas regeneration control unit
   5.3 Processing of gas control unit
   5.4 Effect
6. Laser gas regenerating apparatus connected to a plurality of laser apparatuses (first example)
   6.1 Configuration
   6.2 Operation
   6.3 Effect
7. Laser gas regenerating apparatus connected to a plurality of laser apparatuses (second example)
   7.1 Configuration and operation
   7.2 Effect
8. Arrangement of xenon adding unit
   8.1 Configuration
   8.2 Effect
9. Example of regenerated gas tank
   9.1 First example
      9.1.1 Configuration
      9.1.2 Operation and effect
   9.2 Second example
      9.2.1 Configuration
      9.2.2 Operation and effect
10. Others
11. KrF excimer laser apparatus
12. Range of xenon gas concentration in which performance of laser apparatus is improved
   12.1 Performance of ArF excimer laser apparatus
   12.2 Performance of KrF excimer laser apparatus
13. Target xenon gas concentration Cxemt considering reduction in xenon gas concentration
   13.1 Relationship between xenon gas concentration Cxe1 of inert new gas and target xenon gas concentration Cxemt
   13.2 Determination of addition amount Qxe of xenon-containing gas based on supply amount Qf2 of fluorine-containing gas
   13.3 Determination of addition amount Qxe of xenon-containing gas based on exhaust amount Qex of laser gas Now, with reference to the drawings, embodiments of the present disclosure will be described in detail. The embodiments described below illustrate some examples of the present disclosure, and do not limit contents of the present disclosure. Also, all configurations and operations described in the embodiments are not necessarily essential as configurations and operations of the present disclosure. The same components are denoted by the same reference numerals, and overlapping descriptions are omitted.

1. Excimer Laser Apparatus and Laser Gas Regenerating Apparatus According to Comparative Example

1.1 Configuration

FIG. 1 schematically shows configurations of an excimer laser apparatus 30 and a laser gas regenerating apparatus 50 according to a comparative example.

1.1.1 Excimer Laser Apparatus

The excimer laser apparatus 30 includes a laser control unit 31, a laser oscillation system 32, and a laser gas control system 40. The excimer laser apparatus 30 is an ArF excimer laser apparatus that uses a laser gas containing fluorine gas and argon gas.

The excimer laser apparatus 30 is used with, for example, an exposure apparatus 100. A laser beam output from the excimer laser apparatus 30 enters the exposure apparatus 100. The exposure apparatus 100 includes an exposure apparatus control unit 110. The exposure apparatus control unit 110 is configured to control the exposure apparatus 100. The exposure apparatus control unit 110 is configured to transmit a target pulse energy setting signal and a light emission trigger signal to the laser control unit 31 included in the excimer laser apparatus 30.

The laser control unit 31 is configured to control the laser oscillation system 32 and the laser gas control system 40. The laser control unit 31 receives measurement data from a power monitor 17 and a chamber pressure sensor P1 included in the laser oscillation system 32.

1.1.1.1 Laser Oscillation System

The laser oscillation system 32 includes a laser chamber 10, a charger 12, a pulse power module 13, a line narrow module 14, an output coupling mirror 15, the chamber pressure sensor P1, and the power monitor 17.

The laser chamber 10 is arranged in an optical path of a laser resonator constituted by the line narrow module 14 and the output coupling mirror 15. The laser chamber 10 has two windows 10a and 10b. The laser chamber 10 houses a pair of discharge electrodes 11a and 11b. The laser chamber 10 holds a laser gas.

The charger 12 holds electric energy to be supplied to the pulse power module 13. The pulse power module 13 includes a switch 13a. The pulse power module 13 is configured to apply a pulse voltage between the discharge electrodes 11a and 11b.

The line narrow module 14 includes a prism 14a and a grating 14b. The output coupling mirror 15 is a partially reflective mirror.

The chamber pressure sensor P1 is configured to measure gas pressure in the laser chamber 10. The chamber pressure sensor P1 measures total pressure of the laser gas. The chamber pressure sensor P1 is configured to transmit measurement data of the gas pressure to the laser control unit 31 and a gas control unit 47 included in the laser gas control system 40.

The power monitor 17 includes a beam splitter 17a, a light condensing lens 17b, and an optical sensor 17c. The beam splitter 17a is arranged in an optical path of a laser beam output from the output coupling mirror 15. The beam splitter 17a is configured to transmit one part of the laser beam output from the output coupling mirror 15 toward the exposure apparatus 100 with high transmittance and to reflect the other part. The light condensing lens 17b and the optical sensor 17c are arranged in an optical path of the laser beam reflected by the beam splitter 17a. The light condensing lens 17b is configured to condense, on the optical sensor 17c, the laser beam reflected by the beam splitter 17a. The optical sensor 17c is configured to transmit, to the laser control unit 31, an electric signal corresponding to pulse energy of the laser beam condensed by the light condensing lens 17b as measurement data.

1.1.1.2 Laser Gas Control System

The laser gas control system 40 includes the gas control unit 47, a gas supply device 42, and an exhaust device 43. The gas control unit 47 transmits and receives signals to and from the laser control unit 31. The gas control unit 47 receives measurement data output from the chamber pressure sensor P1 included in the laser oscillation system 32. The gas control unit 47 controls the gas supply device 42 and the exhaust device 43. The gas control unit 47 controls valves F2-V1, B-V1 included in the gas supply device 42, valves EX-V1, EX-V2, C-V1 included in the exhaust device 43, and an exhaust pump 46.

The gas supply device 42 includes part of a pipe 28 connected to a fluorine-containing gas supply source F2, and part of a pipe 29 connected to the laser chamber 10 included in the laser oscillation system 32. The pipe 28 is connected to the pipe 29, and thus the fluorine-containing gas supply source F2 can supply a fluorine-containing gas to the laser chamber 10. The fluorine-containing gas supply source F2 is a gas cylinder holding the fluorine-containing gas. The fluorine-containing gas is, for example, a laser gas containing fluorine gas, argon gas, and neon gas. A fluorine gas concentration in the fluorine-containing gas supply source F2 is adjusted to be higher than a fluorine gas concentration in the laser chamber 10. The fluorine-containing gas supply source F2 may have a gas composition of, for example, 1% fluorine gas, 3.5% argon gas, the balance being neon gas. Supply pressure of the laser gas from the fluorine-containing gas supply source F2 to the pipe 28 is set to a value of, for example, 5000 hPa to 6000 hPa by a regulator 44. The gas supply device 42 includes the valve F2-V1 provided in the pipe 28. Supply of the fluorine-containing gas from the fluorine-containing gas supply source F2 through the pipe 29 to the laser chamber 10 is controlled by opening and closing of the valve F2-V1. The opening and closing of the valve F2-V1 is controlled by the gas control unit 47.

In this example, the regulator 44 is arranged in the laser gas control system 40, but not limited thereto, the regulator 44 may be arranged in the pipe between the fluorine-containing gas supply source F2 and the excimer laser apparatus 30.

The gas supply device 42 further includes part of a pipe 27 connected between the laser gas regenerating apparatus 50 and the pipe 29. The pipe 27 is connected to the pipe 29, and thus the laser gas regenerating apparatus 50 can supply an inert gas to the laser chamber 10. The inert gas may be an inert new gas supplied from an inert gas supply source B described later, or an inert regenerated gas with impurities reduced by the laser gas regenerating apparatus 50. The gas supply device 42 includes a valve B-V1 provided in the pipe 27. Supply of the inert gas from the laser gas regenerating apparatus 50 through the pipe 29 to the laser chamber 10 is controlled by opening and closing of the valve B-V1. The opening and closing of the valve B-V1 is controlled by the gas control unit 47.

The exhaust device 43 includes part of a pipe 21 connected to the laser chamber 10 included in the laser oscillation system 32, and part of a pipe 22 connected to an exhaust processing device or the like (not shown) outside the apparatus. The pipe 21 is connected to the pipe 22, and thus a discharged gas discharged from the laser chamber 10 can be exhausted outside the apparatus. "Outside the apparatus" or "outside" herein refers to a region or a unit that does not include the excimer laser apparatus nor the laser gas regenerating apparatus. Examples thereof may include an exhaust duct (not shown) that can exhaust a laser gas from which fluorine gas has been removed. The exhaust duct may be connected to a scrubber (not shown).

The exhaust device 43 includes a valve EX-V1 provided in the pipe 21, and a fluorine trap 45 provided in the pipe 21. The valve EX-V1 and the fluorine trap 45 are arranged in this order from the side of the laser chamber 10. Discharge of the discharged gas from the laser chamber 10 to the fluorine trap 45 is controlled by opening and closing of the valve EXV1. The opening and closing of the valve EXV1 is controlled by the gas control unit 47.

The fluorine trap 45 holds a treatment agent for trapping fluorine gas and fluorine compound contained in the discharged gas discharged from the laser chamber 10. The treatment agent for trapping fluorine gas and fluorine compound contains, for example, a combination of zeolite and calcium oxide. Thus, the fluorine gas and the calcium oxide react to produce calcium fluoride and oxygen gas. The calcium fluoride is trapped by the fluorine trap 45, and the oxygen gas is trapped by an oxygen trap 67 described later. Part of impurity gas such as the fluorine compound that has not been completely removed by the calcium oxide is adsorbed by the zeolite. Alternatively, the treatment agent for trapping fluorine gas and fluorine compound may contain a combination of zeolite and calcium hydroxide.

The exhaust device 43 includes a valve EX-V2 provided in the pipe 22, and the exhaust pump 46 provided in the pipe 22. The valve EX-V2 and the exhaust pump 46 are arranged in this order from the side of the laser chamber 10. Discharge of the discharged gas from an outlet of the fluorine trap 45 to the outside of the apparatus is controlled by opening and closing of the valve EX-V2. The opening and closing of the valve EX-V2 is controlled by the gas control unit 47. The exhaust pump 46 is configured to force the laser gas out of the laser chamber 10 with the valves EX-V1 and EX-V2 opened to reduce gas pressure in the laser chamber 10 to atmospheric pressure or lower. Operation of the exhaust pump 46 is controlled by the gas control unit 47.

The exhaust device 43 includes a bypass pipe 23. The bypass pipe 23 is connected to the pipe 22 between an inlet side and an outlet side of the exhaust pump 46. The exhaust device 43 includes a check valve 48 provided in the bypass pipe 23. The check valve 48 is configured to exhaust, when the valves EX-V1 and EX-V2 are opened, part of the laser gas in the laser chamber 10 in which the gas pressure is atmospheric pressure or higher.

The exhaust device 43 further includes part of a pipe 24. The pipe 24 is connected between the laser gas regenerating apparatus 50 and a connection between the pipe 21 and the pipe 22. The pipe 24 is connected to the connection between the pipe 21 and the pipe 22, and thus the discharged gas discharged from the laser chamber 10 can be supplied to the laser gas regenerating apparatus 50. The exhaust device 43 includes a valve C-V1 provided in the pipe 24. Supply of the discharged gas from the outlet of the fluorine trap 45 to the laser gas regenerating apparatus 50 is controlled by opening and closing of the valve C-V1. The opening and closing of the valve C-V1 is controlled by the gas control unit 47.

1.1.2 Laser Gas Regenerating Apparatus

The laser gas regenerating apparatus 50 includes a gas regeneration control unit 51, part of the pipe 24, part of the pipe 27, and a pipe 25. The pipe 24 is connected to the exhaust device 43 of the laser gas control system 40. The pipe 27 is connected to the gas supply device 42 of the laser gas control system 40. The pipe 25 is connected between the pipe 24 and the pipe 27.

The laser gas regenerating apparatus 50 includes a filter 61, a recovery tank 63, a pressurizing pump 64, an oxygen trap 67, an impurity gas trap 69, a pressurizing tank 65, a regulator 66, a xenon concentration meter 79, and a massflow controller MFC1 arranged in the pipe 24 in this order from the side of the exhaust device 43. A xenon adding unit 75 is arranged between the pipe 24 and the pipe 25. In the pipe 25, a regenerated gas tank 81, a filter 83, and a valve B-CV1 are arranged in this order from the side of the xenon adding unit 75. The pipe 24 and the pipe 25 constitute a gas purifying channel from the valve C-V1 to the valve B-CV1.

The laser gas regenerating apparatus 50 further includes part of a pipe 26 connected to the inert gas supply source B. The pipe 26 is connected to a connection between the pipe 25 and the pipe 27. The inert gas supply source B is, for example, a gas cylinder holding an inert gas containing argon gas, neon gas, and a small amount of xenon gas. A xenon gas concentration of the inert gas supply source B is adjusted to a value substantially equal to a target xenon gas concentration in the laser chamber 10. The inert gas supply source B may have a gas composition of, for example, 10 ppm xenon gas, 3.5% argon gas, the balance being neon gas. In the present disclosure, an inert gas supplied from the inert gas supply source B and having not yet reached the laser chamber 10 is sometimes referred to as an inert new gas to distinguish from an inert regenerated gas supplied from the pipe 25. Supply pressure of the inert new gas from the inert gas supply source B to the pipe 26 is set to a value of, for example, 5000 hPa to 6000 hPa by a regulator 86. The laser gas regenerating apparatus 50 includes a valve B-V2 provided in the pipe 26.

In this example, the regulator 86 is arranged in the laser gas regenerating apparatus 50, but not limited thereto, the regulator 86 may be arranged in the pipe between the inert gas supply source B and the excimer laser apparatus 30.

The filter 61 included in the laser gas regenerating apparatus 50 is a mechanical filter for trapping particles contained in the discharged gas introduced from the exhaust device 43.

The recovery tank 63 is a container holding the discharged gas having passed through the filter 61. A recovery pressure sensor P2 is mounted to the recovery tank 63.

The pressurizing pump 64 pressurizes the discharged gas introduced from the recovery tank 63 and outputs pressurized gas. The pressurizing pump 64 is, for example, a diaphragm pump or a bellows pump with less oil mixed into the discharged gas.

The oxygen trap 67 includes a treatment agent for trapping oxygen gas from the pressurized gas. The treatment agent for trapping the oxygen gas contains at least one of a nickel (Ni) catalyst, a copper (Cu) catalyst, and compounds thereof. The oxygen trap 67 includes a heating device and a temperature adjusting device (not shown).

The impurity gas trap 69 is, for example, a metal filter including a metal getter. The metal getter is, for example, a zirconium (Zr) alloy.

The pressurizing tank 65 is a container holding the inert regenerated gas having passed through from the fluorine trap 45 to the impurity gas trap 69. A pressurizing pressure sensor P3 is mounted to the pressurizing tank 65.

The regulator 66 is configured to adjust pressure of the inert regenerated gas supplied from the pressurizing tank 65 to a value of, for example, 5000 hPa to 6000 hPa and to supply the inert regenerated gas to the massflow controller MFC1.

The xenon concentration meter 79 is configured to measure a xenon gas concentration of the inert regenerated gas having passed through the regulator 66. The xenon concentration meter 79 includes, for example, a gas chromatograph mass spectrometer (GS-MS).

The massflow controller MFC1 includes a massflow meter and a valve (not shown). A valve opening is controlled based on a flow rate measured by the massflow meter. Thus, the massflow controller MFC1 controls a flow rate of the inert regenerated gas.

The xenon adding unit 75 includes a xenon-containing gas cylinder 76, a pipe 20, a regulator 77, and a massflow controller MFC2.

One end of the pipe 20 is connected to the xenon-containing gas cylinder 76. The regulator 77 and the massflow controller MFC2 are arranged in the pipe 20. The regulator 77 and the massflow controller MFC2 are arranged in this order from the side of the xenon-containing gas cylinder 76. The pipe 20 is connected to a connection between the pipe 24 and the pipe 25.

The xenon-containing gas cylinder 76 holds a xenon-containing gas. The xenon-containing gas is a laser gas containing argon gas, neon gas, and xenon gas. A xenon gas concentration of the xenon-containing gas is adjusted to be higher than the xenon gas concentration of the inert new gas supplied from the inert gas supply source B. The xenon-containing gas may have a gas composition of, for example, 10000 ppm xenon gas, 3.5% argon gas, the balance being neon gas.

The regulator 77 is configured to adjust pressure of the xenon-containing gas supplied from the xenon-containing gas cylinder 76 to a value of, for example, 5000 hPa to 6000 hPa and to supply the xenon-containing gas to the massflow controller MFC2.

The massflow controller MFC2 includes a massflow meter and a valve (not shown). A valve opening is controlled based on a flow rate measured by the massflow meter. Thus, the massflow controller MFC2 controls a flow rate of the xenon-containing gas having passed through the regulator 77.

At a connection between the pipe 20 and the pipe 24, the xenon-containing gas supplied from the massflow controller MFC2 is mixed into the inert regenerated gas supplied from the massflow controller MFC1.

The regenerated gas tank 81 arranged in the pipe 25 is a container holding the inert regenerated gas supplied from the connection between the pipe 20 and the pipe 24. An inert gas pressure sensor P4 is mounted to the regenerated gas tank 81.

The filter 83 is a mechanical filter for trapping particles contained in the inert regenerated gas supplied from the regenerated gas tank 81.

1.2 Operation

1.2.1 Operation of Laser Oscillation System

The laser control unit 31 receives, from the exposure apparatus control unit 110, a target pulse energy setting signal and a light emission trigger signal. The laser control unit 31 transmits a charging voltage setting signal to the charger 12 based on the target pulse energy setting signal received from the exposure apparatus control unit 110. The laser control unit 31 transmits a light emission trigger to the switch 13a included in the pulse power module 13 based on the light emission trigger signal received from the exposure apparatus control unit 110.

The switch 13a of the pulse power module 13 is turned on when receiving the light emission trigger from the laser control unit 31. When the switch 13a is turned on, the pulse power module 13 generates pulsed high voltage from electric energy charged in the charger 12. The pulse power module 13 applies the high voltage to the pair of discharge electrodes 11a and 11b.

When the high voltage is applied between the discharge electrodes 11a, 11b, electric discharge occurs between the discharge electrodes 11a, 11b. By energy of the electric discharge, the laser gas in the laser chamber 10 is excited to a high energy level. When the excited laser gas then shifts to a low energy level, the excited laser gas emits light with a wavelength corresponding to a difference between the energy levels.

The light generated in the laser chamber 10 is emitted outside the laser chamber 10 through the windows 10a, 10b. The light emitted from the window 10a of the laser chamber 10 is increased in beam width by the prism 14a and enters the grating 14b. The light entering the grating 14b from the prism 14a is reflected by a plurality of grooves of the grating 14b and diffracted in a direction corresponding to a wavelength of the light. The grating 14b is configured in a Littrow arrangement such that an incident angle of the light entering the grating 14b from the prism 14a matches a diffraction angle of diffracted light with a desired wavelength. Thus, the light at or around the desired wavelength is returned through the prism 14a to the laser chamber 10.

The output coupling mirror 15 transmits and outputs one part of the light emitted from the window 10b of the laser chamber 10, and reflects and returns the other part to the laser chamber 10.

As such, the light emitted from the laser chamber 10 reciprocates between the line narrow module 14 and the output coupling mirror 15 and is amplified every time it passes through a discharge space between the discharge electrodes 11a, 11b, and laser oscillation occurs. The light is subjected to line narrowing every time it is returned from the line narrow module 14. The light amplified and subjected to line narrowing is output as a laser beam from the output coupling mirror 15.

The power monitor 17 detects pulse energy of the laser beam output from the output coupling mirror 15. The power monitor 17 transmits data on the detected pulse energy to the laser control unit 31.

The laser control unit 31 performs feedback control of the charging voltage set for the charger 12 based on measurement data of the pulse energy received from the power monitor 17 and the target pulse energy setting signal received from the exposure apparatus control unit 110.

1.2.1.1 Energy Control

Figure 2:
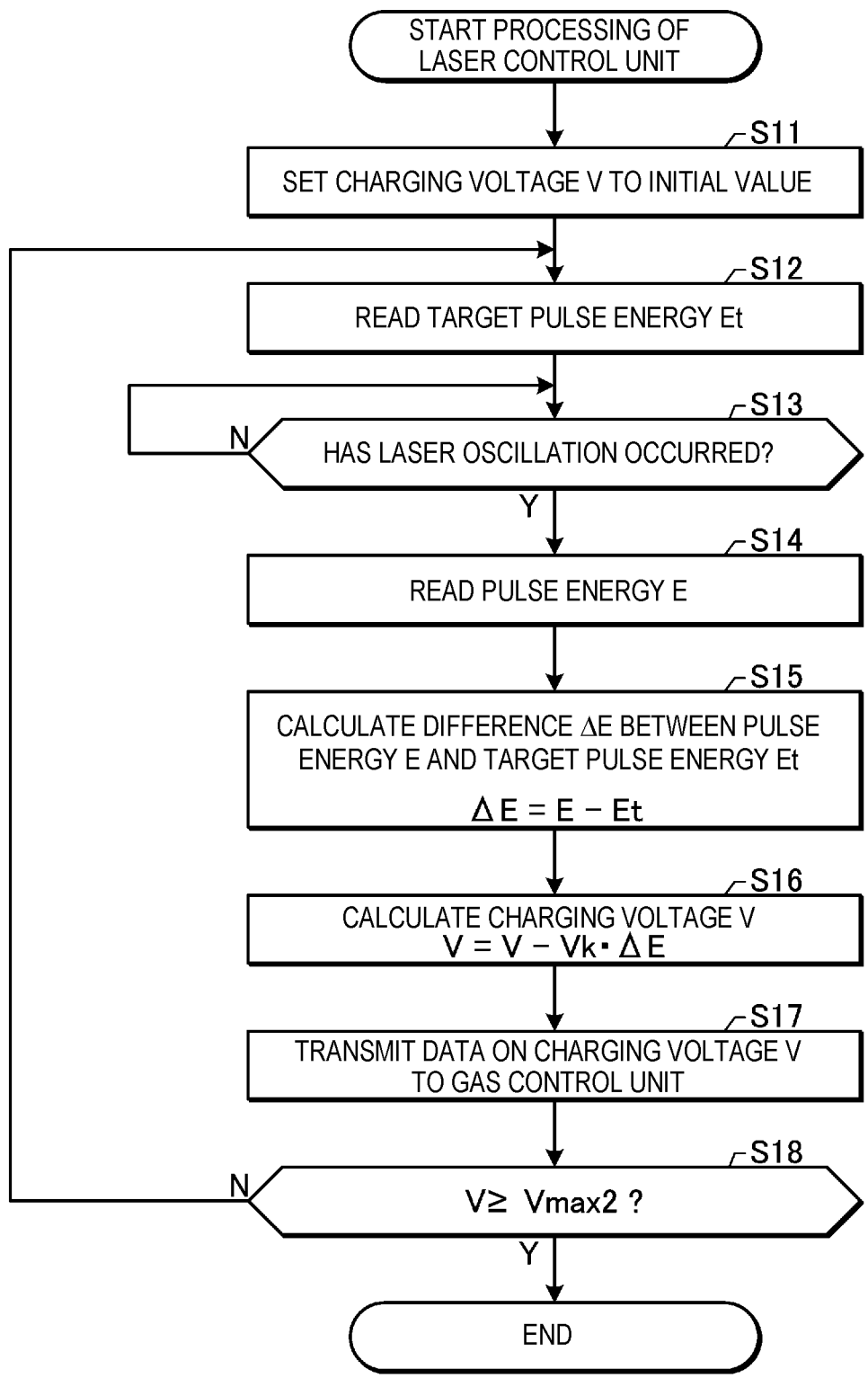
FIG. 2 is a flowchart of energy control by a laser control unit 31 of the excimer laser apparatus 30 according to the comparative example.

FIG. 2 is a flowchart of energy control by the laser control unit 31 of the excimer laser apparatus 30 according to the comparative example. The laser control unit 31 controls, by processing described below, the charging voltage set for the charger 12 such that the pulse energy of the output pulse laser beam approaches the target pulse energy. In this flowchart and flowcharts described later, "Y" indicates a branch when it is determined YES, and "N" indicates a branch when it is determined NO.

First, at S11, the laser control unit 31 sets a charging voltage V to an initial value. The initial value set herein is, for example, such that electric discharge occurs between the discharge electrodes 11a, 11b and a pulse laser beam is output from the laser chamber 10.

Then, at S12, the laser control unit 31 reads target pulse energy Et from a memory device. A value of the target pulse energy Et is, for example, specified by the exposure apparatus 100.

Then, at S13, the laser control unit 31 determines whether or not laser oscillation has occurred. Whether or not laser oscillation has occurred is determined based on whether or not the laser control unit 31 outputs a light emission trigger to the switch 13a of the pulse power module 13. When the laser oscillation has not occurred, the laser control unit 31 waits until the laser oscillation occurs. When the laser oscillation has occurred, the laser control unit 31 goes to S14.

At S14, the laser control unit 31 reads pulse energy E output from the power monitor 17.

Then, at S15, the laser control unit 31 calculates a difference $\Delta E$ between the pulse energy E read at S14 and the target pulse energy Et read at S12 by the equation below.

$$\Delta E = E - Et$$

Then, at S16, the laser control unit 31 calculates a new charging voltage V based on the current charging voltage V by the equation below, and updates the value of the charging voltage V.

$$V = V - Vk \cdot \Delta E$$

where Vk is a coefficient for calculating an amount of change in the charging voltage V necessary for changing the pulse energy by $\Delta E$. The value of the charging voltage V is thus updated and set for the charger 12, thereby allowing the pulse energy E to approach the target pulse energy Et.

Then, at S17, the laser control unit 31 transmits, to the gas control unit 47, data on the charging voltage V calculated at S16. The data on the charging voltage V is used in gas pressure control described with reference to FIG. 5.

Then, at S18, the laser control unit 31 determines whether or not the charging voltage V is equal to or higher than an upper limit value Vmax2. When the charging voltage V is not equal to or higher than the upper limit value Vmax2, the laser control unit 31 returns to S12 and repeats the processes thereafter.

When the charging voltage V is equal to or higher than the upper limit value Vmax2, the laser control unit 31 stops the processing in this flowchart to stop the excimer laser apparatus for maintenance or the like.

1.2.2 Operation of Laser Gas Control System

Figure 3:
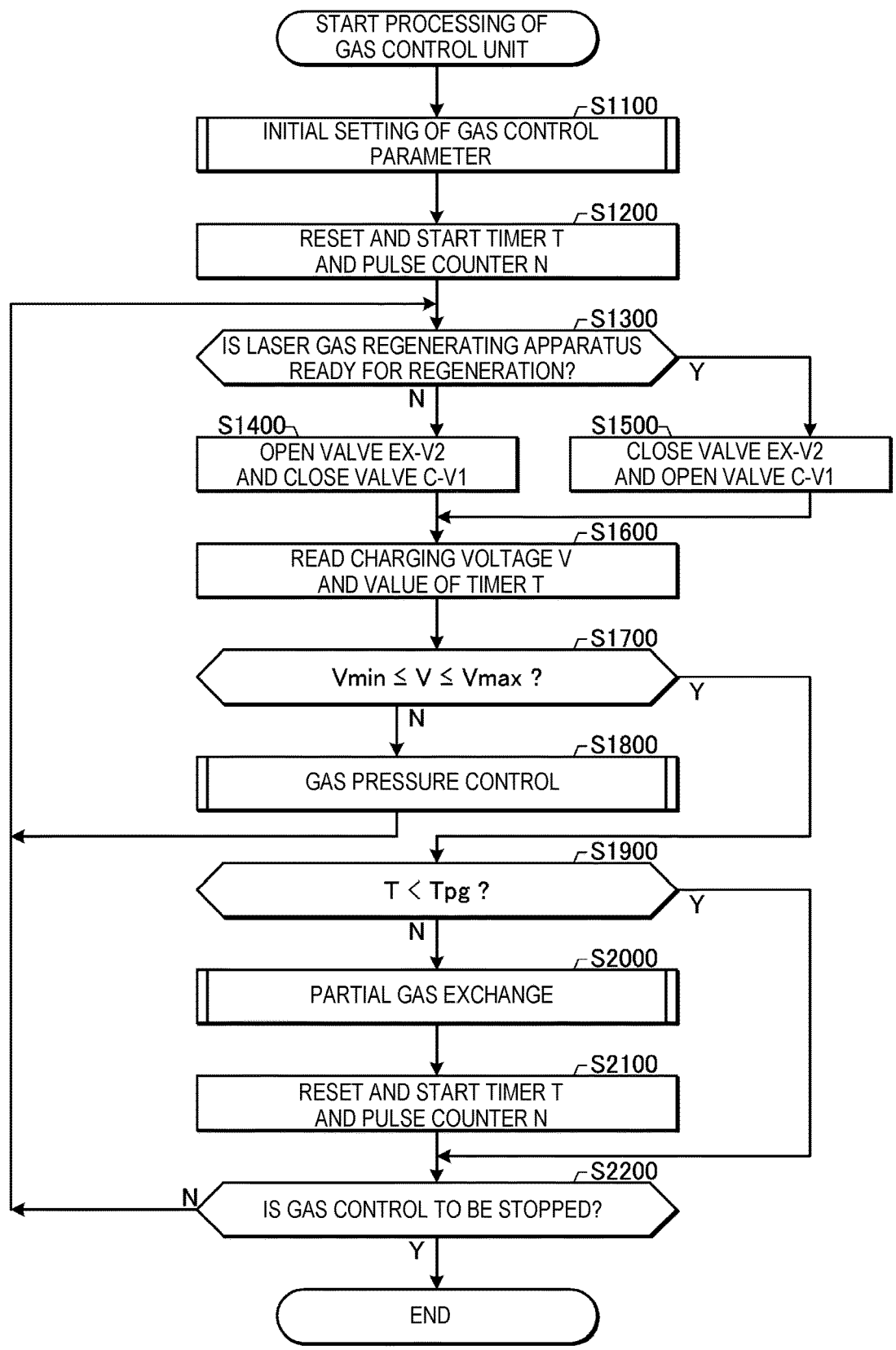
FIG. 3 is a flowchart of laser gas control processing by a gas control unit 47 of the excimer laser apparatus 30 according to the comparative example.

FIG. 3 is a flowchart of laser gas control processing by the gas control unit 47 of the excimer laser apparatus 30 according to the comparative example. The gas control unit 47 performs gas pressure control and partial gas exchange by processing described below.

First, at S1100, the gas control unit 47 performs initial setting of a gas control parameter. This processing will be described later in detail with reference to FIG. 4.

Then, at S1200, the gas control unit 47 resets a timer T and a pulse counter N to 0, and starts counting thereof. The value of the timer T is added and updated, for example, every one second. The value of the pulse counter N is added and updated, for example, every time one pulse of a pulse laser beam is output from the excimer laser apparatus 30.

Then, at S1300, the gas control unit 47 determines whether or not the laser gas regenerating apparatus 50 is ready for regeneration. Whether or not the laser gas regenerating apparatus 50 is ready for regeneration is determined, for example, based on whether or not the gas regeneration control unit 51 has output a gas regeneration ready signal at S104 in a flowchart in FIG. 8 described later.

When the laser gas regenerating apparatus 50 is not ready for regeneration (NO at S1300), the gas control unit 47 goes to S1400.

When the laser gas regenerating apparatus 50 is ready for regeneration (YES at S1300), the gas control unit 47 goes to S1500.

At S1400, the gas control unit 47 opens the valve EX-V2 and closes the valve C-V1. Thus, supply of the gas from the laser gas control system 40 to the laser gas regenerating apparatus 50 is stopped, and the gas discharged from the laser chamber 10 is exhausted outside the apparatus through the valve EX-V2. After S1400, the gas control unit 47 goes to S1600.

At S1500, the gas control unit 47 closes the valve EX-V2 and opens the valve C-V1. Thus, the exhaust of the gas from the laser gas control system 40 through the valve EX-V2 to the outside of the apparatus is stopped, and the gas discharged from the laser chamber 10 is supplied to the laser gas regenerating apparatus 50. After S1500, the gas control unit 47 goes to S1600.

At S1600, the gas control unit 47 reads the charging voltage V and the value of the timer T.

Then, at S1700, the gas control unit 47 determines whether or not the charging voltage V is equal to or higher than a first threshold Vmin and equal to or lower than a second threshold Vmax.

When the charging voltage V is lower than the first threshold Vmin or higher than the second threshold Vmax (NO at S1700), the gas control unit 47 goes to S1800.

When the charging voltage V is equal to or higher than the first threshold Vmin and equal to or lower than the second threshold Vmax (YES at S1700), the gas control unit 47 goes to S1900.

At S1800, the gas control unit 47 performs gas pressure control of the laser chamber 10 to adjust the charging voltage V within the range of the first threshold Vmin to the second threshold Vmax. The processing at S1800 will be described later in detail with reference to FIG. 5. After S1800, the gas control unit 47 returns to S1300 and repeats the processes thereafter.

At S1900, the gas control unit 47 determines whether or not the value of the timer T is shorter than a partial gas exchange period Tpg.

When the value of the timer T is equal to or longer than the partial gas exchange period Tpg (NO at S1900), the gas control unit 47 goes to S2000.

When the value of the timer T is shorter than the partial gas exchange period Tpg (YES at S1900), the gas control unit 47 goes to S2200.

At S2000, the gas control unit 47 performs partial gas exchange to reduce impurities in the gas in the laser chamber 10 and to supply fluorine gas in an amount consumed by the operation of the excimer laser apparatus 30. The processing at S2000 will be described later in detail with reference to FIG. 6.

After S2000, at 52100, the gas control unit 47 resets the timer T and the pulse counter N to 0, and starts counting thereof. After 52100, the gas control unit 47 goes to S2200.

At S2200, the gas control unit 47 determines whether or not gas control is to be stopped. When the gas control is not to be stopped (NO at S2200), the gas control unit 47 returns to S1300. When the gas control is to be stopped (YES at S2200), the gas control unit 47 finishes the processing in this flowchart.

1.2.2.1 Initial Setting of Gas Control Parameter

Figure 4:
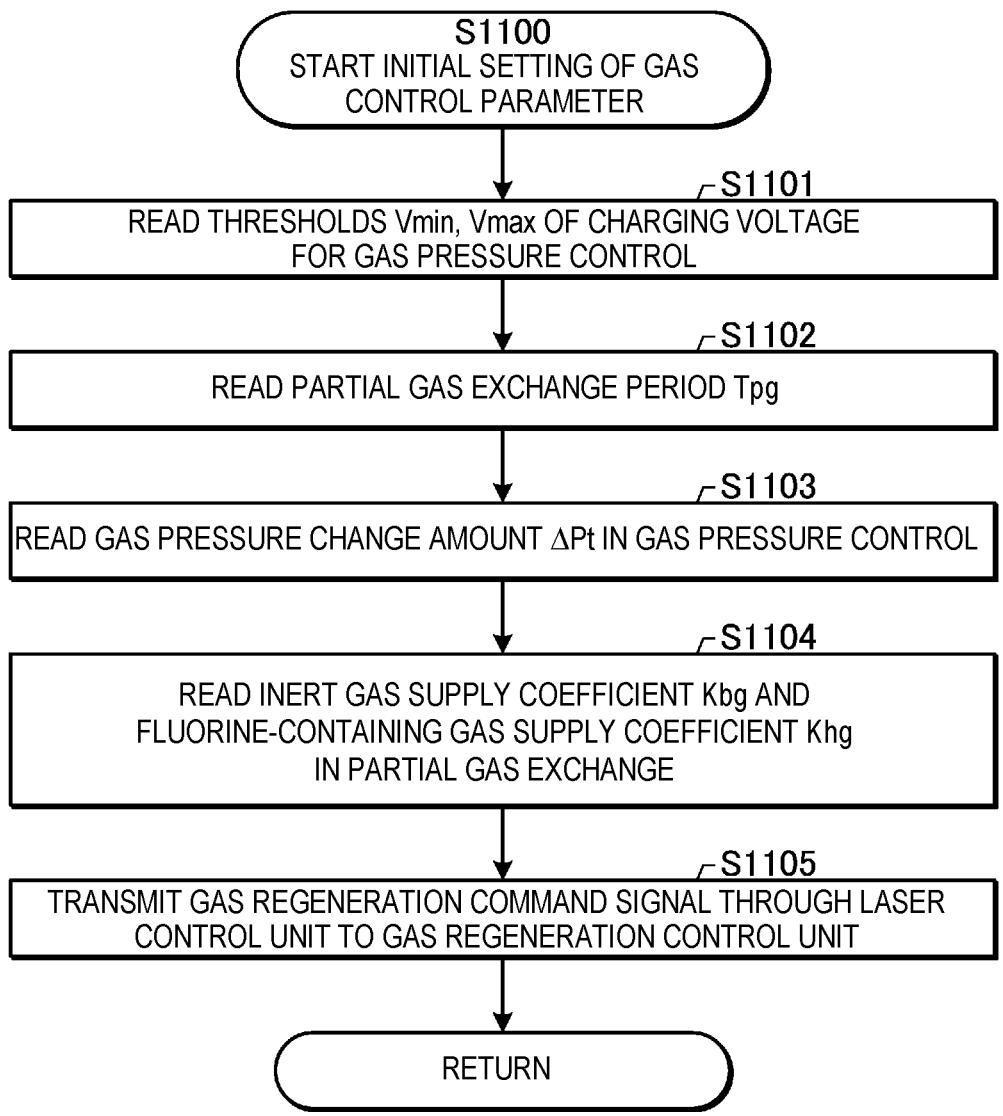
FIG. 4 is a flowchart of details of initial setting of a gas control parameter in FIG. 3.

FIG. 4 is a flowchart of details of initial setting of a gas control parameter in FIG. 3. Processing in FIG. 4 is performed by the gas control unit 47 as a subroutine of S1100 in FIG. 3.

First, at S1101, the gas control unit 47 reads the first threshold Vmin and the second threshold Vmax of the charging voltage for gas pressure control from the memory device.

Then, at S1102, the gas control unit 47 reads the value of the partial gas exchange period Tpg from the memory device.

Then, at S1103, the gas control unit 47 reads a value of a gas pressure change amount $\Delta Pt$ in the gas pressure control. Gas pressure control processing using the value of the gas pressure change amount $\Delta Pt$ will be described later with reference to FIG. 5.

Then, at S1104, the gas control unit 47 reads values of an inert gas supply coefficient Kbg and a fluorine-containing gas supply coefficient Khg in partial gas exchange. Partial gas exchange processing using the values of the coefficients will be described later with reference to FIG. 6.

Then, at S1105, the gas control unit 47 transmits a gas regeneration command signal through the laser control unit 31 to the gas regeneration control unit 51. As described later with reference to FIG. 8, when the gas regeneration control unit 51 receives the gas regeneration command signal, the laser gas regenerating apparatus 50 can regenerate gas.

After S1105, the gas control unit 47 finishes the processing in this flowchart and returns to the processing in FIG. 3.

1.2.2.2 Gas Pressure Control

Figure 5:
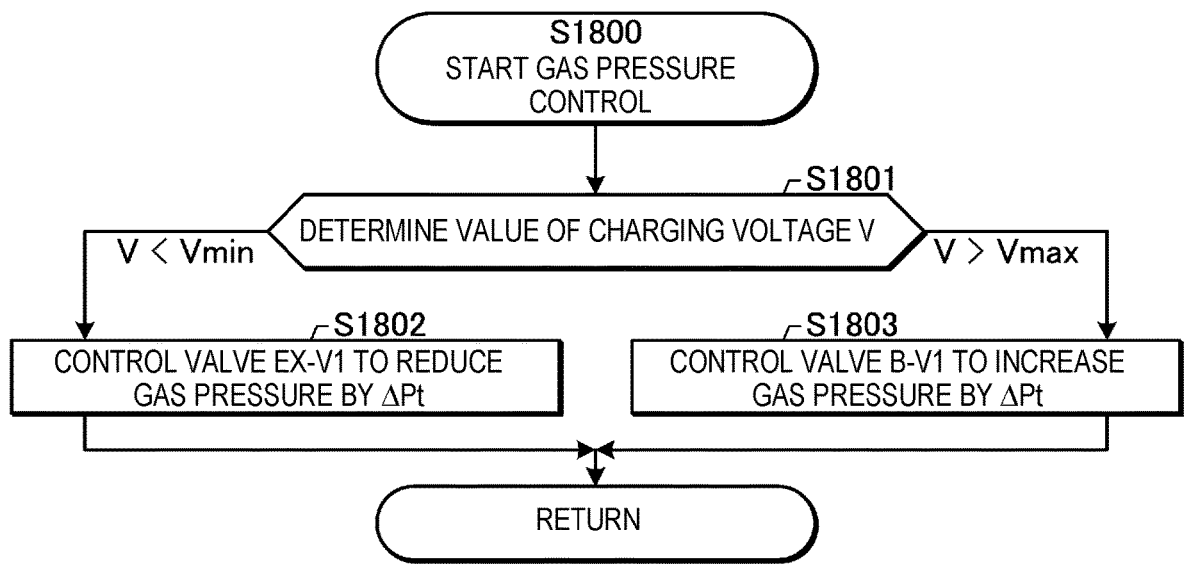
FIG. 5 is a flowchart of details of gas pressure control processing in FIG. 3.

FIG. 5 is a flowchart of details of the gas pressure control processing in FIG. 3. The processing in FIG. 5 is performed by the gas control unit 47 as a subroutine of S1800 in FIG. 3. The gas control unit 47 controls gas pressure in the laser chamber 10 based on the charging voltage V set by the energy control in FIG. 2.

First, at S1801, the gas control unit 47 determines whether the charging voltage V read at S1600 is lower than the first threshold Vmin or higher than the second threshold Vmax.

When the charging voltage V is lower than the first threshold Vmin, at S1802, the gas control unit 47 controls the valve EX-V1 to reduce the gas pressure in the laser chamber 10 by $\Delta Pt$. By controlling the valve EX-V1, part of the laser gas in the laser chamber 10 is discharged to reduce the gas pressure. Reducing the gas pressure in the laser chamber 10 can reduce pulse energy. This can increase the charging voltage V set by the energy control in FIG. 2. Then, the gas control unit 47 finishes the processing in this flowchart and returns to the processing in FIG. 3.

When the charging voltage V is higher than the second threshold Vmax, at S1803, the gas control unit 47 controls the valve B-V1 to increase the gas pressure in the laser chamber 10 by $\Delta Pt$. By controlling the valve B-V1, an inert gas is supplied into the laser chamber 10 to increase the gas pressure. The inert gas supplied into the laser chamber 10 is an inert new gas supplied from the inert gas supply source B through the valve B-V2, or an inert regenerated gas with impurities reduced by the laser gas regenerating apparatus 50 and supplied through the valve B-CV1. Increasing the gas pressure in the laser chamber 10 can increase pulse energy. This can reduce the charging voltage V set by the energy control in FIG. 2. Then, the gas control unit 47 finishes the processing in this flowchart and returns to the processing in FIG. 3.

1.2.2.3 Partial Gas Exchange

Figure 6:
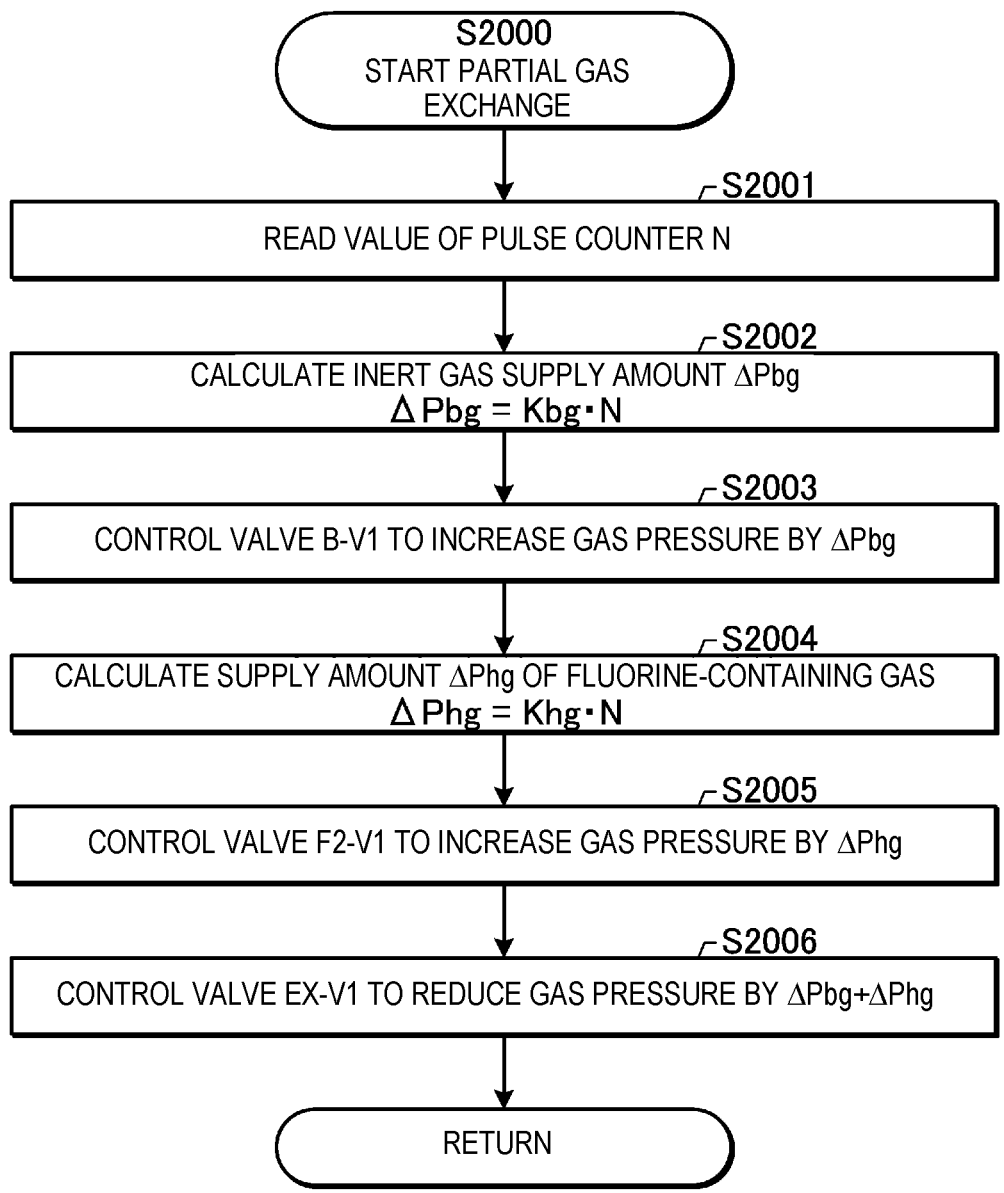
FIG. 6 is a flowchart of details of partial gas exchange processing in FIG. 3.

FIG. 6 is a flowchart of details of the partial gas exchange processing in FIG. 3. The processing in FIG. 6 is performed by the gas control unit 47 as a subroutine of S2000 in FIG. 3.

The partial gas exchange processing herein includes exchanging part of the laser gas in the laser chamber 10 to reduce impurities, but is not limited to a case where partial pressure of fluorine gas in the laser gas is equal between before and after the partial gas exchange. The partial gas exchange processing includes not only exchanging part of the laser gas in the laser chamber 10 but also supplying fluorine gas in an amount consumed by the operation of the excimer laser apparatus 30 to increase the partial pressure of fluorine gas in the laser gas in the laser chamber 10 to a desired range.

If the excimer laser apparatus 30 is operated for long hours, the fluorine gas reacts with substance in the laser chamber and is thus consumed to reduce a fluorine gas concentration in the laser gas in the laser chamber 10 and generate impurity gas.

The reduction in the fluorine gas concentration in the laser gas in the laser chamber 10 and the generation of the impurity gas may reduce pulse energy of an output pulse laser beam or reduce stability of pulse energy.

Then, the partial gas exchange described below stabilizes the fluorine gas concentration of the laser gas in the laser chamber 10 and suppresses an increase in impurity gas concentration.

First, at S2001, the gas control unit 47 reads the value of the pulse counter N.

Then, at S2002, the gas control unit 47 calculates an inert gas supply amount $\Delta Pbg$ by the equation below.

$$\Delta Pbg = Kbg \cdot N$$

where $Kbg$ is the inert gas supply coefficient.

Then, at S2003, the gas control unit 47 controls the valve B-V1 to increase the gas pressure in the laser chamber 10 by $\Delta Pbg$. By controlling the valve B-V1, an inert gas is supplied into the laser chamber 10. The inert gas supplied into the laser chamber 10 is an inert new gas supplied from the inert gas supply source B through the valve B-V2, or an inert regenerated gas with impurities reduced by the laser gas regenerating apparatus 50 and supplied through the valve B-CV1.

Then, at S2004, the gas control unit 47 calculates a supply amount $\Delta Phg$ of a fluorine-containing gas by the equation below.

$$\Delta Phg = Khg \cdot N$$

where $Khg$ is the fluorine-containing gas supply coefficient. The fluorine-containing gas supply coefficient $Khg$ is obtained, for example, as a total value of a first coefficient and a second coefficient. The first coefficient is for calculating a first fluorine-containing gas supply amount required for equalizing partial pressure of fluorine gas between before and after the partial gas exchange. The second coefficient is for calculating a second fluorine-containing gas supply amount required for supplying fluorine gas in an amount consumed by one electric discharge.

Then, at S2005, the gas control unit 47 controls the valve F2-V1 to increase the gas pressure in the laser chamber 10 by $\Delta Phg$. By controlling the valve F2-V1, a fluorine-containing gas is supplied into the laser chamber 10.

Then, at S2006, the gas control unit 47 controls the valve EX-V1 to reduce the gas pressure in the laser chamber 10 by ($\Delta Pbg + \Delta Phg$). By controlling the valve EX-V1, the laser gas in the laser chamber 10 is discharged, and the gas pressure returns to that before the partial gas exchange.

After S2006, the gas control unit 47 finishes the processing in this flowchart and returns to the processing in FIG. 3.

The above partial gas exchange processing has effects described below.

First, the fluorine gas can be supplied in the amount consumed mainly by electric discharge in the laser chamber 10. This can stabilize the fluorine gas concentration in the laser chamber 10 at a desired concentration.

Second, a predetermined amount of gas with reduced impurities can be supplied into the laser chamber 10, and the gas in the laser chamber 10 can be discharged in the same amount as that of the supplied gas. This can reduce impurities such as hydrogen fluoride (HF), carbon tetrafluoride (CF4), silicon tetrafluoride (SiF4), nitrogen trifluoride (NF3), or hexafluoroethane (C2F6) in the laser chamber 10.

1.2.3 Operation of Laser Gas Regenerating Apparatus

Again with reference to FIG. 1, the laser gas regenerating apparatus 50 reduces impurities in the discharged gas discharged from the excimer laser apparatus 30. The laser gas regenerating apparatus 50 supplies the inert regenerated gas with reduced impurities to the excimer laser apparatus 30.

The gas regeneration control unit 51 transmits and receives signals to and from the laser control unit 31. The gas regeneration control unit 51 controls components of the laser gas regenerating apparatus 50.

The filter 61 traps particles generated by electric discharge in the laser chamber 10, from the discharged gas supplied to the laser gas regenerating apparatus 50.

The recovery tank 63 holds the discharged gas having passed through the filter 61. The recovery pressure sensor P2 mounted to the recovery tank 63 measures gas pressure in the recovery tank 63. The recovery pressure sensor P2 outputs data on the measured gas pressure to the gas regeneration control unit 51.

The pressurizing pump 64 is controlled by the gas regeneration control unit 51. The gas regeneration control unit 51 controls the pressurizing pump 64 to operate when the gas pressure in the recovery tank 63 received from the recovery pressure sensor P2 is, for example, atmospheric pressure or higher. The pressurizing pump 64 pressurizes the discharged gas supplied from the recovery tank 63 and outputs the pressurized gas to the oxygen trap 67.

The oxygen trap 67 traps oxygen gas generated by reaction between fluorine gas and calcium oxide in the fluorine trap 45. The heating device and the temperature adjusting device (not shown) in the oxygen trap 67 are controlled by the gas regeneration control unit 51 such that an optimum temperature for the oxygen trap 67 to trap oxygen gas is reached.

The impurity gas trap 69 traps impurity gas such as a very small amount of water steam, oxygen gas, carbon monoxide gas, carbon dioxide gas, or nitrogen gas from the discharged gas having passed through the oxygen trap 67.

The pressurizing tank 65 holds the inert regenerated gas having passed through the impurity gas trap 69. The pressurizing pressure sensor P3 mounted to the pressurizing tank 65 measures gas pressure in the pressurizing tank 65. The pressurizing pressure sensor P3 outputs data on the measured gas pressure to the gas regeneration control unit 51.

The xenon concentration meter 79 transmits a measured xenon gas concentration to the gas regeneration control unit 51.

The flow rate of the massflow controller MFC1 is set by the gas regeneration control unit 51.

In the xenon adding unit 75, the flow rate of the massflow controller MFC2 is set by the gas regeneration control unit 51. The flow rate of the massflow controller MFC1 and the flow rate of the massflow controller MFC2 are set such that the xenon gas concentration of the inert regenerated gas added with the xenon-containing gas at the connection between the pipe 20 and the pipe 24 is a desired value. The desired value is, for example, the same as the xenon gas concentration of the inert new gas supplied from the inert gas supply source B.

The regenerated gas tank 81 holds the inert regenerated gas added with the xenon-containing gas. The inert gas pressure sensor P4 mounted to the regenerated gas tank 81 measures gas pressure in the regenerated gas tank 81. The inert gas pressure sensor P4 outputs data on the measured gas pressure to the gas regeneration control unit 51.

The filter 83 traps particles generated in the laser gas regenerating apparatus 50, from the inert regenerated gas supplied from the regenerated gas tank 81.

Supply of the inert regenerated gas from the gas purifying channel through the pipe 27 to the gas supply device 42 is controlled by opening and closing of the valve B-CV1. The opening and closing of the valve B-CV1 is controlled by the gas regeneration control unit 51.

Supply of the inert new gas from the inert gas supply source B through the pipe 27 to the gas supply device 42 is controlled by opening and closing of the valve B-V2. The opening and closing of the valve B-V2 is controlled by the gas regeneration control unit 51.

The gas regeneration control unit 51 chooses whether the valve B-CV1 is closed and the valve B-V2 is opened or the valve B-V2 is closed and the valve B-CV1 is opened, thereby controlling the valves.

1.2.3.1 Main Flow

Figure 7:
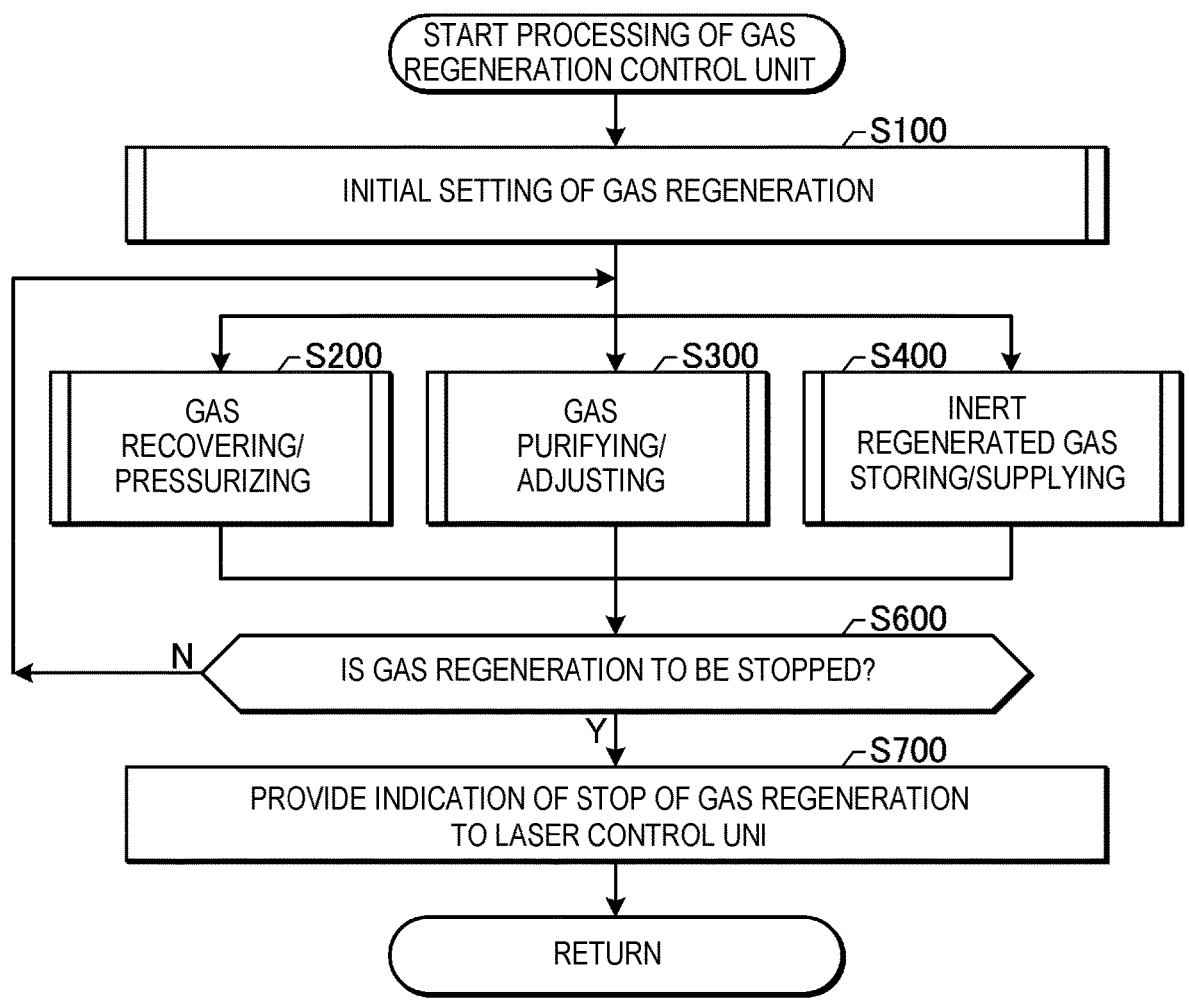
FIG. 7 is a flowchart of processing of a gas regeneration control unit 51 in FIG. 1.

FIG. 7 is a flowchart of processing of the gas regeneration control unit 51 in FIG. 1. The gas regeneration control unit 51 regenerates the laser gas as described below.

First, at S100, the gas regeneration control unit 51 performs an initial setting subroutine of gas regeneration. The initial setting subroutine of gas regeneration will be described later in detail with reference to FIG. 8.

After S100, the gas regeneration control unit 51 simultaneously performs processes at S200, S300 and S400. Alternatively, the gas regeneration control unit 51 may sequentially perform the processes at S200, S300 and S400. The order of the processes at S200, S300 and S400 is not particularly limited.

At S200, the gas regeneration control unit 51 controls the pressurizing pump 64 by a gas recovering/pressurizing subroutine. The gas recovering/pressurizing subroutine will be described later in detail with reference to FIG. 9.

At S300, the gas regeneration control unit 51 controls the massflow controller MFC1 and the massflow controller MFC2 by a gas purifying/adjusting subroutine. The gas purifying/adjusting subroutine will be described later in detail with reference to FIG. 10.

At S400, the gas regeneration control unit 51 controls the valve B-CV1 and the valve B-V2 by an inert regenerated gas storing/supplying subroutine. The inert regenerated gas storing/supplying subroutine will be described later in detail with reference to FIG. 11.

After S200, S300 and S400, the gas regeneration control unit 51 goes to S600. At S600, the gas regeneration control unit 51 determines whether or not regeneration of the laser gas is to be stopped. For example, the gas regeneration control unit 51 determines that the regeneration of the laser gas is to be stopped when part of the laser gas regenerating apparatus 50 such as the pressurizing pump 64 has failed or when maintenance is to be performed because various filters reach the end of life.

When the regeneration of the laser gas is not to be stopped (NO at S600), the gas regeneration control unit 51 returns to S200, S300 and S400.

When the regeneration of the laser gas is to be stopped (YES at S600), the gas regeneration control unit 51 goes to S700.

At S700, the gas regeneration control unit 51 outputs, to the laser control unit 31, a signal to indicate stop of the regeneration of the laser gas.

After S700, the gas regeneration control unit 51 finishes the processing in this flowchart.

1.2.3.2 Initial Setting Subroutine of Gas Regeneration

Figure 8:
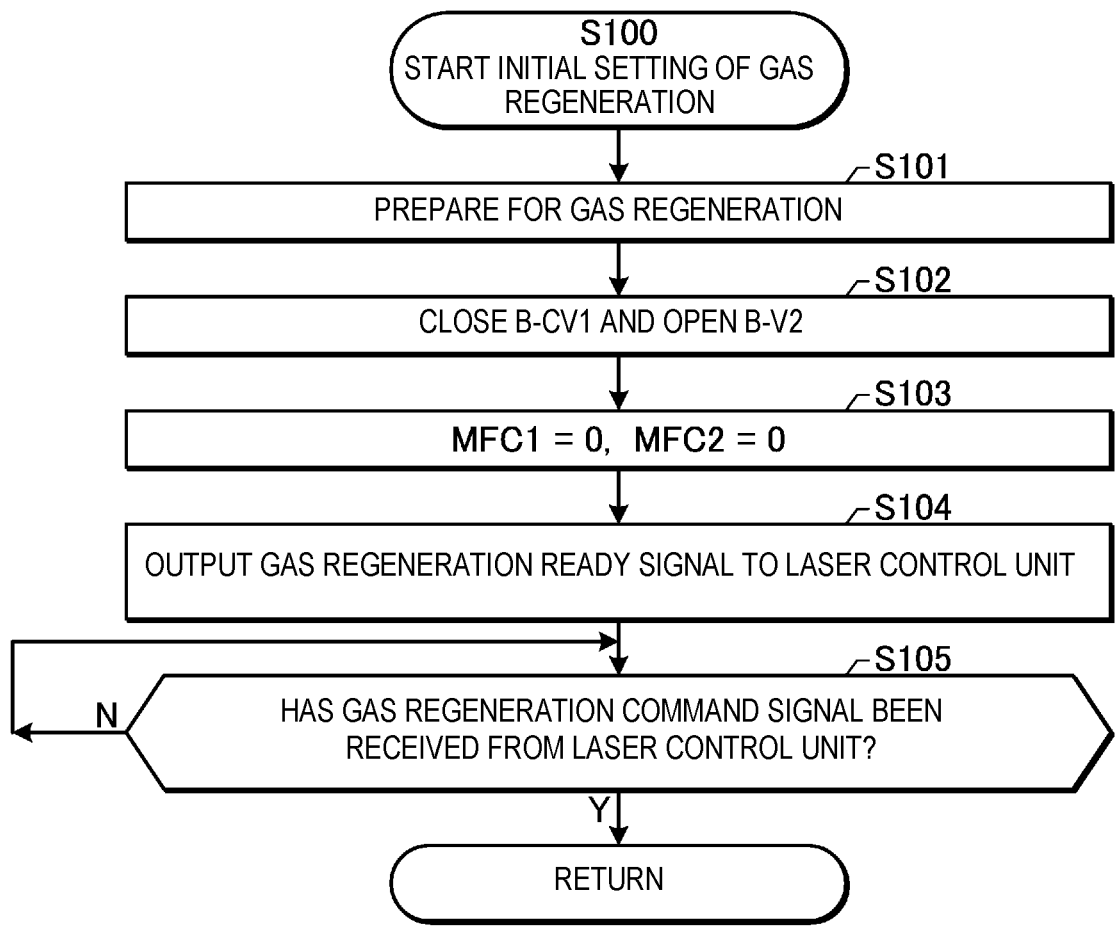
FIG. 8 is a flowchart of details of an initial setting subroutine of gas regeneration in the comparative example.

FIG. 8 is a flowchart of details of the initial setting subroutine of gas regeneration in the comparative example. The processing in FIG. 8 is performed by the gas regeneration control unit 51 as a subroutine of S100 in FIG. 7.

First, at S101, the gas regeneration control unit 51 prepares for gas regeneration. To prepare for gas regeneration, the gas regeneration control unit 51 may fill the pipes 24, 25, 26, 27, 20 with the laser gas or may produce a vacuum therein. The gas regeneration control unit 51 may control the heater of the oxygen trap 67.

Then, at S102, the gas regeneration control unit 51 closes the valve B-CV1 and opens the valve B-V2. Thus, supply of the inert regenerated gas from the laser gas regenerating apparatus 50 to the laser chamber 10 is stopped to allow supply of the inert new gas.

Then, at S103, the gas regeneration control unit 51 sets the flow rate MFC1 of the massflow controller MFC1 and the flow rate MFC2 of the massflow controller MFC2 to 0. Thus, the laser gas regenerating apparatus 50 enters a state where flow of the inert regenerated gas and the xenon-containing gas into the connection between the pipe 20 and the pipe 24 is stopped. In the description below, reference signs MFC1, MFC2 denote both the massflow controllers and the flow rates of the massflow controllers.

Then, at S104, the gas regeneration control unit 51 outputs, to the laser control unit 31, a signal indicating that the gas regeneration control unit 51 is ready for gas regeneration. The laser control unit 31 transmits the signal from the gas regeneration control unit 51 to the gas control unit 47. The gas control unit 47 closes the valve EX-V2 of the exhaust device 43 and opens the valve C-V1 of the exhaust device 43 by the processes at S1300 and S1500 in the flowchart in FIG. 3.

Then, at S105, the gas regeneration control unit 51 determines whether or not it has received a gas regeneration command signal from the laser control unit 31. When having not received the gas regeneration command signal, the gas regeneration control unit 51 waits until receiving the gas regeneration command signal. When having received the gas regeneration command signal, the gas regeneration control unit 51 finishes the processing in this flowchart and returns to the processing in FIG. 7.

1.2.3.3 Gas Recovering/Pressurizing Subroutine

Figure 9:
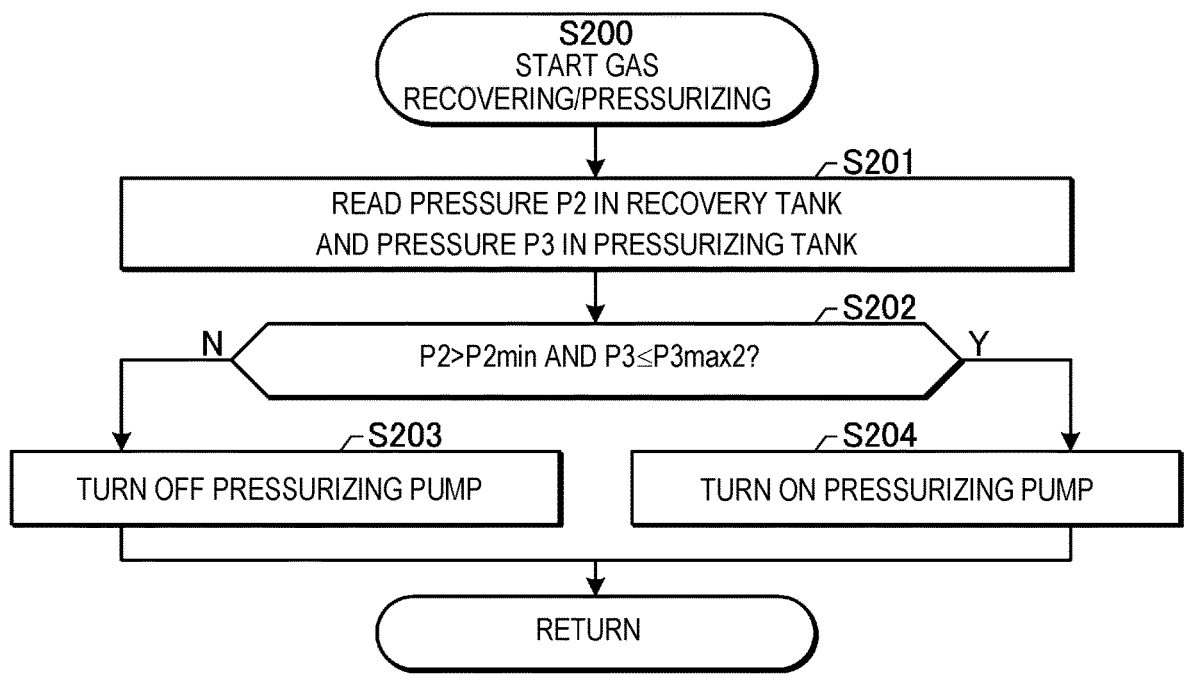
FIG. 9 is a flowchart of details of a gas recovering/pressurizing subroutine in the comparative example.

FIG. 9 is a flowchart of details of the gas recovering/pressurizing subroutine in the comparative example. The processing in FIG. 9 is performed by the gas regeneration control unit 51 as a subroutine of S200 in FIG. 7. The gas regeneration control unit 51 controls the pressurizing pump 64 to pressurize the discharged gas held in the recovery tank 63, and to supply the discharged gas through the various traps into the pressurizing tank 65 by processing described below.

First, at S201, the gas regeneration control unit 51 reads pressure P2 in the recovery tank 63 output from the recovery pressure sensor P2, and pressure P3 in the pressurizing tank 65 output from the pressurizing pressure sensor P3. In the description below, reference signs P2, P3 denote both the pressure sensors and pressure values output from the pressure sensors.

Then, at S202, the gas regeneration control unit 51 determines whether or not the pressure P2 in the recovery tank 63 is higher than a predetermined value P2min and the pressure P3 in the pressurizing tank 65 is equal to or lower than a predetermined value P3max2. The predetermined value P2min is a value slightly lower than atmospheric pressure, for example, a value of 900 hPa to 1000 hPa. The predetermined value P3max2 is, for example, a value lower than and close to design-based upper limit pressure of the pressurizing tank 65.

When the pressure P2 is equal to or lower than the predetermined value P2min or the pressure P3 is higher than the predetermined value P3max2 (NO at S202), the gas regeneration control unit 51 goes to S203.

When the pressure P2 is higher than the predetermined value P2min and the pressure P3 is equal to or lower than the predetermined value P3max2 (YES at S202), the gas regeneration control unit 51 goes to S204.

At S203, the gas regeneration control unit 51 stops operation of the pressurizing pump 64. Thus, when the pressure P2 in the recovery tank 63 is too low or the pressure P3 in the pressurizing tank 65 is too high, the gas regeneration control unit 51 stops the pressurizing pump 64.

At S204, the gas regeneration control unit 51 starts the operation of the pressurizing pump 64 or continues the operation when it has been already started.

After S203 or S204, the gas regeneration control unit 51 finishes the processing in this flowchart and returns to the processing in FIG. 7.

1.2.3.4 Gas Purifying/Adjusting Subroutine

Figure 10:
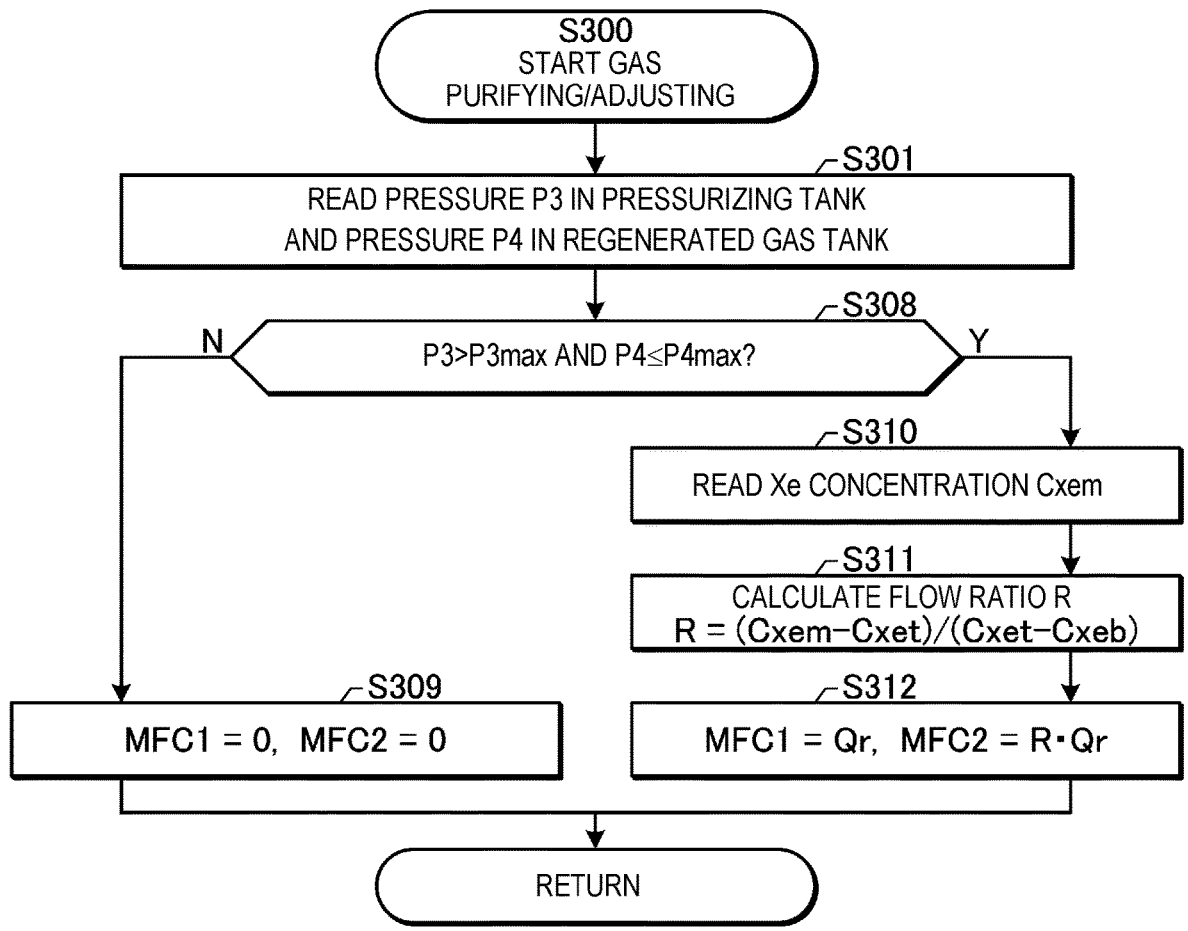
FIG. 10 is a flowchart of details of a gas purifying/adjusting subroutine in the comparative example.

FIG. 10 is a flowchart of details of the gas purifying/adjusting subroutine in the comparative example. The processing in FIG. 10 is performed by the gas regeneration control unit 51 as a subroutine of S300 in FIG. 7. The gas regeneration control unit 51 controls the massflow controller MFC1 and the massflow controller MFC2 to add the xenon-containing gas to the inert regenerated gas held in the pressurizing tank 65 and to supply the inert regenerated gas added with the xenon-containing gas to the regenerated gas tank 81 by processing described below.

First, at S301, the gas regeneration control unit 51 reads pressure P3 in the pressurizing tank 65 output from the pressurizing pressure sensor P3 and pressure P4 in the regenerated gas tank 81 output from the inert gas pressure sensor P4.

Then, at S308, the gas regeneration control unit 51 determines whether or not the pressure P3 in the pressurizing tank 65 is higher than a predetermined value P3max and the pressure P4 in the regenerated gas tank 81 is equal to or lower than a predetermined value P4max. The predetermined value P3max is a value lower than the predetermined value P3max2 and equal to or higher than pressure in the regulator 86 of the inert gas supply source B, for example, a value of 7000 hPa to 8000 hPa. The predetermined value P4max is, for example, a value lower than and close to design-based upper limit pressure in the regenerated gas tank 81.

When the pressure P3 is equal to or lower than the predetermined value P3max or the pressure P4 is higher than the predetermined value P4max (NO at S308), the gas regeneration control unit 51 goes to S309.

When the pressure P3 is higher than the predetermined value P3max and the pressure P4 is equal to or lower than the predetermined value P4max (YES at S308), the gas regeneration control unit 51 goes to S310.

At S309, the gas regeneration control unit 51 sets the flow rate MFC1 of the massflow controller MFC1 and the flow rate MFC2 of the massflow controller MFC2 to 0. Thus, when the pressure in the pressurizing tank 65 is too low or the pressure in the regenerated gas tank 81 is too high, the laser gas regenerating apparatus 50 enters a state where flow of the inert regenerated gas and the xenon-containing gas into the connection between the pipe 20 and the pipe 24 is stopped.

After S309, the gas regeneration control unit 51 finishes the processing in this flowchart and returns to the processing in FIG. 7.

At S310, the gas regeneration control unit 51 reads, from the xenon concentration meter 79, a xenon gas concentration Cxem of the inert regenerated gas before added with xenon.

Then, at S311, the gas regeneration control unit 51 calculates a flow ratio R between the flow rate MFC1 of the massflow controller MFC1 and the flow rate MFC2 of the massflow controller MFC2 by the equation below.

$$R=(Cxem-Cxet)/(Cxet-Cxeb)$$

where Cxeb is a xenon gas concentration of the xenon-containing gas to be added to the inert regenerated gas, and Cxet is a target xenon concentration of the inert regenerated gas added with xenon.

The target xenon concentration Cxet is the same as the xenon gas concentration of the inert new gas supplied from the inert gas supply source B.

Then, at S312, the gas regeneration control unit 51 sets the flow rate MFC1 of the massflow controller MFC1 and the flow rate MFC2 of the massflow controller MFC2 as described below.

$$MFC1=Qr$$

$$MFC2=R \cdot Qr$$

Thus, the inert regenerated gas and the xenon-containing gas at the flow ratio R flow into the connection between the pipe 20 and the pipe 24 and are mixed, and are supplied through the regenerated gas tank 81 to the laser chamber 10.

After S312, the gas regeneration control unit 51 finishes the processing in this flowchart and returns to the processing in FIG. 7.

The flow ratio R is derived as described below.

First, variables are set as described below.

Qr: the flow rate of the massflow controller MFC1 to obtain the target xenon concentration Cxet Qxeb: the flow rate of the massflow controller MFC2 to obtain the target xenon concentration Cxet Cxem: the xenon gas concentration of the inert regenerated gas before added with xenon Cxeb: the xenon gas concentration of the xenon-containing gas to be added to the inert regenerated gas The flow rate of the inert regenerated gas added with xenon in the connection between the pipe 20 and the pipe 24 is (Qxeb+Qr).

The amount of xenon gas contained in the inert regenerated gas added with xenon is (Cxeb·Qxeb+Cxem·Qr).

Then, to equalize, with the target xenon concentration Cxet, the xenon gas concentration of the inert regenerated gas added with xenon, the equation below is given.

$$Cxet=(Cxeb \cdot Qxeb+Cxem \cdot Qr)/(Qxeb+Qr)$$

This equation is modified by Qxeb being equal to R·Qr as below.

$$Cxet=(Cxeb \cdot R+Cxem)/(R+1)$$

From this equation, R is obtained as below.

$$R=(Cxem-Cxet)/(Cxet-Cxeb)$$

1.2.3.5 Inert Regenerated Gas Storing/Supplying Subroutine

Figure 11:
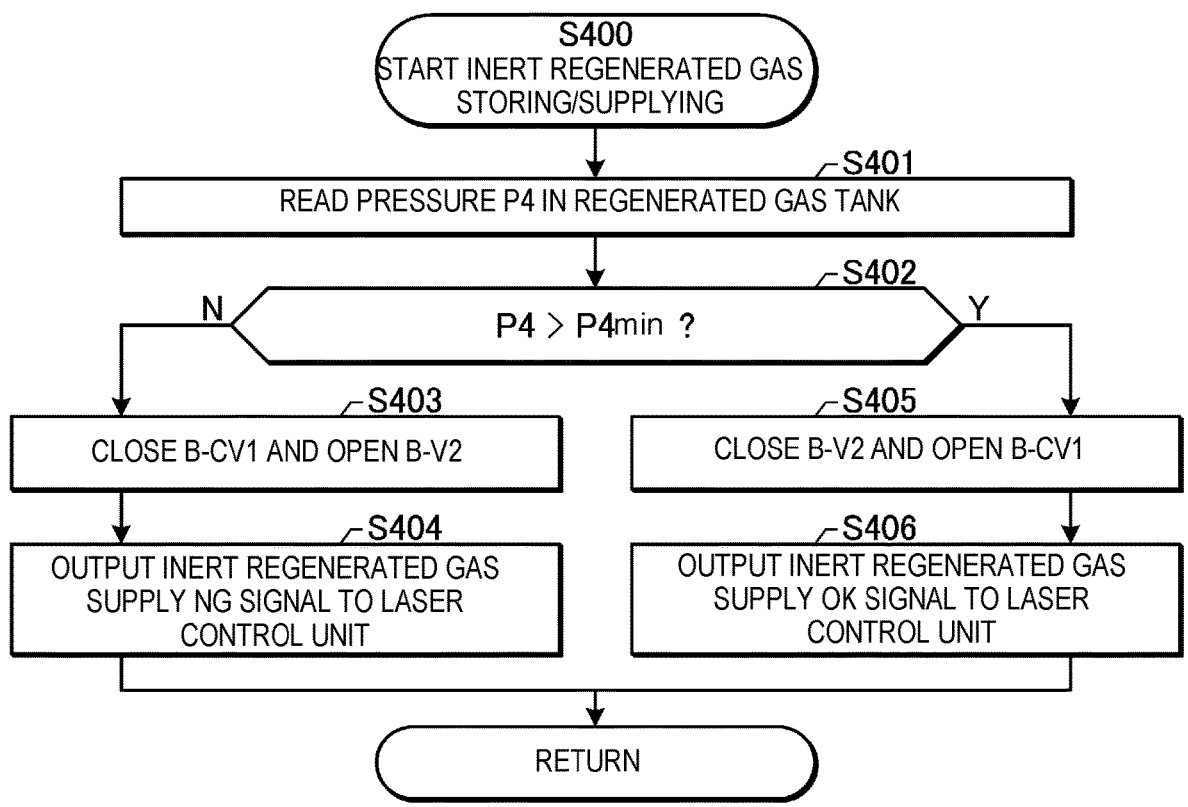
FIG. 11 is a flowchart of details of an inert regenerated gas storing/supplying subroutine in the comparative example.

FIG. 11 is a flowchart of details of the inert regenerated gas storing/supplying subroutine in the comparative example. The processing in FIG. 11 is performed by the gas regeneration control unit 51 as a subroutine of S400 in FIG. 7. The gas regeneration control unit 51 controls the valve B-CV1 and the valve B-V2 to switch the inert gas to be supplied to the laser chamber 10 between the inert regenerated gas and the inert new gas by processing below.

First, at S401, the gas regeneration control unit 51 reads pressure P4 in the regenerated gas tank 81 output from the inert gas pressure sensor P4.

Then, at S402, the gas regeneration control unit 51 determines whether or not the pressure P4 in the regenerated gas tank 81 is higher than a predetermined value P4min. The predetermined value P4min is a value equal to the pressure in the regulator 86 of the inert gas supply source B, for example, a value of 7000 hPa to 8000 hPa.

When the pressure P4 is equal to or lower than the predetermined value P4min (NO at S402), the gas regeneration control unit 51 goes to S403.

When the pressure P4 is higher than the predetermined value P4min (YES at S402), the gas regeneration control unit 51 goes to S405.

At S403, the gas regeneration control unit 51 closes the valve B-CV1 and opens the valve B-V2. Thus, the laser gas regenerating apparatus 50 enters a state where supply of the inert regenerated gas to the laser chamber 10 is stopped and the inert new gas can be supplied.

After S403, at S404, the gas regeneration control unit 51 outputs an inert regenerated gas supply NG signal to the laser control unit 31.

At S405, the gas regeneration control unit 51 closes the valve B-V2 and opens the valve B-CV1. Thus, the laser gas regenerating apparatus 50 enters a state where supply of the inert new gas to the laser chamber 10 is stopped and the inert regenerated gas can be supplied.

After S405, at S406, the gas regeneration control unit 51 outputs an inert regenerated gas supply OK signal to the laser control unit 31.

After S404 or S406, the gas regeneration control unit 51 finishes the processing in this flowchart and returns to the processing in FIG. 7.

1.3 Gas Flow

Figure 12:
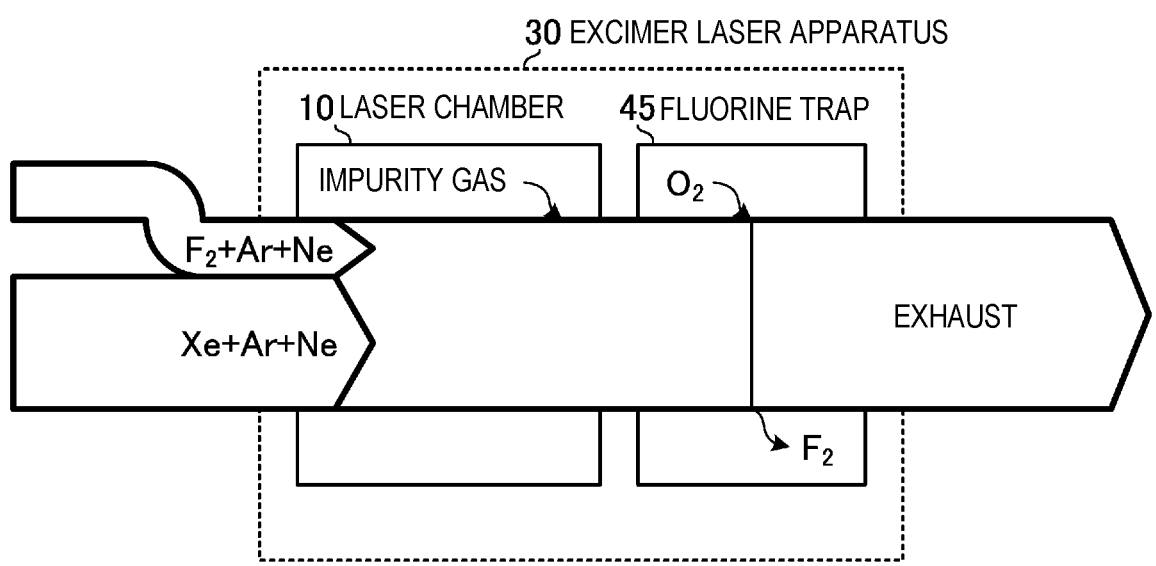
FIG. 12 is a flow diagram of a laser gas when laser gas regeneration is not performed in the comparative example.

FIG. 12 is a flow diagram of a laser gas when laser gas regeneration is not performed in the comparative example. As described above, the fluorine-containing gas containing fluorine gas, argon gas, and neon gas is supplied from the fluorine-containing gas supply source F2 to the laser chamber 10. Also, the inert new gas containing argon gas, neon gas, and a small amount of xenon gas is supplied from the inert gas supply source B to the laser chamber 10. A ratio between a supply amount of the fluorine-containing gas and a supply amount of the inert new gas is set such that the fluorine gas concentration in the laser chamber 10 is a desired value. Since the fluorine-containing gas contains little xenon gas, the xenon gas concentration in the laser chamber 10 when the fluorine-containing gas is mixed with the inert new gas is slightly lower than the xenon gas concentration of the inert new gas.

Impurity gas is generated in the laser chamber 10, but the laser gas containing the impurity gas is soon discharged by the gas pressure control or the partial gas exchange. From the laser gas discharged from the laser chamber 10, fluorine gas is removed by the fluorine trap 45. When the fluorine trap 45 contains calcium oxide, calcium fluoride and oxygen gas are produced. Thus, the laser gas discharged from the excimer laser apparatus 30 through the fluorine trap 45 newly contains oxygen gas.

Instead of the laser gas discharged from the excimer laser apparatus 30, the fluorine-containing gas and the inert new gas are newly supplied to the laser chamber 10.

The laser gas supplied to the laser chamber 10 is soon totally discharged, and new gas is supplied instead. Thus, the xenon gas concentration in the laser chamber 10 may show little change in a steady state and have little influence on laser performance.

Figure 13:
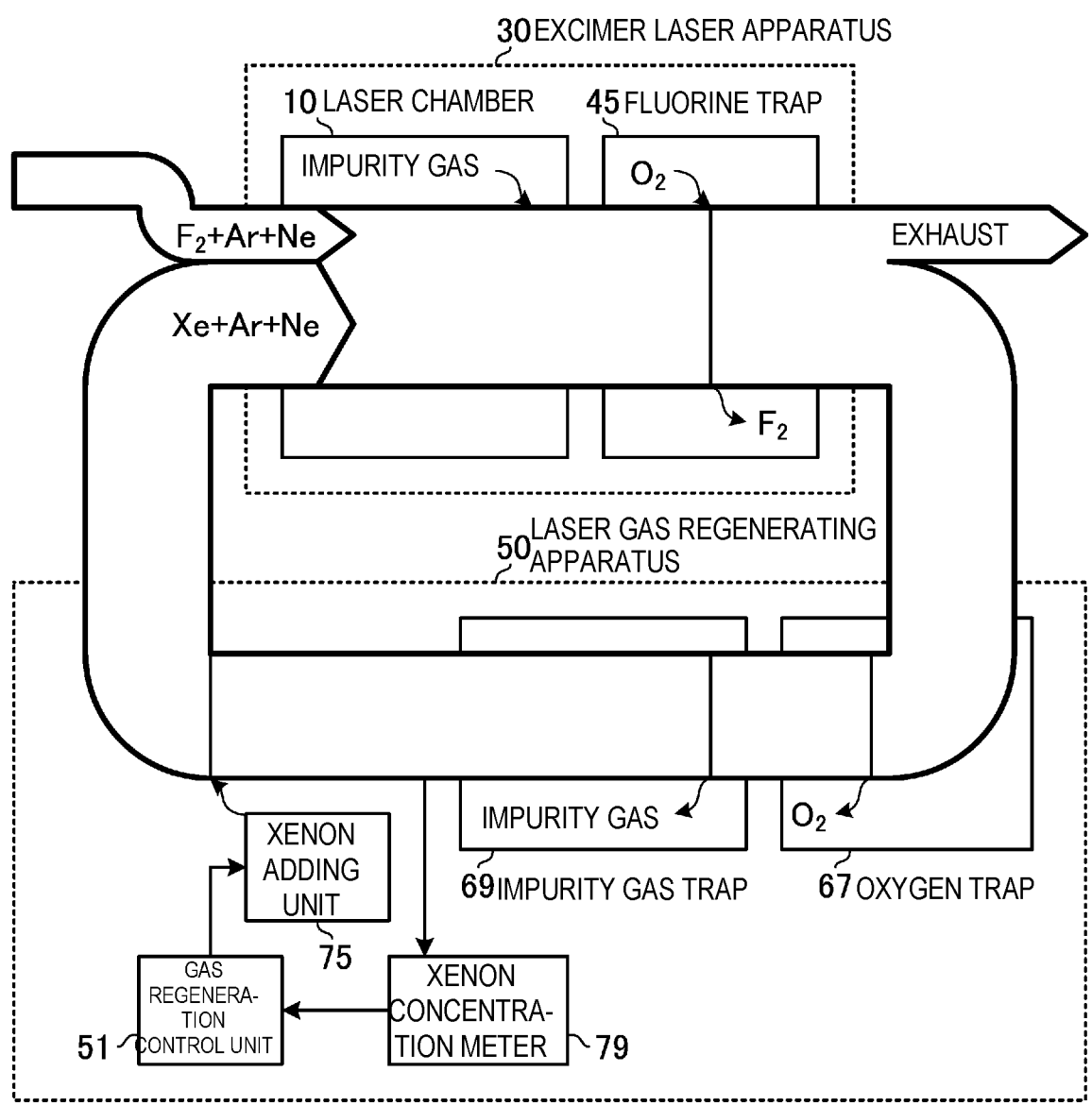
FIG. 13 is a flow diagram of a laser gas when laser gas regeneration is performed in the comparative example.

FIG. 13 is a flow diagram of the laser gas when laser gas regeneration is performed in the comparative example. As described above, when the valve EX-V2 is opened and the valve C-V1 is closed, the laser gas discharged from the excimer laser apparatus 30 is exhausted outside the apparatus. When the valve EX-V2 is closed and the valve C-V1 is opened, the laser gas discharged from the excimer laser apparatus 30 is introduced into the laser gas regenerating apparatus 50. The gas introduced into the laser gas regenerating apparatus 50 passes through the oxygen trap 67 and the impurity gas trap 69. Thus, oxygen gas and impurity gas are removed from the gas introduced into the laser gas regenerating apparatus 50 to produce the inert regenerated gas.

One part of the laser gas discharged from the excimer laser apparatus 30 is regenerated by the laser gas regenerating apparatus 50, and the other part is exhausted outside the apparatus. The laser gas exhausted outside the apparatus contains xenon gas, and thus some xenon gas is exhausted outside the apparatus. In the steady state, a fluorine-containing gas in substantially the same amount as that of the laser gas exhausted outside the apparatus is supplied from the fluorine-containing gas supply source F2 into the laser chamber 10, and the fluorine-containing gas contains little xenon gas. Thus, repeating regeneration of the laser gas, exhaust of part of the laser gas, and supply of the fluorine-containing gas reduces the xenon gas concentration of the inert regenerated gas and the xenon gas concentration in the laser chamber 10. Continuously repeating them may further reduce the xenon gas concentration in the laser chamber 10, cause unstable electric discharge, and reduce laser performance. Then, in the comparative example, the xenon-containing gas is added to the inert regenerated gas based on the xenon gas concentration of the inert regenerated gas measured by the xenon concentration meter 79. This can suppress the reduction in the xenon gas concentration in the laser chamber 10.

1.4 Problem

An optimum xenon gas concentration in the ArF excimer laser apparatus is, for example, about 10 ppm. It is difficult to adjust the xenon gas concentration in such a low concentration range.

In the comparative example, the xenon gas concentration of the inert regenerated gas is measured, but to measure the xenon gas concentration, an expensive gas analyzer with large footprint may be required.

As another example, most of the xenon gas may be trapped from the inert regenerated gas, and then a predetermined amount of xenon gas may be added. However, in this case, a trap device for trapping the xenon gas is further required.

As a further example, the xenon gas may be added when laser performance is reduced. However, in this case, measures can be taken only after the laser performance is reduced, resulting in unstable laser performance.

In an embodiment described below, a laser gas regenerating apparatus 50 adds a xenon-containing gas to an inert regenerated gas based on a supply amount of a fluorine-containing gas. Specifically, as shown in FIG. 13, in a steady state, the supply amount of the fluorine-containing gas substantially matches an exhaust amount of a laser gas exhausted outside an apparatus without being regenerated. Then, the xenon-containing gas is added to the inert regenerated gas based on the supply amount of the fluorine-containing gas, and thus xenon gas in the same amount as that of xenon gas in the laser gas exhausted outside the apparatus is added. This can adjust the xenon gas concentration in the laser chamber 10 to a desired range. In another embodiment, the xenon-containing gas is added to the inert regenerated gas based on an exhaust amount of gas exhausted outside the apparatus through a valve EX-V2.

2. Laser Gas Regenerating Apparatus Configured to Add Xenon-Containing Gas Based on Fluorine-Containing Gas Supply Amount

2.1 Configuration

Figure 14:
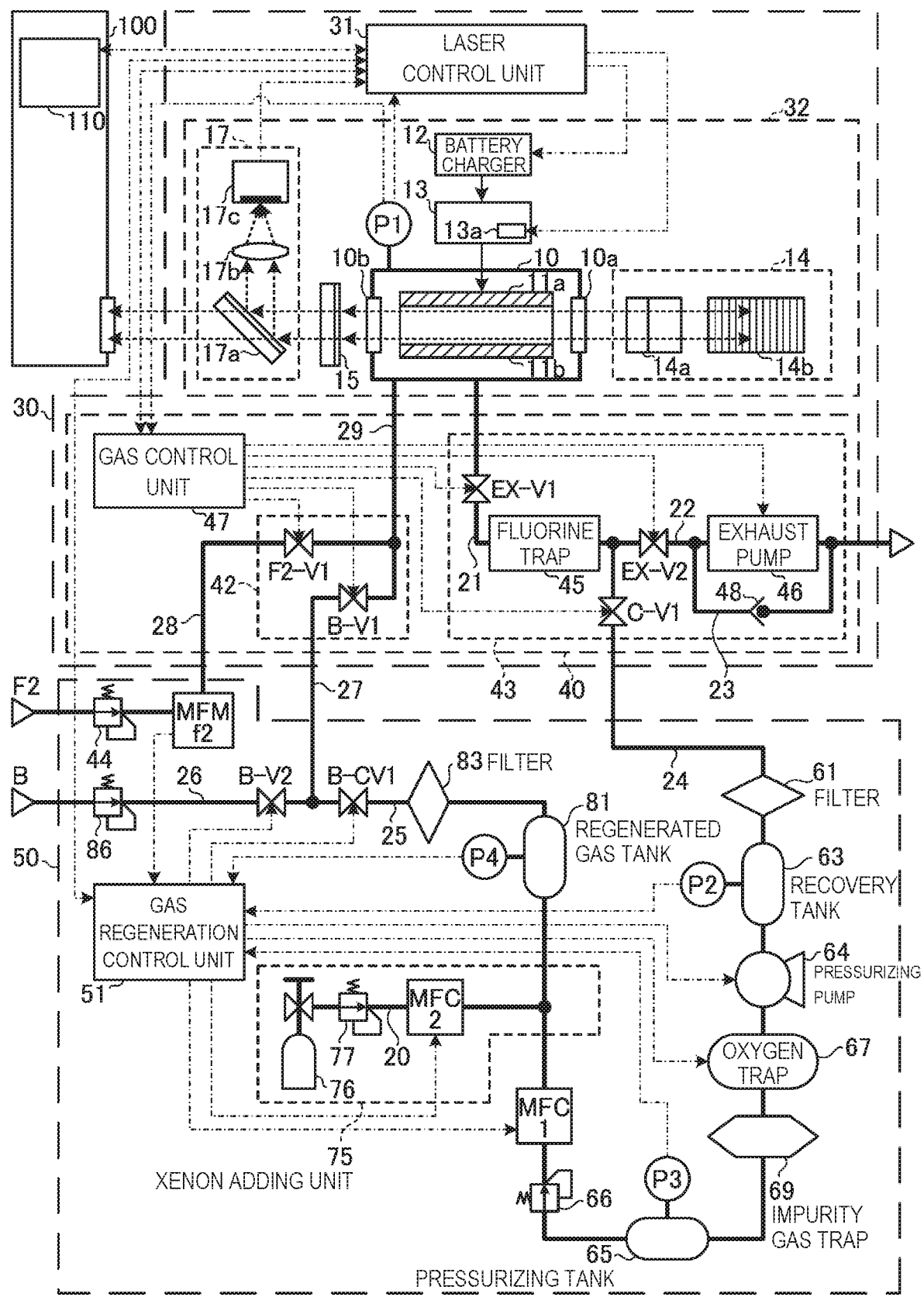
FIG. 14 schematically shows configurations of an excimer laser apparatus 30 and a laser gas regenerating apparatus 50 according to a first embodiment of the present disclosure.

FIG. 14 schematically shows configurations of an excimer laser apparatus 30 and a laser gas regenerating apparatus 50 according to a first embodiment of the present disclosure. The excimer laser apparatus 30 and the laser gas regenerating apparatus 50 constitute an excimer laser system. In the first embodiment, the laser gas regenerating apparatus 50 includes part of a pipe 28 connected to a fluorine-containing gas supply source F2. The laser gas regenerating apparatus 50 includes a massflow meter MFMf2 arranged in the pipe 28.

An inert gas supply source B corresponds to a first laser gas supply source in the present disclosure. The fluorine-containing gas supply source F2 corresponds to a second laser gas supply source in the present disclosure. A xenon-containing gas corresponds to a third laser gas in the present disclosure.

In the first embodiment, a xenon concentration meter 79 may be omitted.

Other than the above, a configuration of the first embodiment is the same as that of the comparative example.

2.2 Operation

Figure 15:
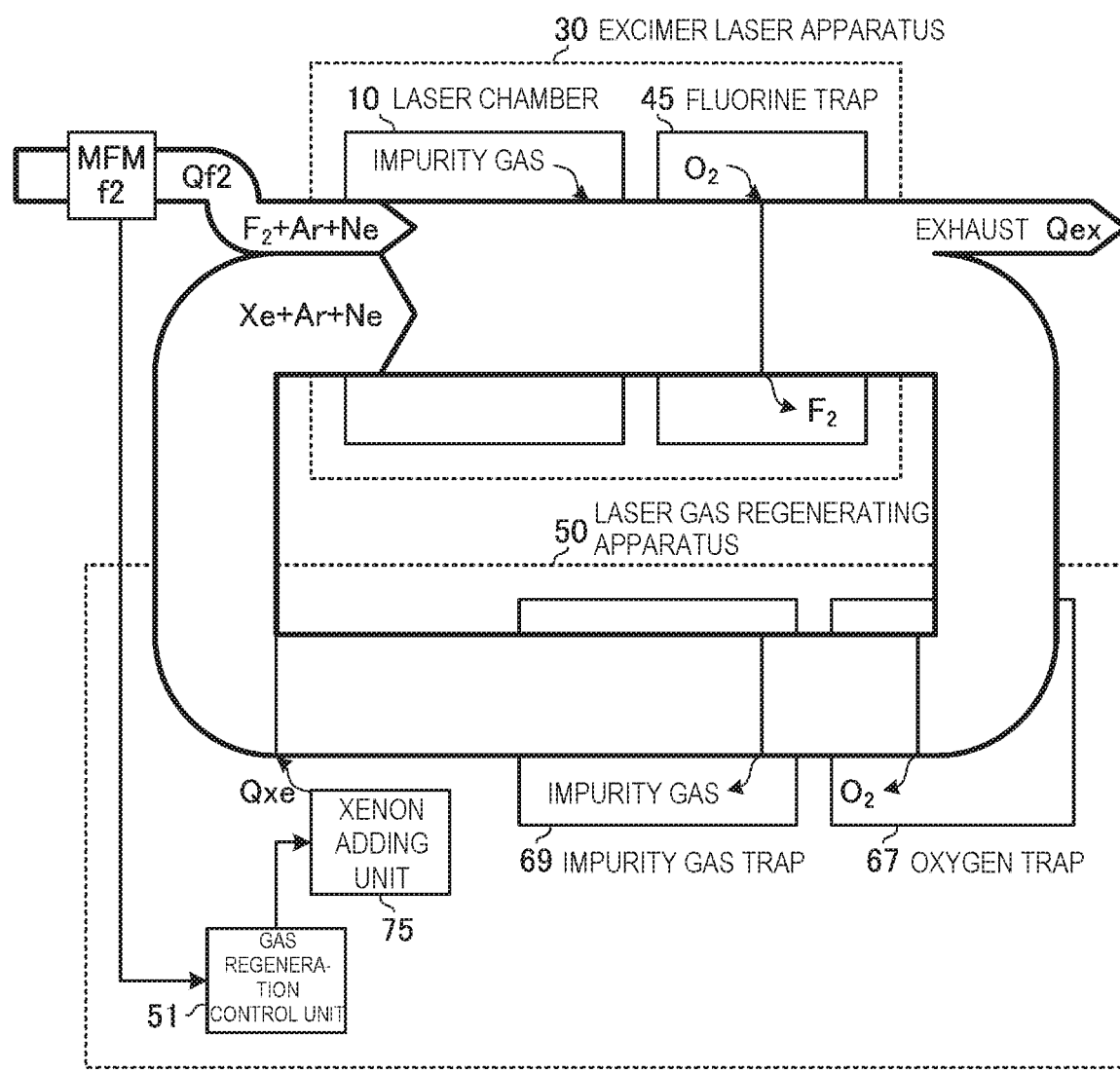
FIG. 15 is a flow diagram of a laser gas in the first embodiment.

FIG. 15 is a flow diagram of a laser gas in the first embodiment. The massflow meter MFMf2 measures a supply amount Qf2 of a fluorine-containing gas supplied from the fluorine-containing gas supply source F2, and transmits the supply amount Qf2 through a signal line to a gas regeneration control unit 51. The gas regeneration control unit 51 reads data on the supply amount Qf2 of the fluorine-containing gas. The signal line connected between the massflow meter MFMf2 and the gas regeneration control unit 51 corresponds to a data obtaining unit in the present disclosure. The gas regeneration control unit 51 calculates an addition amount Qxe of the xenon-containing gas to be added to an inert regenerated gas in proportion to the supply amount Qf2 of the fluorine-containing gas. The gas regeneration control unit 51 controls a xenon adding unit 75 to add the xenon-containing gas in the addition amount Qxe to the inert regenerated gas. The addition amount Qxe of the xenon-containing gas is given by the equation below.

$$Qxe = \alpha \cdot Qf2 \quad \text{(Equation 1)}$$

where α is a proportionality constant for calculating the addition amount Qxe of the xenon-containing gas.

2.2.1 Derivation of Proportionality Constant

The proportionality constant α is derived as described below.

A xenon gas concentration when an inert regenerated gas before added with xenon, a xenon-containing gas supplied from a xenon-containing gas cylinder 76, and a fluorine-containing gas supplied from the fluorine-containing gas supply source F2 are mixed needs to be substantially equal to a target xenon gas concentration Cxect in a laser chamber 10 in a steady state. On the other hand, if an amount of xenon trapped by an impurity gas trap 69 or the like is substantially negligible, a xenon gas concentration of the inert regenerated gas before added with xenon may be substantially equal to a xenon gas concentration of a laser gas when discharged from the laser chamber 10. Then, the xenon-containing gas is added such that the xenon gas concentration when the fluorine-containing gas supplied from the fluorine-containing gas supply source F2 is mixed with the xenon-containing gas supplied from the xenon-containing gas cylinder 76 is equal to the target xenon gas concentration Cxect. Thus, the xenon gas concentration in the laser chamber 10 may be stabilized around the target xenon gas concentration Cxect. The target xenon gas concentration Cxect in the laser chamber 10 is the same as a xenon gas concentration of an inert new gas supplied from the inert gas supply source B.

First, variables are set as described below.

Qxe: the addition amount of the xenon-containing gas to be added to the inert regenerated gas to obtain the target xenon gas concentration Cxect Cxeb: a xenon gas concentration of the xenon-containing gas to be added to the inert regenerated gas Qf2: a supply amount of the fluorine-containing gas supplied from the fluorine-containing gas supply source F2 to the laser chamber 10

The sum of the supply amount Qf2 of the fluorine-containing gas and the addition amount Qxe of the xenon-containing gas is (Qf2+Qxe).

The amount of xenon gas contained in the xenon-containing gas is Cxeb·Qxe.

The amount of xenon gas contained in the fluorine-containing gas is nearly 0.

Then, to equalize, with the target xenon gas concentration Cxect, the xenon gas concentration when the fluorine-containing gas is mixed with the xenon-containing gas, the equation below is given.

$$Cxect = (0 + Cxeb \cdot Qxe)/(Qf2 + Qxe)$$

This equation is modified by Equation 1 as below.

$$Cxect = \alpha \cdot Cxeb/(1+\alpha)$$

From this equation, α is obtained as below.

$$\alpha = Cxect/(Cxeb - Cxect)$$

For example, when the target xenon gas concentration Cxect is 10 ppm and the xenon gas concentration Cxeb of the xenon-containing gas is 10000 ppm, the proportionality constant α is obtained as below.

$$\alpha = 10/(10000-10) = 1/999$$

The xenon gas concentration Cxeb of the xenon-containing gas is not limited to 10000 ppm. The xenon gas concentration Cxeb of the xenon-containing gas is preferably 10000 ppm to 200000 ppm.

2.2.2 Processing of Gas Regeneration Control Unit

Figure 16:
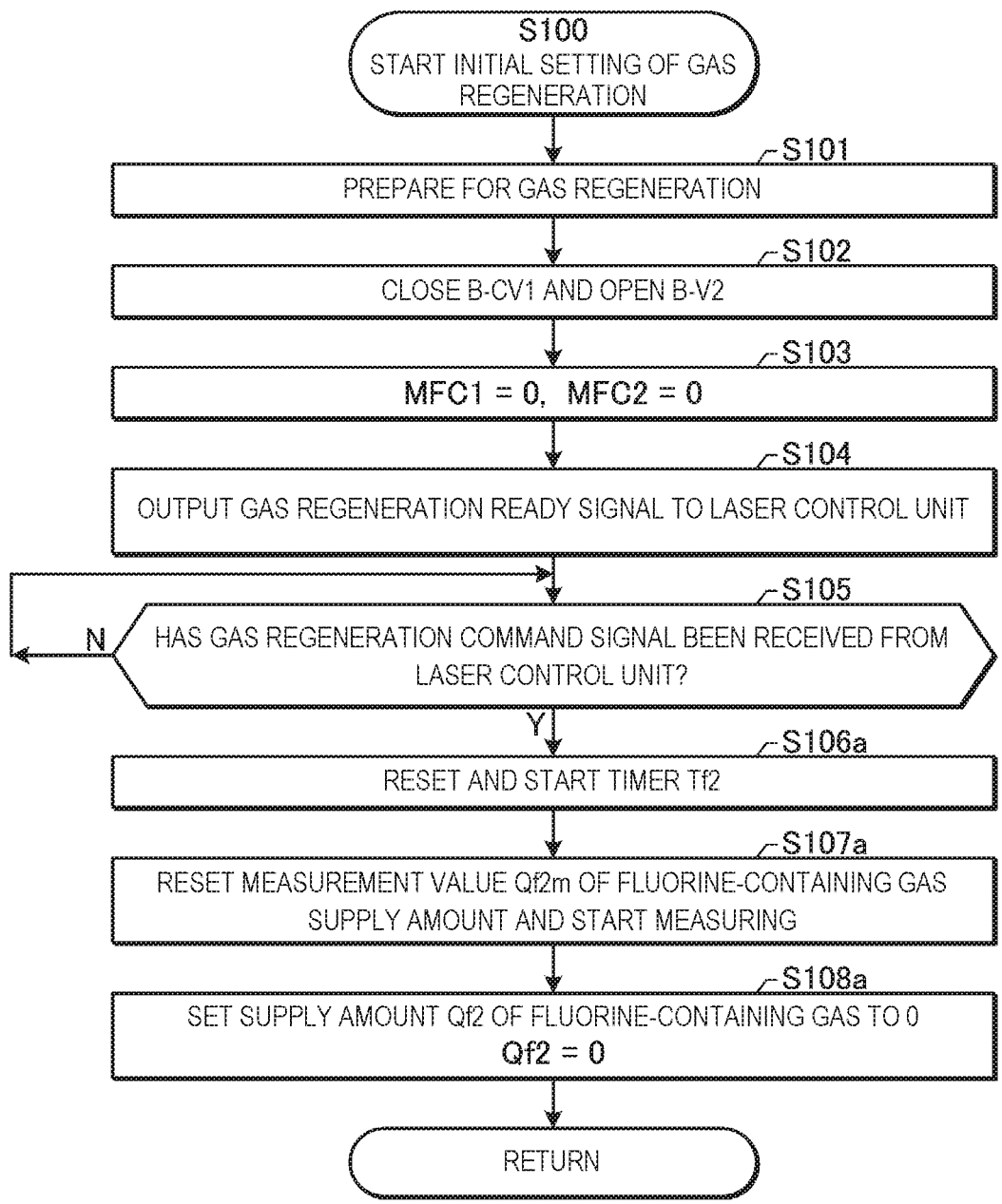
FIG. 16 is a flowchart of details of an initial setting subroutine of gas regeneration in the first embodiment.
Figure 17:
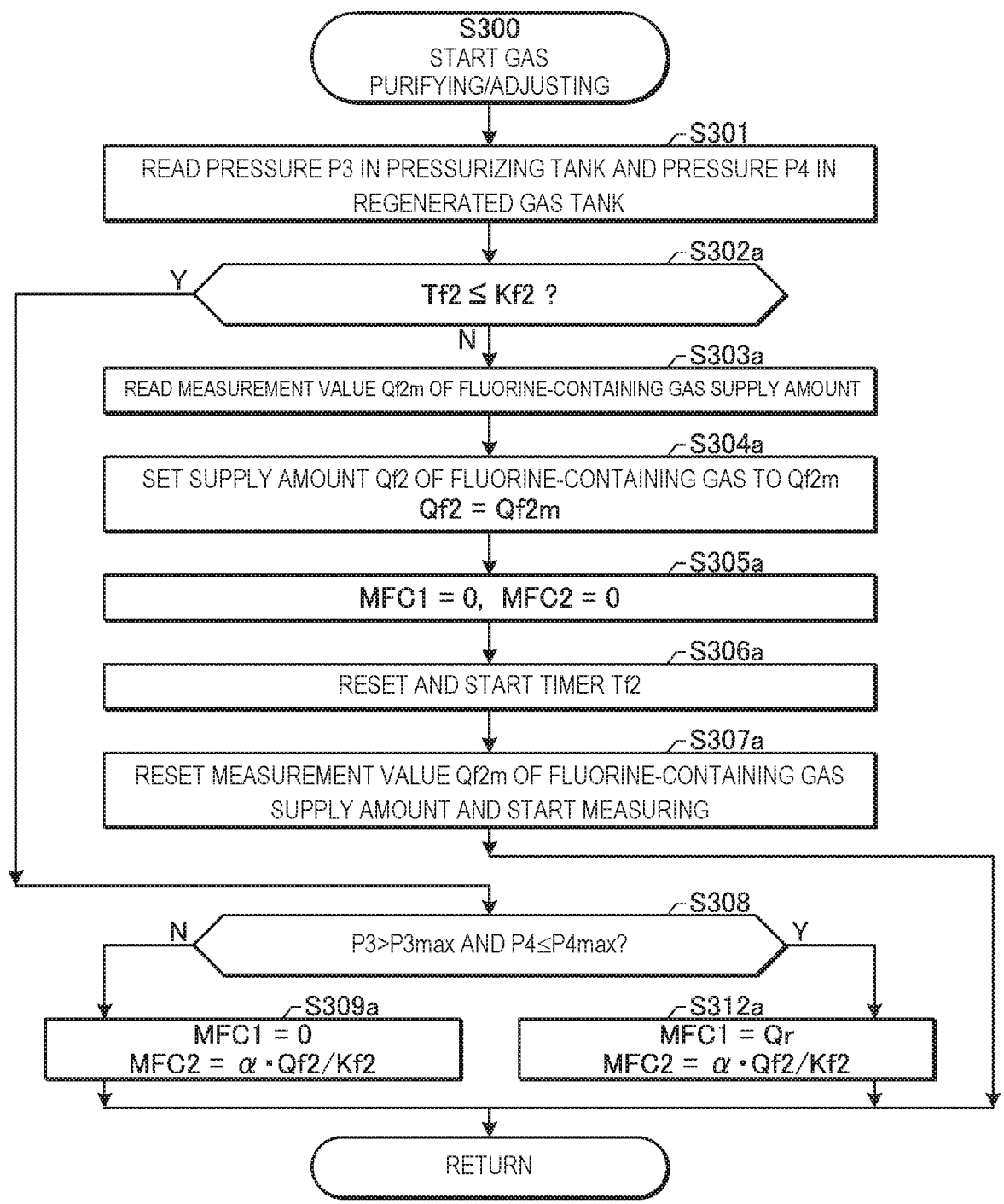
FIG. 17 is a flowchart of details of a gas purifying/adjusting subroutine in the first embodiment.

FIG. 16 is a flowchart of details of an initial setting subroutine of gas regeneration in the first embodiment. FIG. 17 is a flowchart of details of a gas purifying/adjusting subroutine in the first embodiment.

Instead of the initial setting subroutine of gas regeneration in the comparative example described with reference to FIG. 8 and the gas purifying/adjusting subroutine in the comparative example described with reference to FIG. 10, processes below are performed in the first embodiment. The main flow described with reference to FIG. 7 and other processes are the same as in the comparative example.

In FIG. 16, processes at S101 to S105 are the same as in the comparative example.

When receiving a gas regeneration command signal at S105, at S106a, the gas regeneration control unit 51 resets a timer Tf2 to 0 and starts counting the timer.

Then, at S107a, the gas regeneration control unit 51 resets a measurement value Qf2m of the fluorine-containing gas supply amount to 0, and starts measuring the fluorine-containing gas supply amount. A measurement value Qf2m of the fluorine-containing gas supply amount is updated when the fluorine-containing gas is supplied to the laser chamber 10.

Then, at S108a, the gas regeneration control unit 51 sets the supply amount Qf2 of the fluorine-containing gas to 0. In the processing described with reference to FIG. 17, the gas regeneration control unit 51 reads the measurement value Qf2m of the fluorine-containing gas supply amount every time the value of the timer Tf2 reaches a measurement period Kf2 of the fluorine-containing gas supply amount, and sets the measurement value Qf2m as the supply amount Qf2 of the fluorine-containing gas. The gas regeneration control unit 51 controls a flow rate of the massflow controller MFC2 in the xenon adding unit 75 based on the set supply amount Qf2 of the fluorine-containing gas until the next measurement period Kf2 comes. The measurement period Kf2 is, for example, 8 to 16 minutes.

After S108a, the gas regeneration control unit 51 finishes the processing in this flowchart.

In FIG. 17, a process at S301 is the same as in the comparative example.

After S301, at S302a, the gas regeneration control unit 51 determines whether or not the value of the timer Tf2 is equal to or shorter than the measurement period Kf2 of the fluorine-containing gas supply amount.

When the value of the timer Tf2 is longer than the measurement period Kf2 of the fluorine-containing gas supply amount (NO at S302a), the gas regeneration control unit 51 goes to S303a.

When the value of the timer Tf2 is equal to or shorter than the measurement period Kf2 of the fluorine-containing gas supply amount (YES at S302a), the gas regeneration control unit 51 goes to S308.

At S303a, the gas regeneration control unit 51 reads the measurement value Qf2m of the fluorine-containing gas supply amount from the massflow meter MFMf2.

Then, at S304a, the gas regeneration control unit 51 sets the supply amount Qf2 of the fluorine-containing gas to the read measurement value Qf2m.

Then, at S305a, the gas regeneration control unit 51 sets a flow rate MFC1 of the massflow controller MFC1 and a flow rate MFC2 of the massflow controller MFC2 to 0.

Then, at S306a, the gas regeneration control unit 51 resets the timer Tf2 to 0 and starts counting the timer.

Then, at S307a, the gas regeneration control unit 51 resets the measurement value Qf2m of the fluorine-containing gas supply amount to 0. Then, the gas regeneration control unit 51 starts measuring a fluorine-containing gas supply amount in the next measurement period Kf2. Thus, update of the measurement value Qf2m of the fluorine-containing gas supply amount is started, but data on the supply amount Qf2 of the fluorine-containing gas set at S304a is held until the next measurement period comes.

After S307a, the gas regeneration control unit 51 finishes the processing in this flowchart.

A process at S308 branching from S302a is the same as in the comparative example.

When pressure P3 is equal to or lower than a predetermined value P3max or pressure P4 is higher than a predetermined value P4max (NO at S308), the gas regeneration control unit 51 goes to S309a.

When the pressure P3 is higher than the predetermined value P3max and the pressure P4 is equal to or lower than the predetermined value P4max (YES at S308), the gas regeneration control unit 51 goes to S312a.

At S309a, the gas regeneration control unit 51 sets the flow rate MFC1 of the massflow controller MFC1 and the flow rate MFC2 of the massflow controller MFC2 as below.

$$MFC1 = 0$$

$$MFC2 = \alpha \cdot f2/Kf2$$

The flow rate MFC2 of the massflow controller MFC2 is obtained by dividing an addition amount α·Qf2 of the xenon-containing gas by the measurement period Kf2. Passing of the xenon-containing gas at the flow rate MFC2 for the measurement period Kf2 allows the xenon-containing gas in the addition amount α·Qf2 to be added to the inert regenerated gas.

At S312a, the gas regeneration control unit 51 sets the flow rate MFC1 of the massflow controller MFC1 and the flow rate MFC2 of the massflow controller MFC2 as below.

$$MFC1 = Qr$$

$$MFC2 = \alpha \cdot Qf2/Kf2$$

The flow rate Qr of the massflow controller MFC1 may be any positive number. A ratio between the flow rate Qr of the massflow controller MFC1 and the flow rate MFC2 of the massflow controller MFC2 does not need to be constant.

The flow rate MFC2 of the massflow controller MFC2 is the same as that set at S309a.

After S309a or S312a, the gas regeneration control unit 51 finishes the processing in this flowchart.

As shown in FIG. 7, when gas regeneration is not to be stopped, the gas regeneration control unit 51 repeats a gas purifying/adjusting subroutine. When repeating the gas purifying/adjusting subroutine, the gas regeneration control unit 51 determines YES at S302a until the next measurement period Kf2 comes, and repeats the processes at S308 and S309a or S312a. When the next measurement period Kf2 comes, a new supply amount Qf2 of the fluorine-containing gas is set by the processes at S303a to S307a.

2.3 Effect

According to the first embodiment, the addition amount of the xenon-containing gas to the inert regenerated gas is controlled based on the supply amount Qf2 of the fluorine-containing gas measured by the massflow meter MFMf2. This can adjust the xenon gas concentration in the laser chamber 10 to a desired range.

Figure 18:
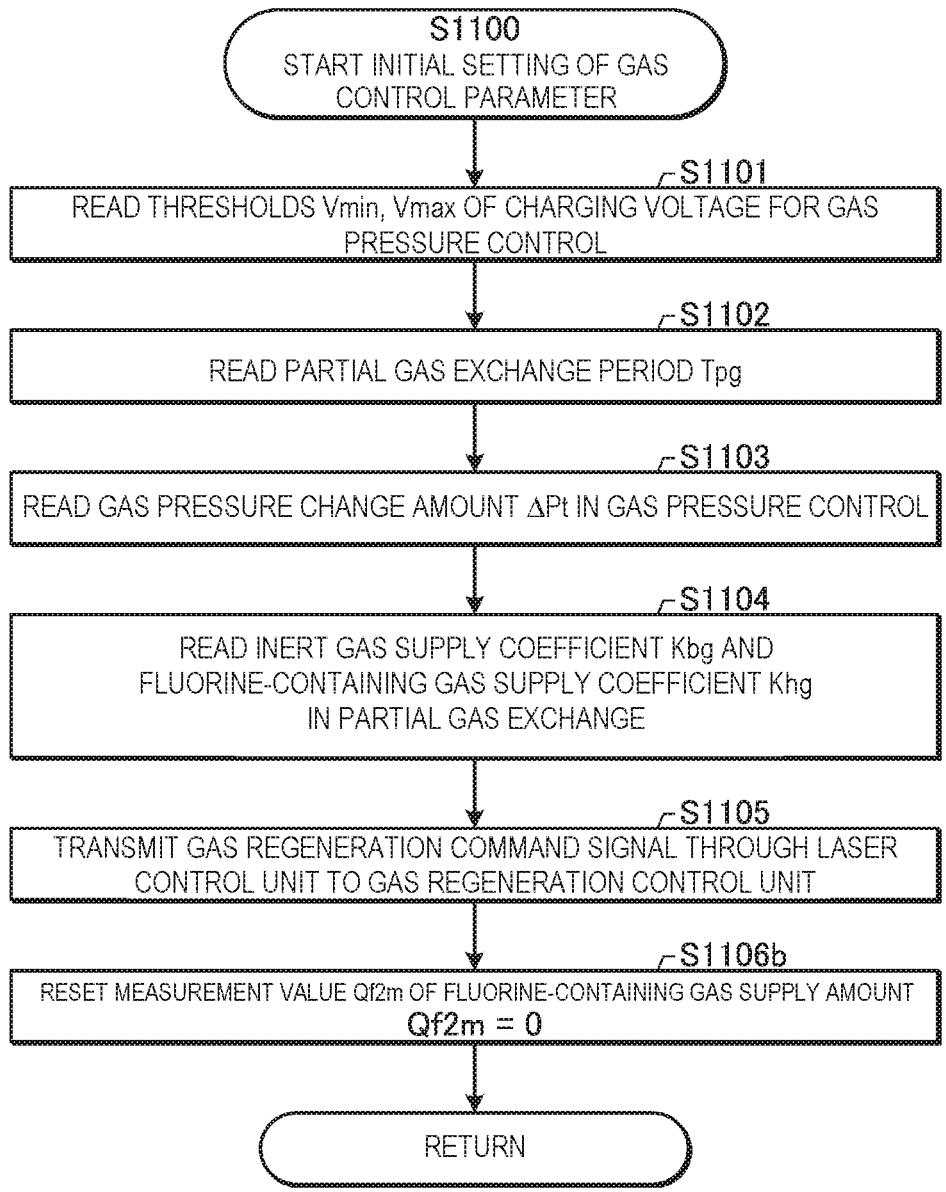
FIG. 18 is a flowchart of details of initial setting of a gas control parameter in a second embodiment.
Figure 19:
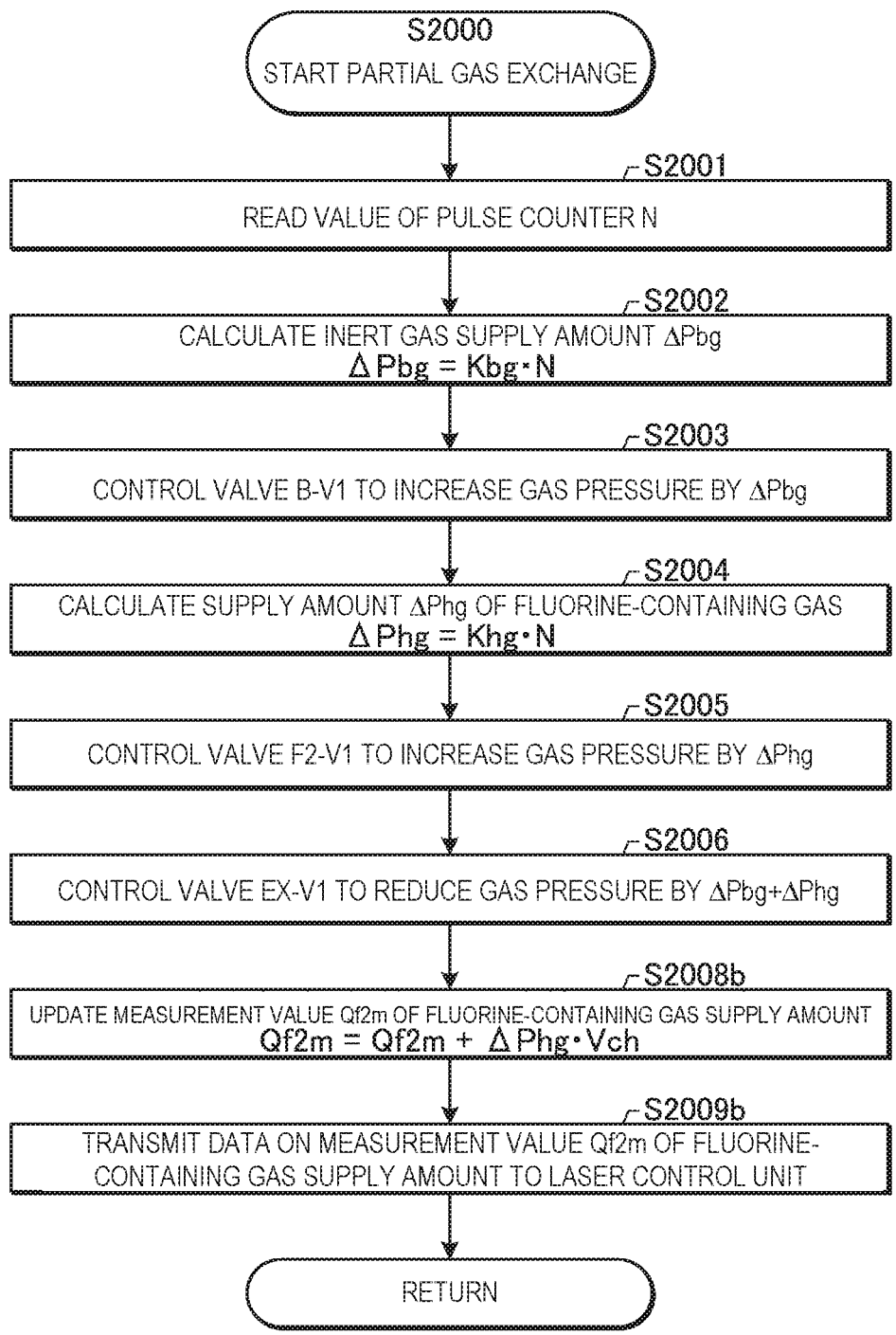
FIG. 19 is a flowchart of details of partial gas exchange processing in the second embodiment.

3. Laser Gas Regenerating Apparatus Configured to Receive Fluorine-Containing Gas Supply Amount from Excimer Laser Apparatus FIG. 18 is a flowchart of details of initial setting of a gas control parameter in a second embodiment. FIG. 19 is a flowchart of details of partial gas exchange processing in the second embodiment.

3.1 Configuration

A laser gas regenerating apparatus 50 according to the second embodiment does not need to include the massflow meter MFMf2 described with reference to FIG. 14. A configuration of the laser gas regenerating apparatus 50 according to the second embodiment may be the same as that of the comparative example described with reference to FIG. 1.

3.2 Processing of Gas Regeneration Control Unit

Processing of the gas regeneration control unit 51 in the second embodiment is the same as that in the first embodiment.

However, at S303a in FIG. 17, the gas regeneration control unit 51 in the second embodiment reads a measurement value Qf2m of a fluorine-containing gas supply amount received from the laser control unit 31. The gas regeneration control unit 51 sets a supply amount Qf2 of a fluorine-containing gas based on the measurement value Qf2m, and adds a xenon-containing gas to an inert regenerated gas.

At S107a in FIG. 16 and S307a in FIG. 17, the gas regeneration control unit 51 transmits a signal indicating that it has reset the measurement value Qf2m of the fluorine-containing gas supply amount through the laser control unit 31 to the gas control unit 47. The fluorine-containing gas supply amount is measured by the gas control unit 47 as described below.

3.3 Processing of Gas Control Unit

Instead of the initial setting of the gas control parameter in the comparative example described with reference to FIG. 4 and the partial gas exchange in the comparative example described with reference to FIG. 6, processes below are performed in the second embodiment. The main flow described with reference to FIG. 3 and other processes of the gas control unit 47 are the same as in the comparative example.

In FIG. 18, processes at S1101 to S1105 are the same as in the comparative example.

After S1105, at S1106b, the gas control unit 47 resets the measurement value Qf2m of the fluorine-containing gas supply amount to 0.

After S1106b, the gas control unit 47 finishes the processing in this flowchart.

In FIG. 19, processes at S2001 to S2006 are the same as in the comparative example.

After S2006, at S2008b, the gas control unit 47 calculates the measurement value Qf2m of the fluorine-containing gas supply amount by the equation below, and updates the measurement value Qf2m of the fluorine-containing gas supply amount.

$$Qf2m=Qf2m+\Delta Phg \cdot Vch$$

where Vch is a volume of the laser chamber 10, and $\Delta Phg$ is a supply amount of the fluorine-containing gas supplied to the laser chamber 10 at S2005. Data on the supply amount $\Delta Phg$ of the fluorine-containing gas is stored in a memory accessible by the gas control unit 47 and does not need to be separately measured.

Then, at S2009b, the gas control unit 47 transmits the data on the measurement value Qf2m of the fluorine-containing gas supply amount to the laser control unit 31. The gas regeneration control unit 51 receives the data on the measurement value Qf2m of the fluorine-containing gas supply amount from the laser control unit 31, and performs the processing in FIG. 17. A signal line connected between the laser control unit 31 and the gas regeneration control unit 51 corresponds to a data obtaining unit in the present disclosure.

3.4 Effect

According to the second embodiment, the addition amount of the xenon-containing gas to the inert regenerated gas is controlled based on the measurement value Qf2m of the fluorine-containing gas supply amount received from the laser control unit 31. This can adjust the xenon gas concentration in the laser chamber 10 to a desired range without directly measuring the fluorine-containing gas supply amount using a meter such as a massflow meter.

Alternatively, the massflow meter for determining the measurement value Qf2m of the fluorine-containing gas supply amount may be provided in the excimer laser apparatus 30, and the laser control unit 31 may transmit the measurement value Qf2m of the fluorine-containing gas supply amount to the gas regeneration control unit 51.

When the regulator 44 and the massflow meter MFMf2 are arranged outside the laser gas regenerating apparatus 50, the massflow meter MFMf2 may be arranged in the pipe between the regulator 44 and the laser gas regenerating apparatus 50. In this case, data measured by the massflow meter MFMf2 is transmitted to the gas regeneration control unit 51. A signal line connected between the massflow meter MFMf2 and the gas regeneration control unit 51 corresponds to a data obtaining unit in the present disclosure.

4. Laser Gas Regenerating Apparatus Configured to Add Xenon-Containing Gas Based on Gas Exhaust Amount

4.1 Configuration

Figure 20:
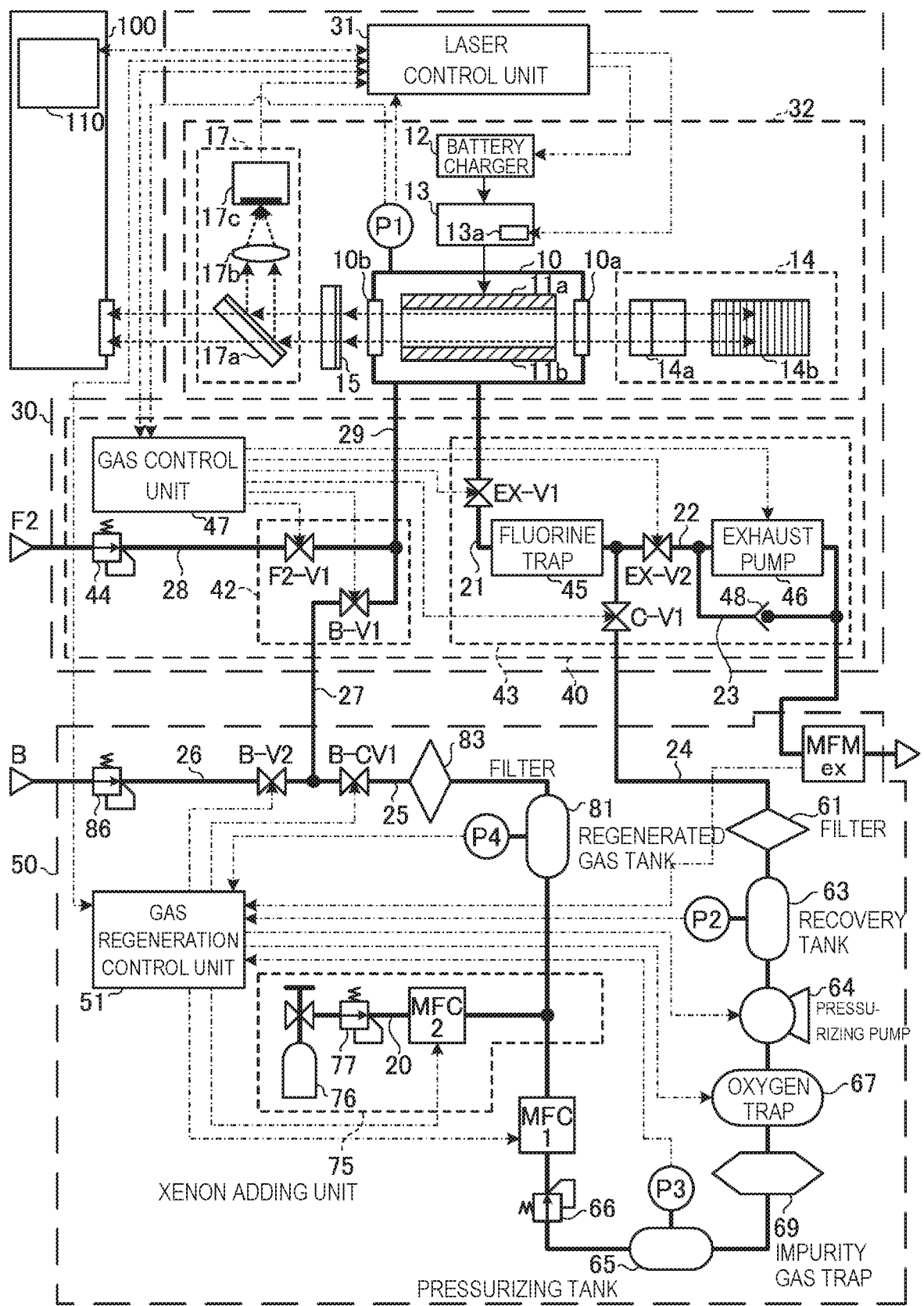
FIG. 20 schematically shows configurations of an excimer laser apparatus 30 and a laser gas regenerating apparatus 50 according to a third embodiment of the present disclosure.

FIG. 20 schematically shows configurations of an excimer laser apparatus 30 and a laser gas regenerating apparatus 50 according to a third embodiment of the present disclosure. In the third embodiment, the laser gas regenerating apparatus 50 includes part of the pipe 22 connected to the exhaust device 43. The laser gas regenerating apparatus 50 includes a massflow meter MFMex arranged in the pipe 22.

In the third embodiment, the xenon concentration meter 79 may be omitted.

Other than the above, a configuration of the third embodiment is the same as that of the comparative example.

4.2 Operation

Figure 21:
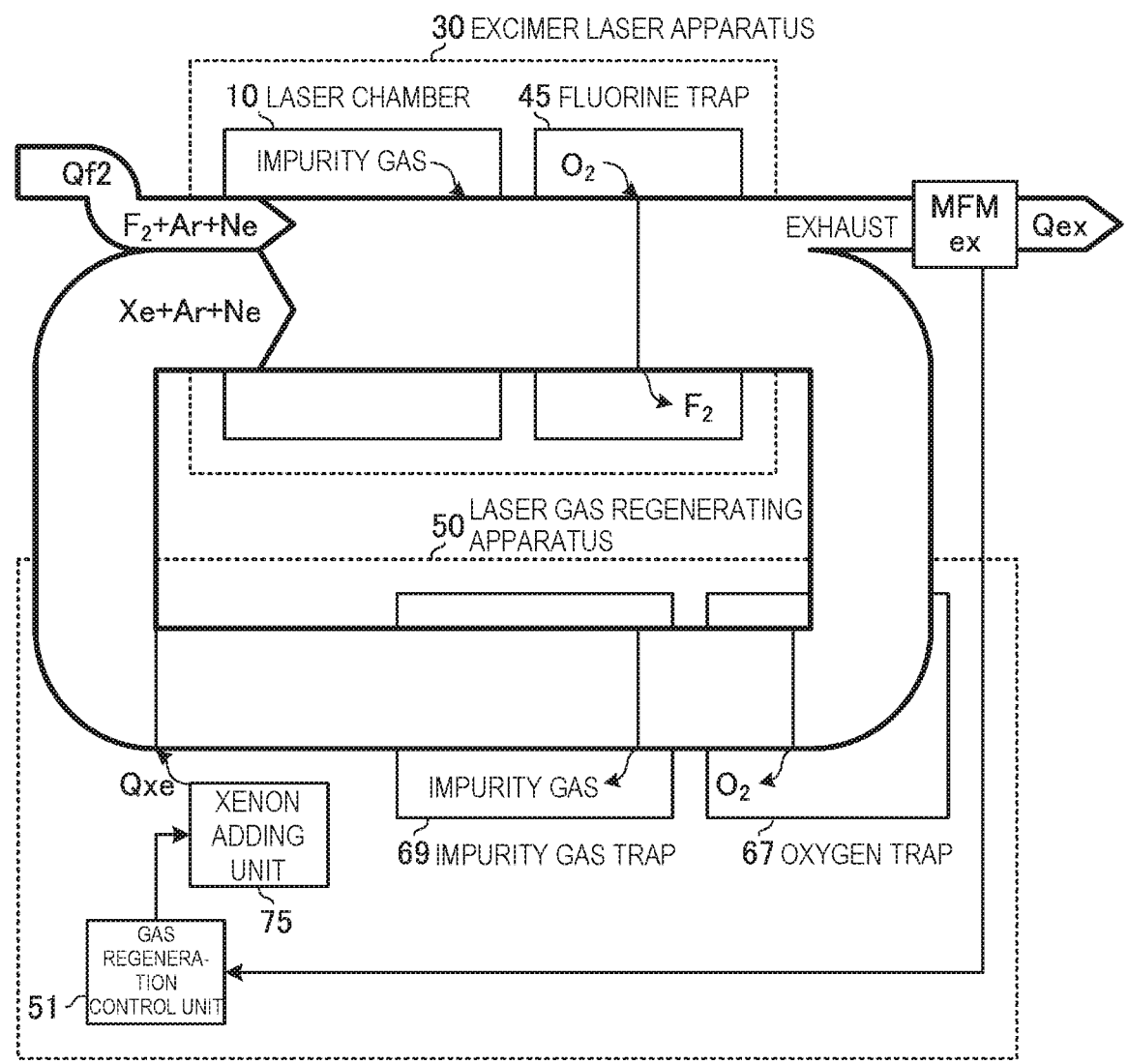
FIG. 21 is a flow diagram of a laser gas in the third embodiment.

FIG. 21 is a flow diagram of a laser gas in the third embodiment. The massflow meter MFMex measures an exhaust amount Qex of a laser gas exhausted from the exhaust device 43 through the valve EX-V2 to the outside of the apparatus. The gas regeneration control unit 51 reads data on the exhaust amount Qex of the laser gas. The gas regeneration control unit 51 calculates an addition amount Qxe of a xenon-containing gas to be added to an inert regenerated gas in proportion to the exhaust amount Qex of the laser gas. The gas regeneration control unit 51 controls the xenon adding unit 75 to add the xenon-containing gas in the addition amount Qxe to the inert regenerated gas. The addition amount Qxe of the xenon-containing gas is given by the equation below.

$$Qxe = \beta \cdot Qex \quad \text{(Equation 2)}$$

where β is a proportionality constant for calculating the addition amount Qxe of the xenon-containing gas.

4.2.1 Derivation of Proportionality Constant

The proportionality constant β is derived as described below.

An amount of xenon trapped by the impurity gas trap 69 or the like is substantially negligible. Specifically, it can be considered that a xenon gas concentration of the inert regenerated gas before added with xenon may be kept substantially equal to a xenon gas concentration of a laser gas when discharged from the laser chamber 10.

Also, in a steady state, an amount of the laser gas in the laser gas regenerating apparatus 50 is substantially constant. Specifically, it can be considered that a supply amount of the inert regenerated gas supplied from the laser gas regenerating apparatus 50 to the excimer laser apparatus 30 is substantially equal to the amount of the laser gas supplied from the excimer laser apparatus 30 to the laser gas regenerating apparatus 50.

First, variables are set as described below.

Qxe: the addition amount of the xenon-containing gas to be added to the inert regenerated gas to obtain a target xenon gas concentration Cxect Qf2: a supply amount of a fluorine-containing gas supplied from the fluorine-containing gas supply source F2 to the laser chamber 10

Cf2: a fluorine gas concentration of the fluorine-containing gas supplied from the fluorine-containing gas supply source F2

The fluorine trap 45 using calcium oxide produces ½ mole oxygen gas relative to 1 mole fluorine gas by a chemical reaction below.

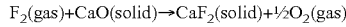

An amount of the fluorine gas contained in the laser gas discharged from the laser chamber 10 toward the fluorine trap 45 is given by Qf2·Cf2, and the fluorine gas is removed without passing through the fluorine trap 45. Oxygen gas in an amount given by ½·Qf2·Cf2 is added to the laser gas having passed through the fluorine trap 45.

Then, the exhaust amount Qex of the laser gas can be expressed by the equation below.

$$Qex = Qf2 - Qf2 \cdot Cf2 + \tfrac{1}{2} \cdot Qf2 \cdot Cf2 = Qf2(1 - \tfrac{1}{2} \cdot Cf2)$$

Thus, the supply amount Qf2 of the fluorine-containing gas can be expressed by the equation below.

$$Qf2 = Qex/(1 - \tfrac{1}{2} \cdot Cf2)$$

From this equation and Equation 1, the addition amount Qxe of the xenon gas is given by the equation below.

$$Qxe = \{\alpha/(1 - \tfrac{1}{2} \cdot Cf2)\} Qex$$

With β being $a/(1-\tfrac{1}{2} \cdot Cf2)$, Equation 2 is obtained.

4.2.2 Processing of Gas Regeneration Control Unit

Figure 22:
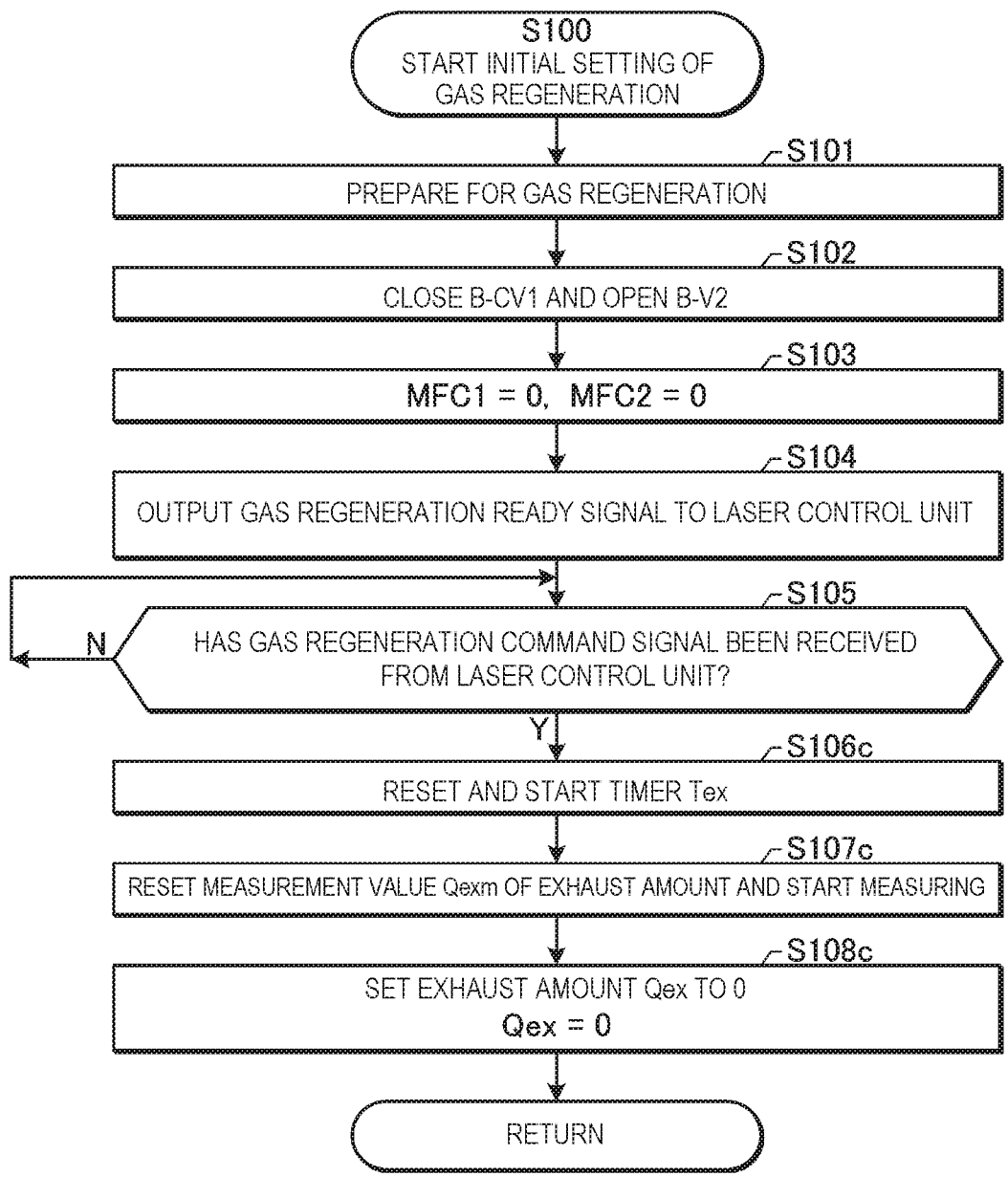
FIG. 22 is a flowchart of details of an initial setting subroutine of gas regeneration in the third embodiment.
Figure 23:
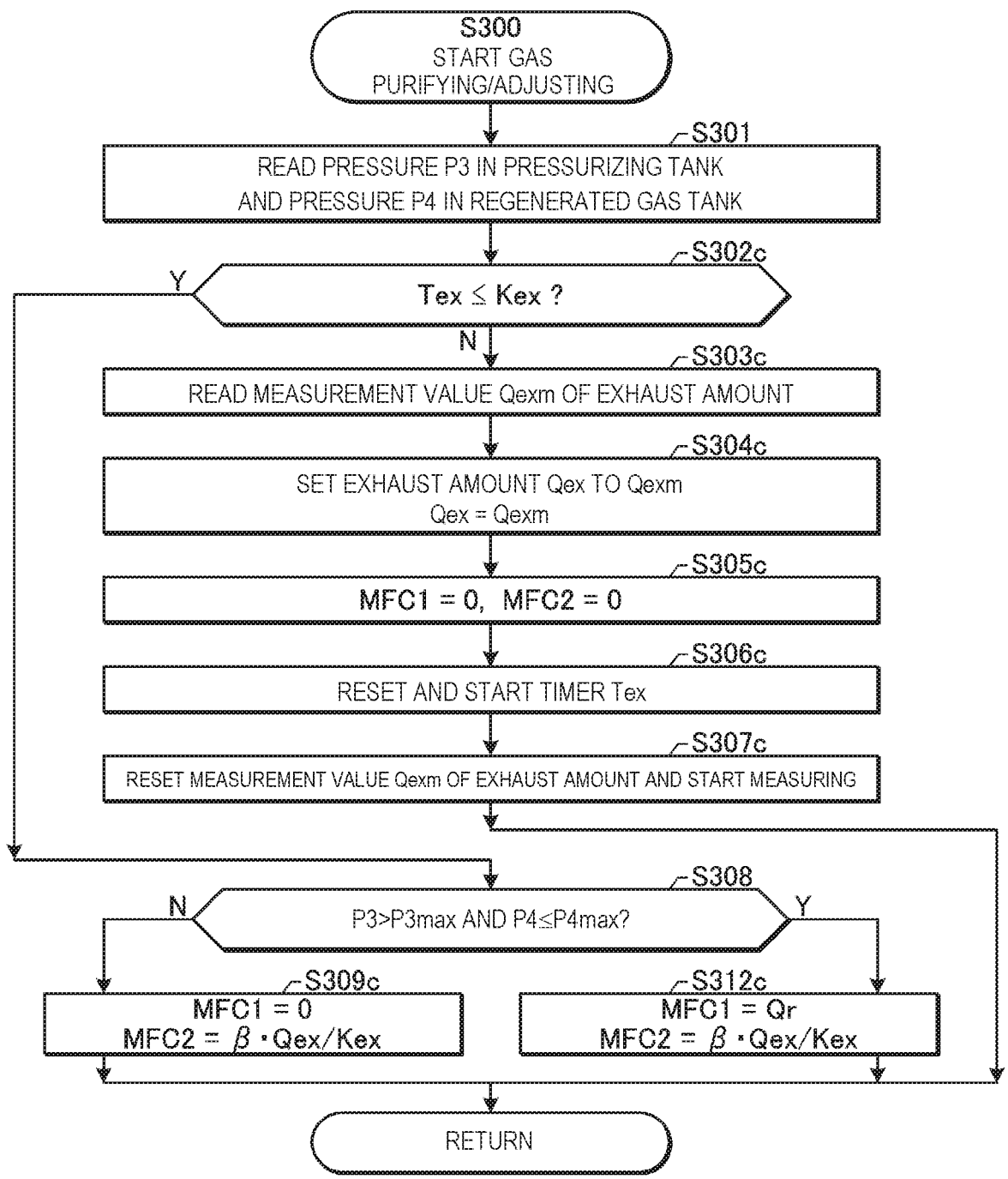
FIG. 23 is a flowchart of details of a gas purifying/adjusting subroutine in the third embodiment.

FIG. 22 is a flowchart of details of an initial setting subroutine of gas regeneration in the third embodiment. FIG. 23 is a flowchart of details of a gas purifying/adjusting subroutine in the third embodiment.

Instead of the initial setting subroutine of gas regeneration in the comparative example described with reference to FIG. 8 and the gas purifying/adjusting subroutine in the comparative example described with reference to FIG. 10, processes below are performed in the third embodiment. The main flow described with reference to FIG. 7 and other processes are the same as in the comparative example.

In FIG. 22, processes at S101 to S105 are the same as in the comparative example.

When the gas regeneration control unit 51 receives a gas regeneration command signal at S105, processes at S106c to S108c are similar to those at S106a to S108a in the first embodiment. Differences from the first embodiment are as below.

(1) Instead of the timer Tf2, a timer Tex for measuring a measurement period Kex of an exhaust amount is used.

(2) Instead of the measurement value Qf2m of the fluorine-containing gas supply amount, a measurement value Qexm of an exhaust amount is used.

(3) Instead of the supply amount Qf2 of the fluorine-containing gas, an exhaust amount Qex is used.

After S108c, the gas regeneration control unit 51 finishes the processing in this flowchart.

In FIG. 23, processes at S301 and S308 are the same as in the comparative example.

After S301, processes at S302c to S307c, S309c, and S312c are similar to those at S302a to S307a, S309a, and S312a in the first embodiment. Differences from the first embodiment are as below.

Differences (1) to (3) are the same as those described with reference to FIG. 22.

(4) Instead of the proportionality constant α, a proportionality constant β is used.

(5) Instead of the measurement period Kf2 of the fluorine-containing gas supply amount, a measurement period Kex of an exhaust amount is used. The measurement period Kex is, for example, 8 to 16 minutes.

After S309c or S312c, the gas regeneration control unit 51 finishes the processing in this flowchart.

4.3 Effect

According to the third embodiment, the addition amount of the xenon-containing gas to the inert regenerated gas is controlled based on the exhaust amount Qex of the laser gas. This can adjust the xenon gas concentration in the laser chamber 10 to a desired range.

Figure 24:
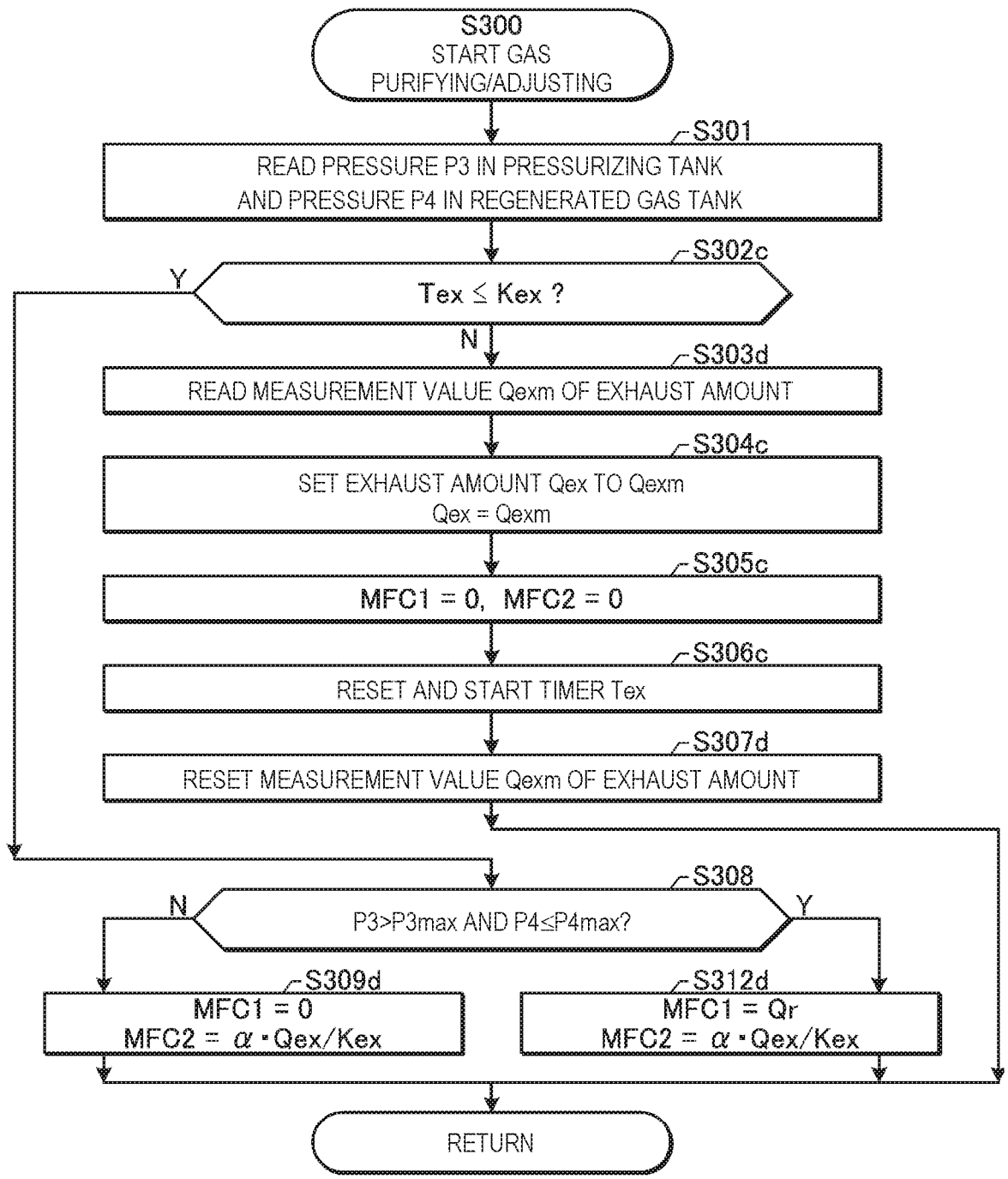
FIG. 24 is a flowchart of details of a gas purifying/adjusting subroutine in a fourth embodiment.

5. Laser Gas Regenerating Apparatus Configured to Receive Exhaust Amount from Excimer Laser Apparatus FIG. 24 is a flowchart of details of a gas purifying/adjusting subroutine in a fourth embodiment.

Figure 25:
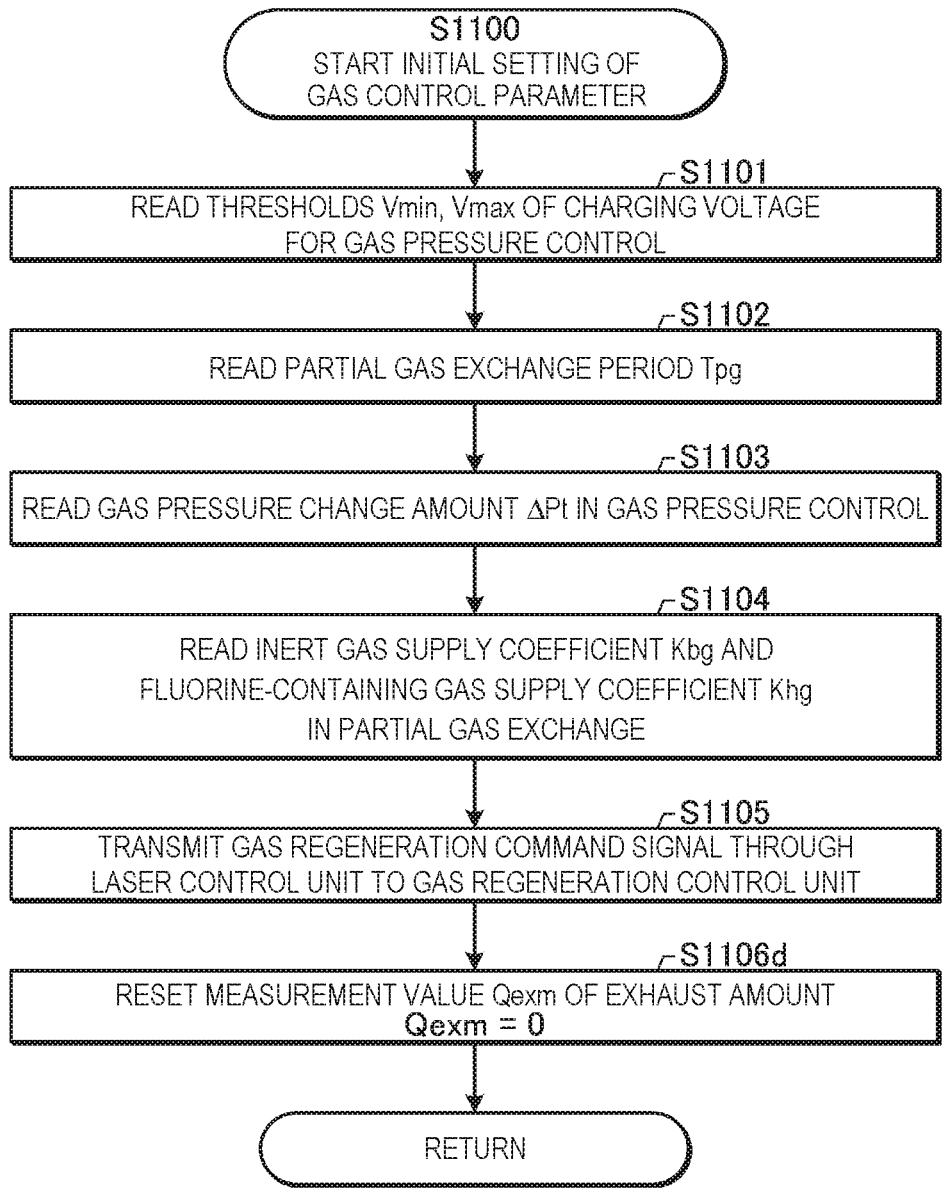
FIG. 25 is a flowchart of details of initial setting of a gas control parameter in the fourth embodiment.
Figure 26:
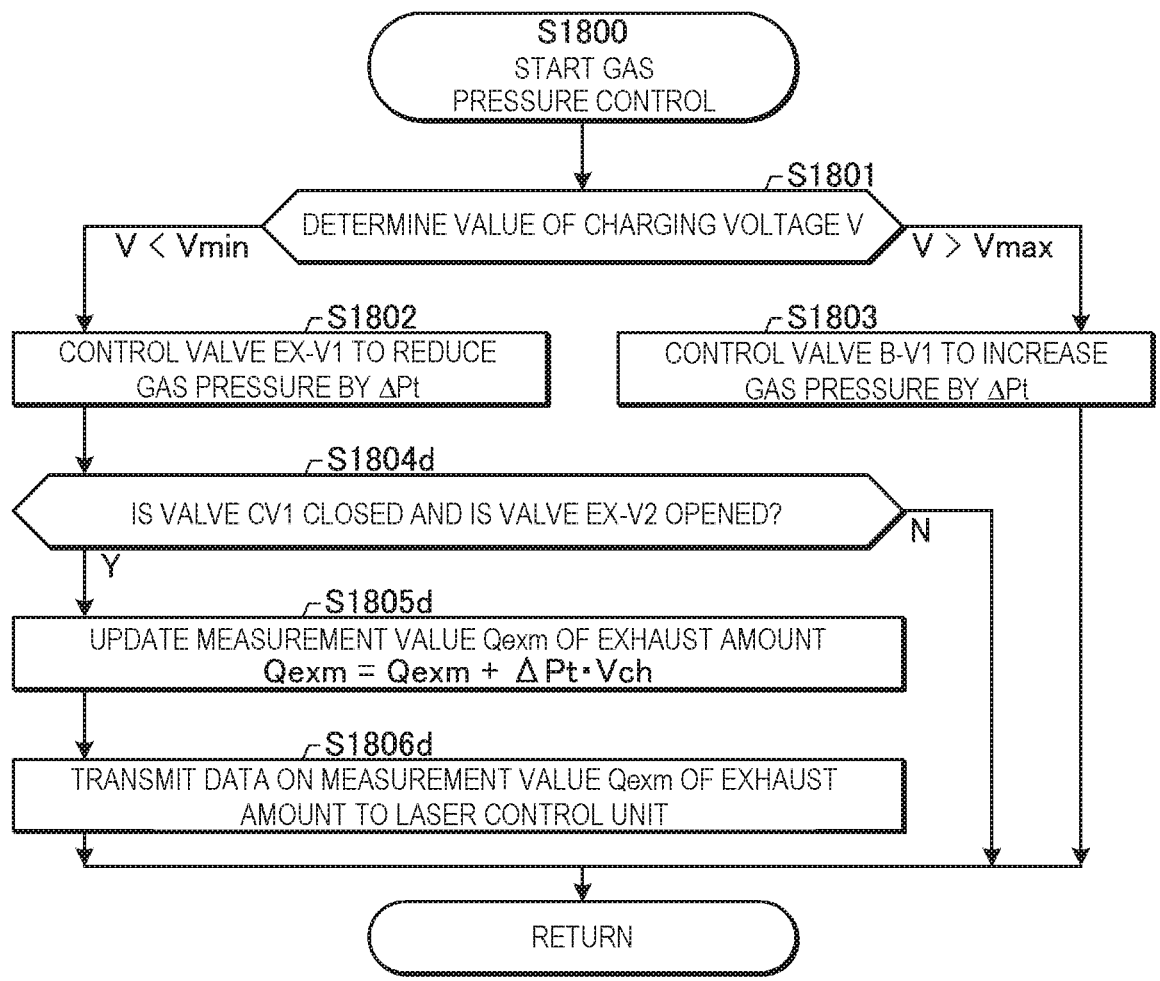
FIG. 26 is a flowchart of details of gas pressure control processing in the fourth embodiment.
Figure 27:
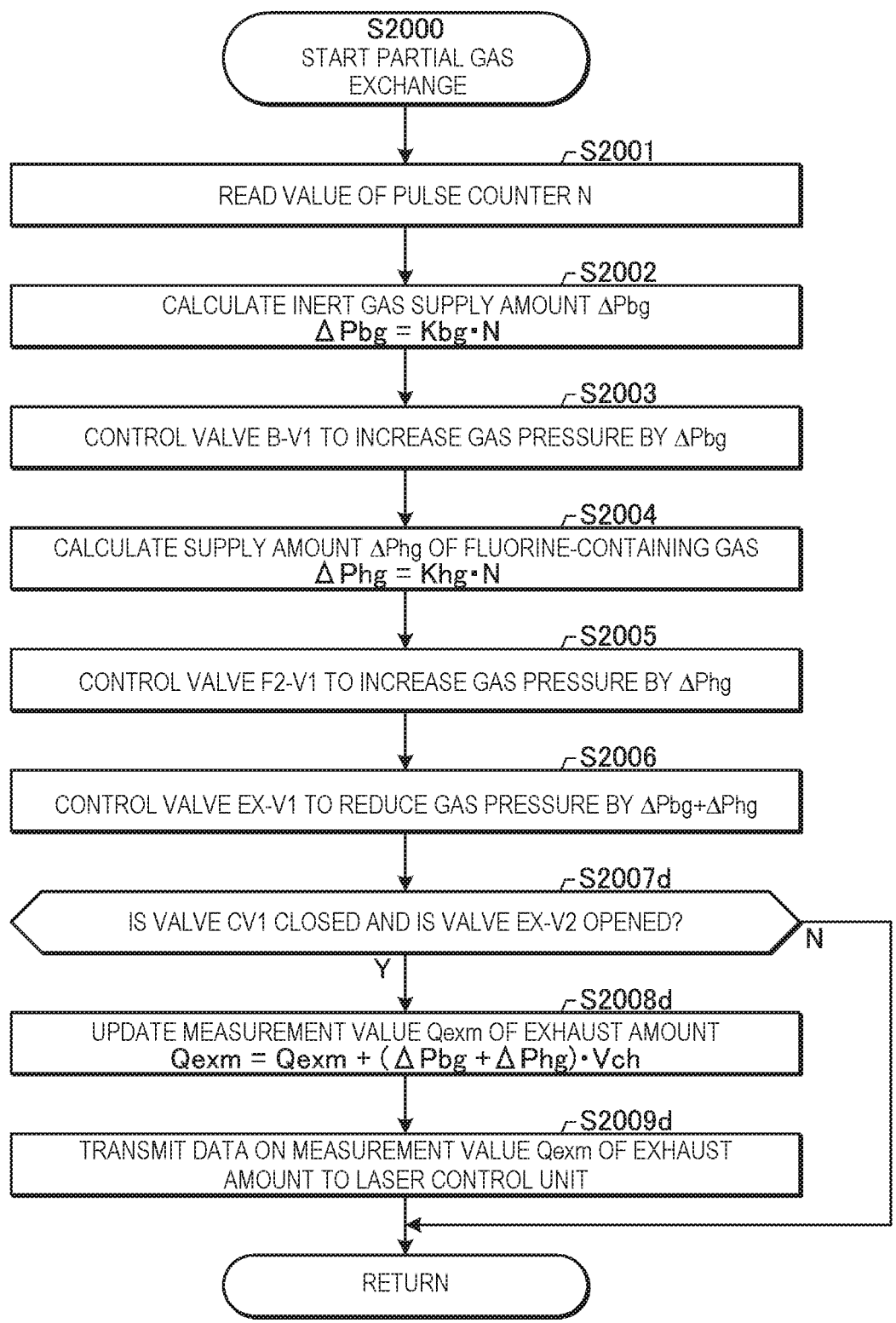
FIG. 27 is a flowchart of details of partial gas exchange processing in the fourth embodiment.

FIG. 25 is a flowchart of details of initial setting of a gas control parameter in the fourth embodiment. FIG. 26 is a flowchart of details of gas pressure control processing in the fourth embodiment. FIG. 27 is a flowchart of details of partial gas exchange processing in the fourth embodiment.

5.1 Configuration

A laser gas regenerating apparatus 50 according to the fourth embodiment does not need to include the massflow meter MFMex described with reference to FIG. 20. A configuration of the laser gas regenerating apparatus 50 according to the fourth embodiment may be the same as in the comparative example described with reference to FIG. 1.

5.2 Processing of Gas Regeneration Control Unit

Instead of the gas purifying/adjusting subroutine in the third embodiment described with reference to FIG. 23, processes below are performed in the fourth embodiment. Other processes are the same as in the third embodiment.

In FIG. 24, processes at S301, S302c, S304c to S306c, and S308 are the same as in the third embodiment.

After S302c, at S303d, the gas regeneration control unit 51 reads a measurement value Qexm of an exhaust amount received from the laser control unit 31. The gas regeneration control unit 51 sets an exhaust amount Qex based on the measurement value Qexm, and adds a xenon-containing gas to an inert regenerated gas.

After S306c, at S307d, the gas regeneration control unit 51 transmits a signal indicating that it has reset the measurement value Qexm of the exhaust amount through the laser control unit 31 to the gas control unit 47. The exhaust amount is measured by the gas control unit 47 as described below.

After S308, at S309d, the gas regeneration control unit 51 sets the flow rate MFC1 of the massflow controller MFC1 and the flow rate MFC2 of the massflow controller MFC2 as below.

MFC1=0

MFC2=α•Qex/Kex

Specifically, in the third embodiment, the proportionality constant β is used to calculate the flow rate MFC2 of the massflow controller MFC2, while in the fourth embodiment, the proportionality constant α is used. This is because data on the exhaust amount Qex used by the gas control unit 47 is an exhaust amount before passage through the fluorine trap 45 and Qf2 and Qex are substantially equal in a steady state.

At S312d, the gas regeneration control unit 51 sets the flow rate MFC1 of the massflow controller MFC1 and the flow rate MFC2 of the massflow controller MFC2 as below.

MFC1=Qr

MFC2=α•Qex/Kex

After S309d or S312d, the gas regeneration control unit 51 finishes the processing in this flowchart.

5.3 Processing of Gas Control Unit

Instead of the initial setting of the gas control parameter in the comparative example described with reference to FIG. 4, the gas pressure control in the comparative example described with reference to FIG. 5, and the partial gas exchange in the comparative example described with reference to FIG. 6, processes below are performed in the fourth embodiment. The main flow described with reference to FIG. 3 and other processes of the gas control unit are the same as in the comparative example.

In FIG. 25, processes at S1101 to S1105 are the same as in the comparative example and the third embodiment.

After S1105, at S1106d, the gas control unit 47 resets the measurement value Qexm of the exhaust amount to 0.

After S1106d, the gas control unit 47 finishes the processing in this flowchart.

In FIG. 26, processes at S1801, S1802, and S1803 are the same as in the comparative example and the third embodiment. The fourth embodiment is different from the comparative example and the third embodiment in that gas pressure is reduced at S1802 and then the measurement value Qexm of the exhaust amount is updated.

After S1802, at S1804d, the gas control unit 47 determines whether or not the valve CV1 is closed and the valve EX-V2 is opened.

When the valve C-V1 is opened or the valve EX-V2 is closed (NO at S1804d), it is considered that the laser gas is not exhausted outside the apparatus but is supplied to the laser gas regenerating apparatus 50. Thus, the gas control unit 47 finishes the processing in this flowchart.

When the valve C-V1 is closed and the valve EX-V2 is opened (YES at S1804d), the gas control unit 47 goes to S1805d.

At S1805d, the gas control unit 47 calculates the measurement value Qexm of the exhaust amount by the equation below, and updates the measurement value Qexm of the exhaust amount.

$$Qexm=Qexm+\Delta Pt \cdot Vch$$

where Vch is a volume of the laser chamber 10, and ΔPt is a gas pressure change amount in gas pressure control corresponding to the exhaust amount of the laser gas exhausted from the laser chamber 10 at S1802. Data on the gas pressure change amount ΔPt is stored in a memory accessible by the gas control unit 47 and does not need to be separately measured.

Then, at S1806d, the gas control unit 47 transmits data on the measurement value Qexm of the exhaust amount to the laser control unit 31. The data on the measurement value Qexm of the exhaust amount is transmitted from the laser control unit 31 to the gas regeneration control unit 51 and used in the processing in FIG. 24.

In FIG. 27, processes at S2001 to S2006 are the same as in the comparative example and the third embodiment.

After S2006, at S2007d, the gas control unit 47 determines whether or not the valve C-V1 is closed and the valve EX-V2 is opened.

When the valve C-V1 is opened or the valve EX-V2 is closed (NO at S2007d), it is considered that the laser gas is not exhausted outside the apparatus but is supplied to the laser gas regenerating apparatus 50. Thus, the gas control unit 47 finishes the processing in this flowchart.

When the valve C-V1 is closed and the valve EX-V2 is opened (YES at S2007d), the gas control unit 47 goes to S2008d.

At S2008d, the gas control unit 47 calculates the measurement value Qexm of the exhaust amount by the equation below, and updates the measurement value Qexm of the exhaust amount.

$$Qexm=Qexm+(\Delta Pbg+\Delta Phg) \cdot Vch$$

where Vch is a volume of the laser chamber 10, and ΔPbg+ΔPhg is a gas pressure change amount corresponding to the exhaust amount of the laser gas exhausted from the laser chamber 10 at S2006. Data on ΔPbg and ΔPhg are stored in a memory accessible by the gas control unit 47 and does not need to be separately measured.

Then, at S2009d, the gas control unit 47 transmits the data on the measurement value Qexm of the exhaust amount to the laser control unit 31. The data on the measurement value Qexm of the exhaust amount is transmitted from the laser control unit 31 to the gas regeneration control unit 51 and used in the processing in FIG. 24.

5.4 Effect

According to the fourth embodiment, the addition amount of the xenon-containing gas to the inert regenerated gas is controlled based on the measurement value Qexm of the exhaust amount received from the laser control unit 31. This can adjust the xenon gas concentration in the laser chamber 10 to a desired range without directly measuring the exhaust amount of the laser gas using a meter such as a massflow meter.

Alternatively, the massflow meter for determining the measurement value Qexm of the exhaust amount of the laser gas may be provided in the excimer laser apparatus 30, or outside and between the excimer laser apparatus 30 and the laser gas regenerating apparatus 50, and the laser control unit 31 may transmit the measurement value Qexm of the exhaust amount of the laser gas to the gas regeneration control unit 51. A signal line connected between the laser control unit 31 and the gas regeneration control unit 51 corresponds to a data obtaining unit in the present disclosure.

6. Laser Gas Regenerating Apparatus Connected to a Plurality of Laser Apparatuses (First Example)

6.1 Configuration

Figure 28:
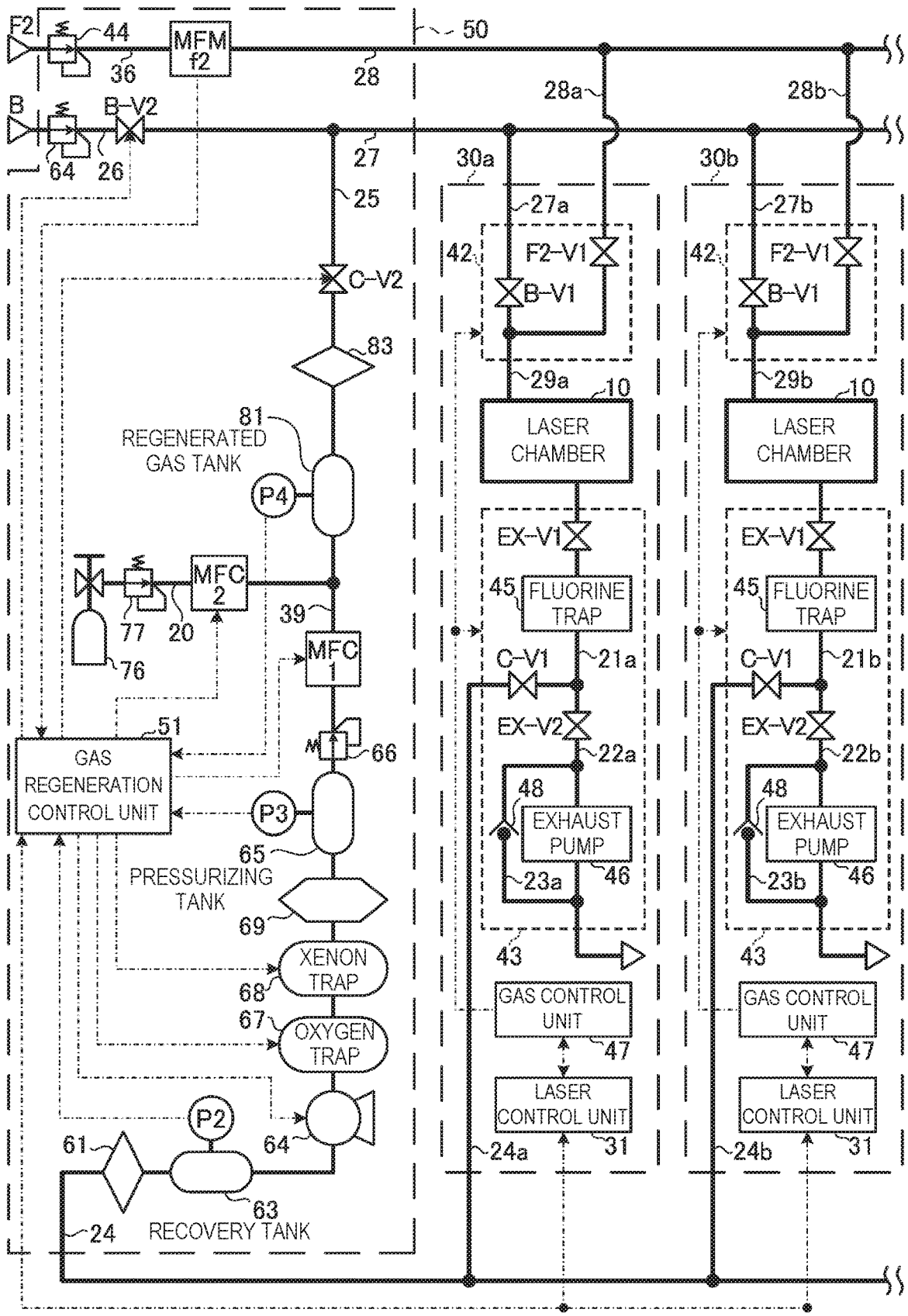
FIG. 28 schematically shows configurations of excimer laser apparatuses 30a, 30b and a laser gas regenerating apparatus 50 according to a fifth embodiment of the present disclosure.

FIG. 28 schematically shows configurations of excimer laser apparatuses 30a, 30b and a laser gas regenerating apparatus 50 according to a fifth embodiment of the present disclosure. In the fifth embodiment, the laser gas regenerating apparatus 50 is connected to a plurality of laser chambers 10 in the plurality of excimer laser apparatuses 30a, 30b. The laser gas regenerating apparatus 50 includes the massflow meter MFMf2 as in the first embodiment.

The fifth embodiment corresponds to a case where the laser gas regenerating apparatus 50 according to the first embodiment is connected to the plurality of laser chambers 10.

A pipe 24 in the laser gas regenerating apparatus 50 branches into a plurality of pipes 24a, 24b corresponding to the excimer laser apparatuses 30a, 30b upstream of the filter 61. A valve C-V1 is arranged in each of the pipes 24a, 24b. Whether or not a discharged gas is introduced from an exhaust device 43 included in each of the excimer laser apparatuses 30a, 30b to the laser gas regenerating apparatus 50 is controlled by opening and closing of the valve C-V1.

A pipe 27 for supplying an inert gas to the excimer laser apparatuses branches into a plurality of pipes 27a, 27b corresponding to the excimer laser apparatuses 30a, 30b. A valve B-V1 is arranged in each of the pipes 27a, 27b. Whether or not an inert gas is supplied to a gas supply device 42 included in each of the excimer laser apparatuses 30a, 30b is controlled by opening and closing of the valve B-V1.

A pipe 28 for supplying a fluorine-containing gas to the excimer laser apparatuses branches into a plurality of pipes 28a, 28b corresponding to the excimer laser apparatuses. A valve F2-V1 is arranged in each of the pipes 28a, 28b. Whether or not a fluorine-containing gas is supplied to the gas supply device 42 included in each of the excimer laser apparatuses 30a, 30b is controlled by opening and closing of the valve F2-V1.

A gas regeneration control unit 51 is connected to a laser control unit 31 included in each of the excimer laser apparatuses 30a, 30b by a signal line.

Other than the above, a configuration of the fifth embodiment is the same as that of the first embodiment.

6.2 Operation

Operation of each of the excimer laser apparatuses 30a, 30b is the same as that of the excimer laser apparatus 30 in the first embodiment.

The laser gas regenerating apparatus 50 reduces impurities in a discharged gas discharged from each of the excimer laser apparatuses 30a, 30b, adds a xenon-containing gas to an inert regenerated gas with reduced impurities, and supplies the inert regenerated gas added with the xenon-containing gas to each of the excimer laser apparatuses 30a, 30b. Other than the above, operation of the laser gas regenerating apparatus 50 is the same as that of the laser gas regenerating apparatus 50 in the first embodiment.

The laser gas regenerating apparatus 50 may receive the discharged gases discharged from the excimer laser apparatuses 30a, 30b simultaneously or at different timings. The laser gas regenerating apparatus 50 may supply the inert regenerated gas to the excimer laser apparatuses 30a, 30b simultaneously or at different timings.

When the laser gas regenerating apparatus 50 supplies an inert new gas to one excimer laser apparatus 30a and supplies an inert regenerated gas to the other excimer laser apparatus 30b, the laser gas regenerating apparatus 50 may supply the gases at different timings, not simultaneously.

6.3 Effect

According to the fifth embodiment, the discharged gases discharged from the excimer laser apparatuses 30a, 30b are purified by the laser gas regenerating apparatus 50, and the inert regenerated gas is supplied to the excimer laser apparatuses 30a, 30b. This reduces consumption of the inert gas and running cost. The inert regenerated gas can be supplied to the excimer laser apparatuses, thereby stabilizing laser performance of the excimer laser apparatuses. One laser gas regenerating apparatus 50 is provided for the plurality of excimer laser apparatuses, thereby reducing footprint and installation cost.

According to the fifth embodiment, the addition amount of the xenon-containing gas to the inert regenerated gas is controlled based on the supply amount Qf2 of the fluorine-containing gas measured by the massflow meter MFMf2. This can adjust the xenon gas concentration in the laser chamber 10 to a desired range.

The supply amount Qf2 of the fluorine-containing gas is not limited to that measured by the massflow meter MFMf2, but may be the sum of fluorine-containing gas supply amounts received from the excimer laser apparatuses. In this case, the massflow meter MFMf2 may be omitted.

Also, not limited to the case where the massflow meter MFMf2 is arranged in the pipe 28, a massflow meter may be arranged in each of the pipes 28a, 28b. In this case, the supply amount Qf2 of the fluorine-containing gas may be the sum of fluorine-containing gas supply amounts received from the plurality of massflow meters.

7. Laser Gas Regenerating Apparatus Connected to a Plurality of Laser Apparatuses (Second Example)

7.1 Configuration and Operation

Figure 29:
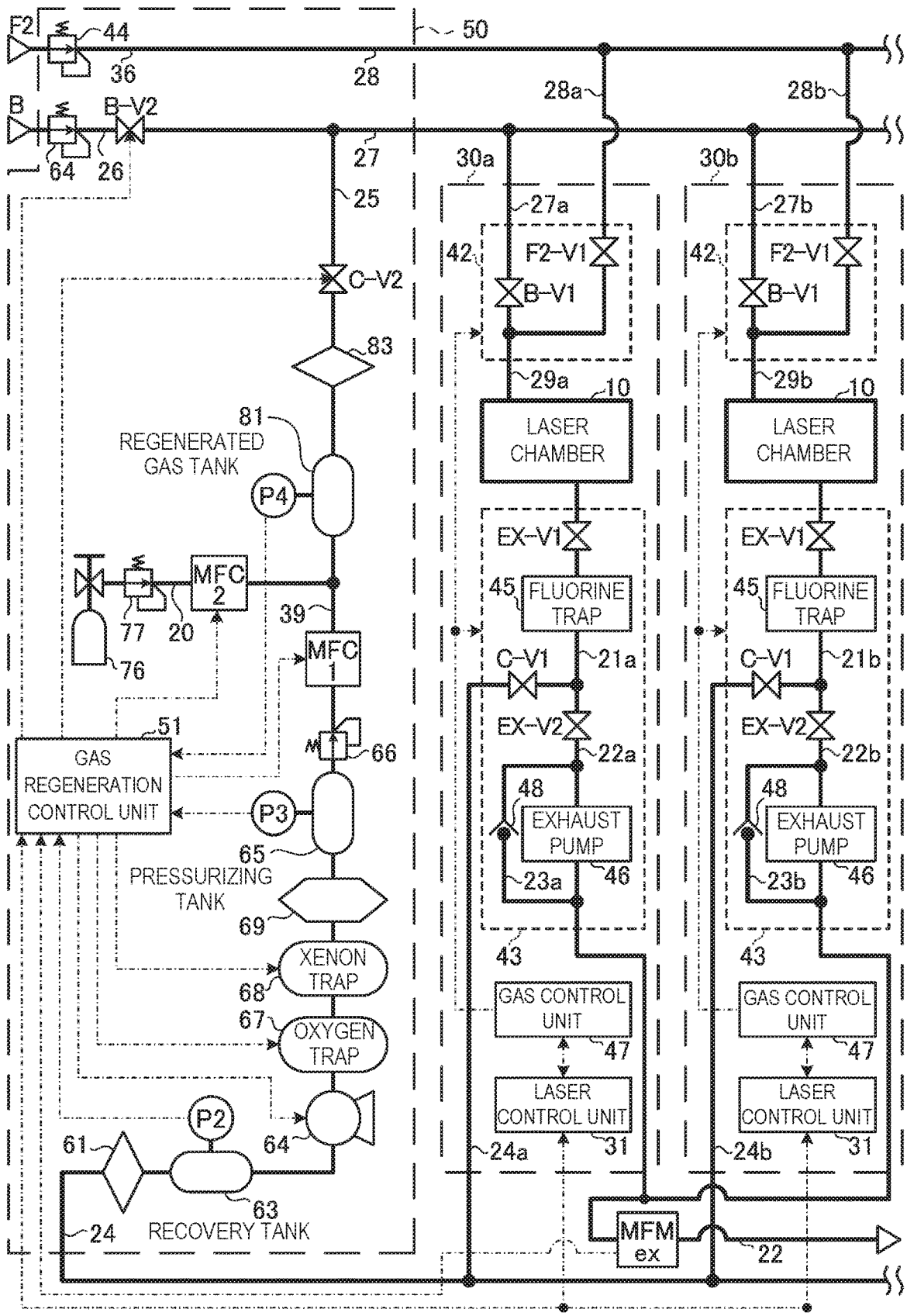
FIG. 29 schematically shows configurations of excimer laser apparatuses 30a, 30b and a laser gas regenerating apparatus 50 according to a sixth embodiment of the present disclosure.

FIG. 29 schematically shows configurations of excimer laser apparatuses 30a, 30b and a laser gas regenerating apparatus 50 according to a sixth embodiment of the present disclosure. In the sixth embodiment, the laser gas regenerating apparatus 50 is connected to a plurality of laser chambers 10 in the plurality of excimer laser apparatuses 30a, 30b. The laser gas regenerating apparatus 50 includes a massflow meter MFMex as in the third embodiment.

The sixth embodiment corresponds to a case where the laser gas regenerating apparatus 50 according to the third embodiment is connected to the plurality of laser chambers 10.

Pipes 22a, 22b connected to exhaust devices 43 included in each of the excimer laser apparatuses 30a, 30b merge into a pipe 22. The massflow meter MFMex is arranged in the pipe 22.

Other than the above, a configuration of the sixth embodiment is the same as that of the fifth embodiment.

The massflow meter MFMex may be included in the laser gas regenerating apparatus 50, and may not be included in the excimer laser apparatuses and the laser gas regenerating apparatus.

7.2 Effect

According to the sixth embodiment, the addition amount of the xenon-containing gas to the inert regenerated gas is controlled based on the exhaust amount Qex of the laser gas measured by the massflow meter MFMex. This can adjust the xenon gas concentration in the laser chamber 10 to a desired range.

The exhaust amount Qex of the laser gas is not limited to that measured by the massflow meter MFMex, but may be the sum of laser gas exhaust amounts received from the excimer laser apparatuses. In this case, the massflow meter MFMex may be omitted.

Also, not limited to the case where the massflow meter MFMex is arranged in the pipe 22, a massflow meter may be arranged in each of the pipes 22a, 22b. In this case, the exhaust amount Qex of the laser gas may be the sum of exhaust amounts received from the plurality of massflow meters.

8. Arrangement of Xenon Adding Unit

8.1 Configuration

Figure 30:
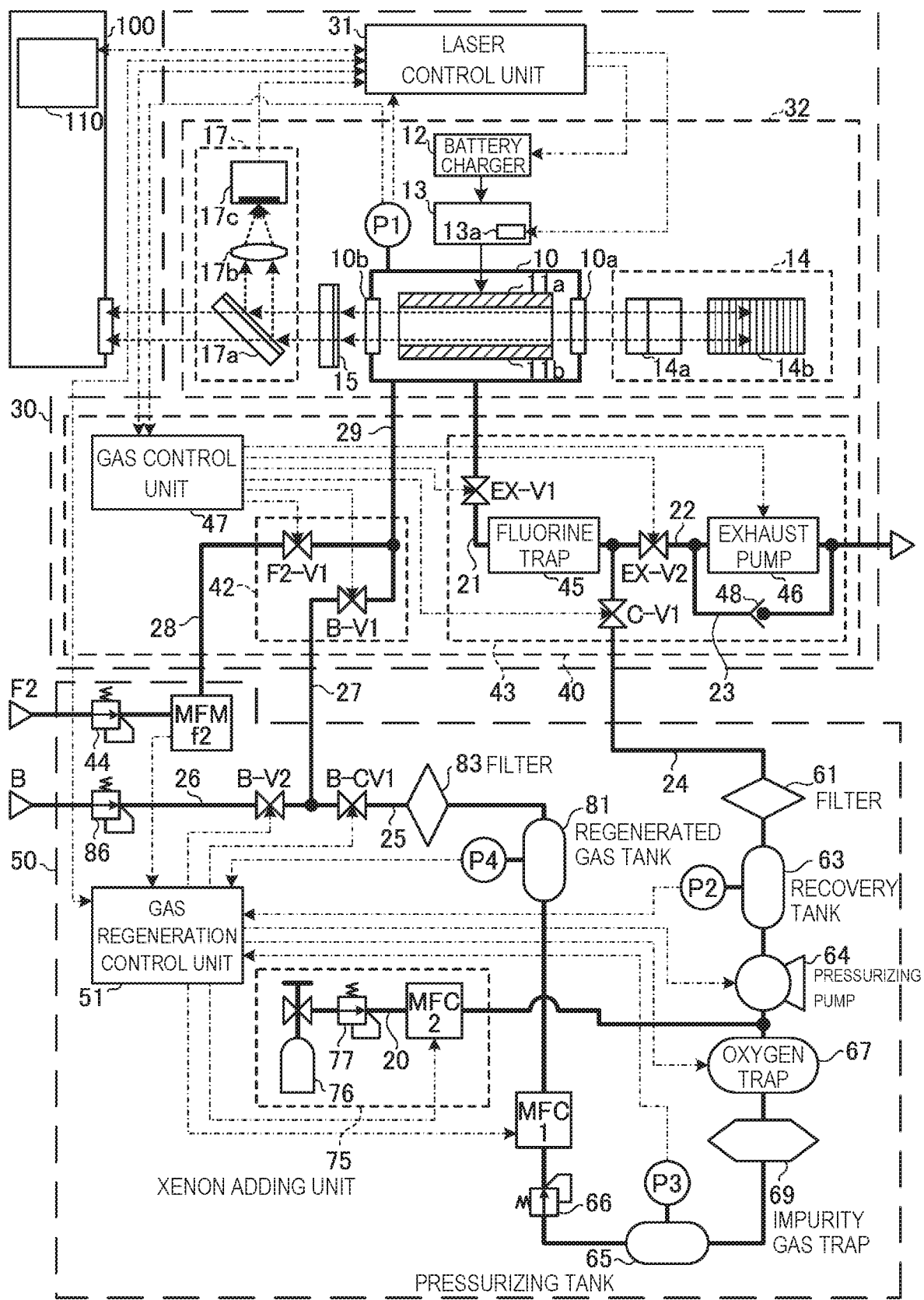
FIG. 30 schematically shows configurations of an excimer laser apparatus 30 and a laser gas regenerating apparatus 50 according to a seventh embodiment of the present disclosure.

FIG. 30 schematically shows configurations of an excimer laser apparatus 30 and a laser gas regenerating apparatus 50 according to a seventh embodiment of the present disclosure. In the seventh embodiment, the xenon adding unit 75 included in the laser gas regenerating apparatus 50 is connected to the pipe 24 between the pressurizing pump 64 and the oxygen trap 67.

Other than the above, a configuration of the seventh embodiment is the same as that of the first embodiment.

8.2 Effect

The xenon adding unit 75 in the seventh embodiment is connected to the pipe 24 upstream of the xenon adding unit 75 in the first embodiment. Thus, the laser gas before added with xenon can be better mixed with the xenon-containing gas through the various traps and the pressurizing tank 65.

FIG. 30 corresponds to a case where an arrangement of the xenon adding unit 75 is changed from that in the first embodiment, but the present disclosure is not limited thereto. The arrangement of the xenon adding unit 75 may be changed from those in the second to sixth embodiments.

FIG. 30 shows the xenon adding unit 75 connected to the pipe 24 between the pressurizing pump 64 and the oxygen trap 67, but the present disclosure is not limited thereto. The xenon adding unit 75 may be connected to any point in the gas purifying channel between the valve C-V1 and the valve B-V1.

9. Example of Regenerated Gas Tank

9.1 First Example

9.1.1 Configuration

Figure 31:
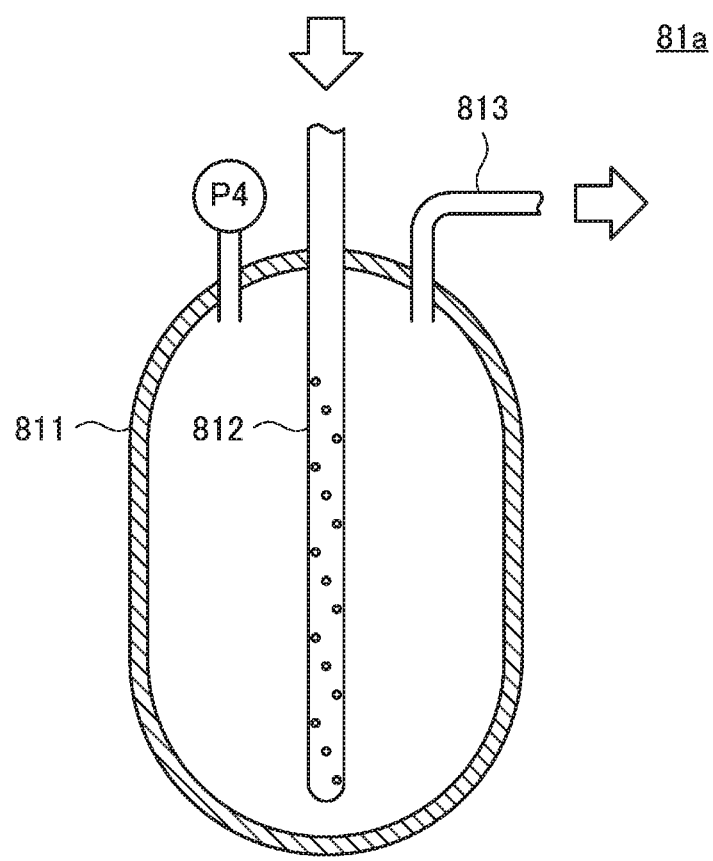
FIG. 31 schematically shows a first example of a regenerated gas tank that can be used in the embodiments.

FIG. 31 schematically Shows a First Example of a regenerated gas tank that can be used in the embodiments. A regenerated gas tank 81a in FIG. 31 includes a container 811, and an insert pipe 812 and a lead-out pipe 813 inserted into the container 811. An inert gas pressure sensor P4 is further connected to the container 811.

One end of the insert pipe 812 is located outside the container 811, and the other end of the insert pipe 812 is located inside the container 811. In the container 811, the insert pipe 812 has many through holes.

One end of the lead-out pipe 813 is located outside the container 811, and the other end of the lead-out pipe 813 is located inside the container 811.

9.1.2 Operation and Effect

The inert regenerated gas introduced from the one end of the insert pipe 812 is ejected from the insert pipe 812 through the many through holes into the container 811 in various directions. This causes a complex flow of the inert regenerated gas in the container 811, thereby mixing the inert regenerated gas.

The inert regenerated gas in the container 811 is led through the lead-out pipe 813 to the outside of the container 811.

With the configuration in FIG. 31, the inert regenerated gas added with the xenon-containing gas in a better mixed state is supplied to the laser chamber 10.

FIG. 31 shows the example of the regenerated gas tank, but separately from the regenerated gas tank, a mixer having the same configuration as in FIG. 31 may be arranged in a channel of the inert regenerated gas added with the xenon-containing gas.

9.2 Second Example

9.2.1 Configuration

Figure 32:
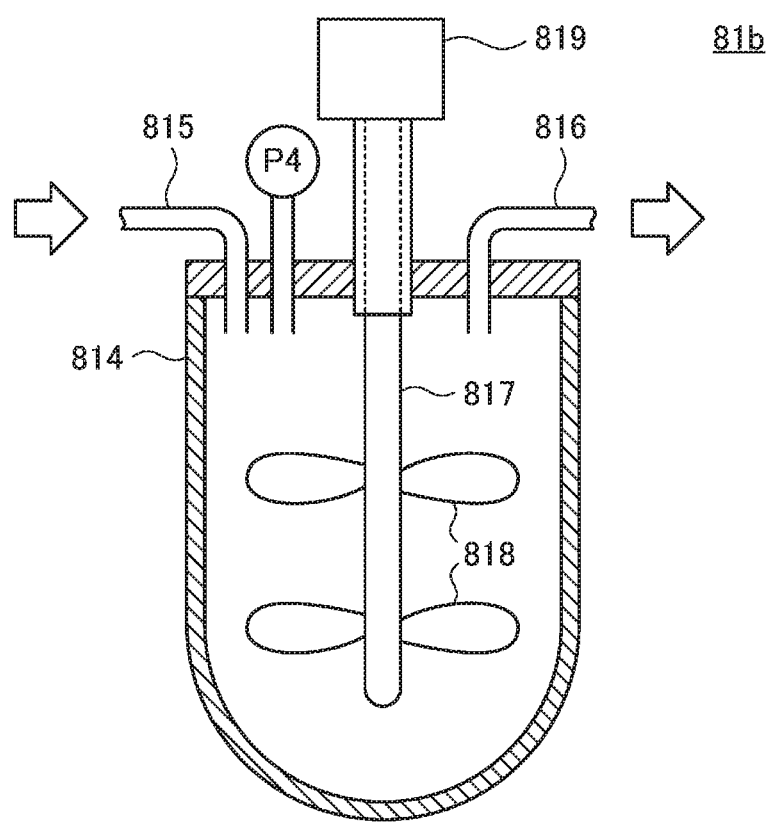
FIG. 32 schematically shows a second example of a regenerated gas tank that can be used in the embodiments.

FIG. 32 schematically shows a second example of a regenerated gas tank that can be used in the embodiments. A regenerated gas tank 81b in FIG. 32 includes a container 814, a gas introducing pipe 815 and a gas lead-out pipe 816 inserted into the container 814, and a propeller shaft 817. An inert gas pressure sensor P4 is further connected to the container 814.

One end of each of the gas introducing pipe 815 and the gas lead-out pipe 816 is located outside the container 814, and the other end of each of the gas introducing pipe 815 and the gas lead-out pipe 816 is located inside the container 814.

One end of the propeller shaft 817 is located outside the container 814, and the other end of the propeller shaft 817 is located inside the container 814. In the container 814, a propeller 818 is mounted to the propeller shaft 817. Outside the container 814, a motor 819 is mounted to the propeller shaft 817. The propeller shaft 817, the propeller 818, and the motor 819 constitute an agitator. The propeller 818 may have any shape.

9.2.2 Operation and Effect

The inert regenerated gas introduced from the one end of the gas introducing pipe 815 is introduced into the container 814.

When the motor 819 rotates the propeller shaft 817, the propeller 818 is rotated to mix the inert regenerated gas in the container 814.

The inert regenerated gas in the container 814 is led through the gas lead-out pipe 816 to the outside of the container 814.

With the configuration in FIG. 32, the inert regenerated gas added with the xenon-containing gas in a better mixed state is supplied to the laser chamber 10.

FIG. 32 shows the example of the regenerated gas tank, but separately from the regenerated gas tank, a mixer having the same configuration as in FIG. 32 may be arranged in a channel of the inert regenerated gas added with the xenon-containing gas.

10. Others

Figure 33:
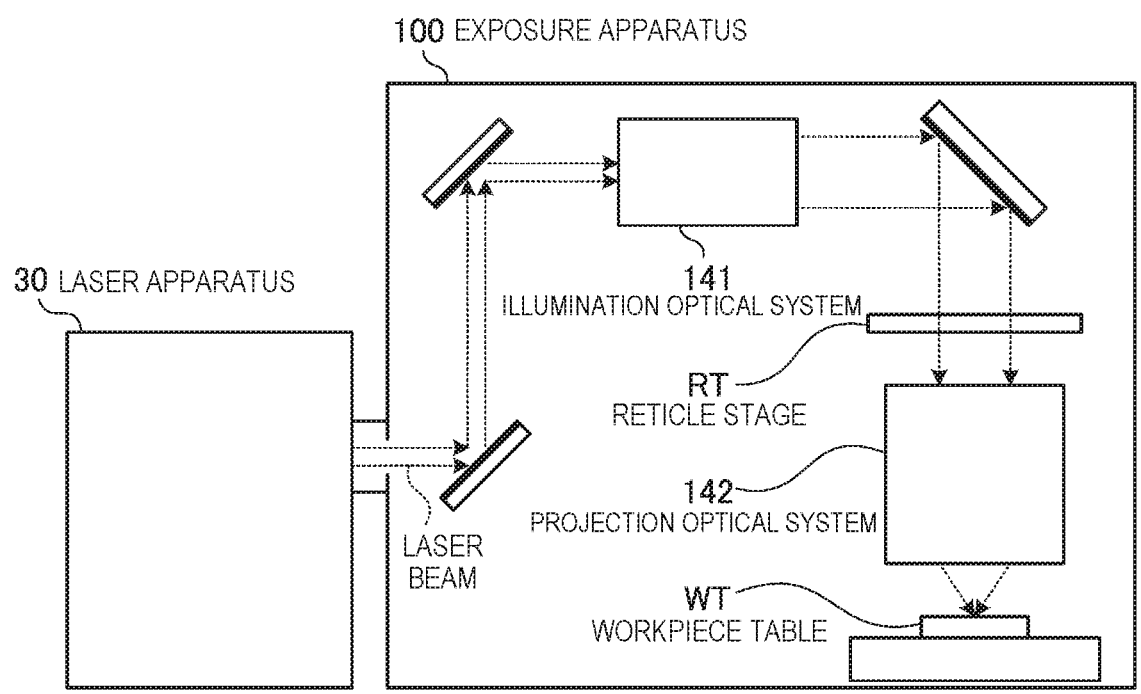
FIG. 33 schematically shows a configuration of an exposure apparatus 100 connected to the excimer laser apparatus 30.

FIG. 33 schematically shows a configuration of an exposure apparatus 100 connected to the excimer laser apparatus 30. As described above, the excimer laser apparatus 30 generates and outputs a laser beam to the exposure apparatus 100.

In FIG. 33, the exposure apparatus 100 includes an illumination optical system 141 and a projection optical system 142. The illumination optical system 141 illuminates, with a laser beam incident from the excimer laser apparatus 30, a reticle pattern on a reticle stage RT. The projection optical system 142 reduces and projects the laser beam having passed though the reticle and forms an image thereof on a workpiece (not shown) arranged on a workpiece table WT. The workpiece is a photosensitive substrate such as a semiconductor wafer coated with photoresist. The exposure apparatus 100 synchronously translates the reticle stage RT and the workpiece table WT to expose the workpiece to the laser beam reflecting the reticle pattern. Through an exposure process as described above, a device pattern is transferred onto the semiconductor wafer, thereby manufacturing an electronic device.

In the specification, the partial gas exchange processing including both exchanging part of the laser gas in the laser chamber 10 and supplying the fluorine gas in the consumed amount has been described, but the present disclosure is not limited thereto. The present disclosure can be applied to a case where exchanging part of the laser gas such that partial pressure of fluorine gas in the laser gas in the laser chamber 10 is equal between before and after the partial gas exchange, and supplying the fluorine gas in the amount consumed by the operation of the excimer laser apparatus 30 to increase the partial pressure of the fluorine gas in the laser gas in the laser chamber 10 to a desired range are performed at different timings.

11. KrF Excimer Laser Apparatus

In the first to seventh embodiments, the excimer laser apparatus 30 being the ArF excimer laser apparatus using a laser gas containing fluorine gas and argon gas has been described, but the present disclosure is not limited thereto. The excimer laser apparatus 30 may be a KrF excimer laser apparatus using a laser gas containing fluorine gas and krypton gas. In eighth to fourteenth embodiments, the ArF excimer laser apparatus in the first to seventh embodiments is replaced with a KrF excimer laser apparatus.

The KrF excimer laser apparatus and a laser gas regenerating apparatus 50 according to the eighth to fourteenth embodiments are different from the first to seventh embodiments as below.

A fluorine-containing gas supplied from the fluorine-containing gas supply source F2 is, for example, a laser gas containing fluorine gas, krypton gas, and neon gas. The fluorine-containing gas supply source F2 may have a gas composition of, for example, 1% fluorine gas, 3.5% krypton gas, the balance being neon gas.

An inert new gas supplied from the inert gas supply source B is, for example, a laser gas containing krypton gas, neon gas, and a small amount of xenon gas. The inert gas supply source B may have a gas composition of, for example, 10 ppm xenon gas, 3.5% krypton gas, the balance being neon gas.

A xenon-containing gas supplied from the xenon-containing gas cylinder 76 is, for example, a laser gas containing krypton gas, neon gas, and xenon gas. The xenon-containing gas cylinder 76 may have a gas composition of, for example, 10000 ppm xenon gas, 3.5% krypton gas, the balance being neon gas.

Figure 34:
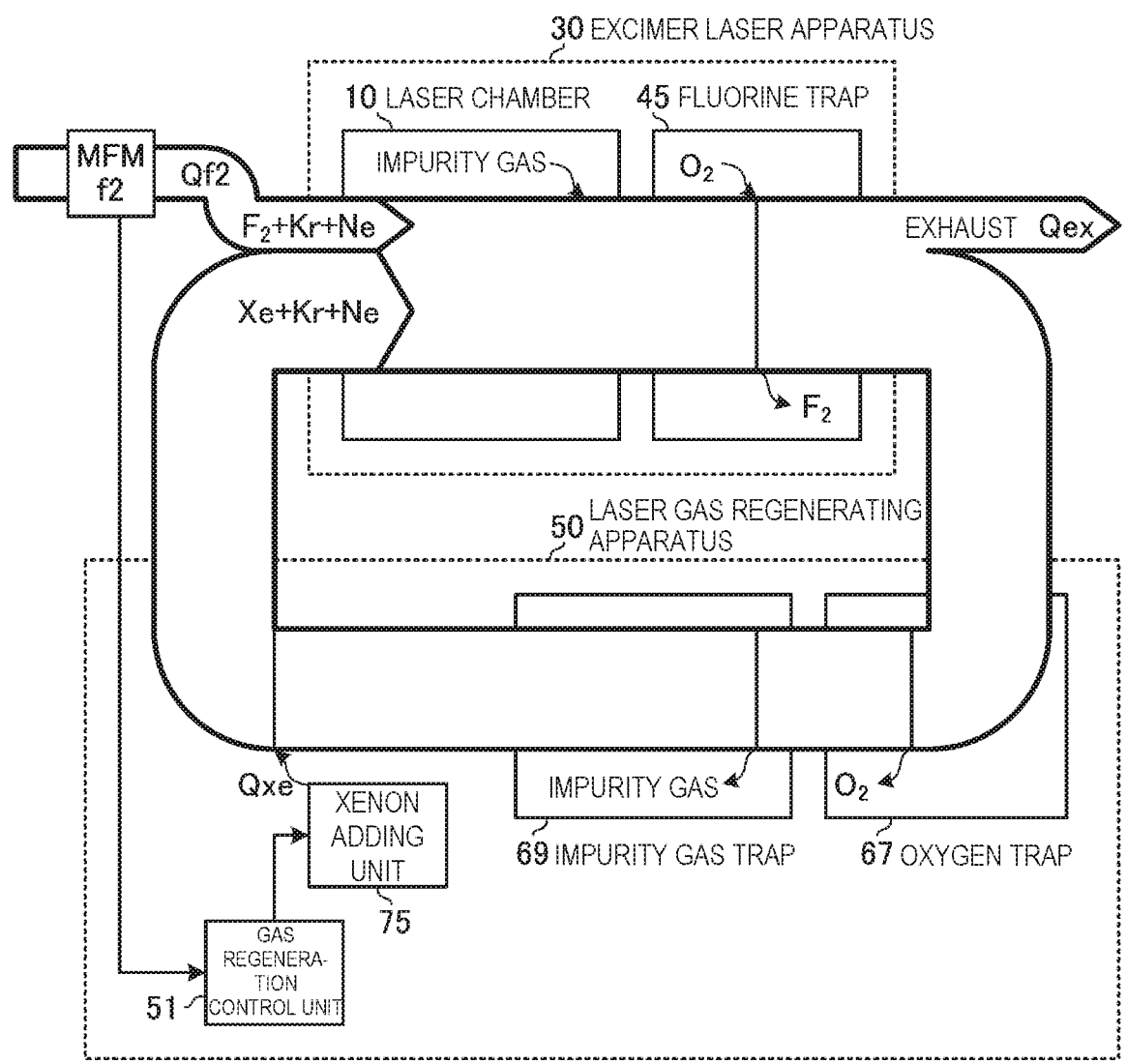
FIG. 34 is a flow diagram of a laser gas in an eighth embodiment of the present disclosure.

FIG. 34 is a flow diagram of a laser gas in the eighth embodiment of the present disclosure. The eighth embodiment includes a KrF excimer laser apparatus and a laser gas regenerating apparatus 50. A configuration of the eighth embodiment is the same as that of the first embodiment described with reference to FIG. 14. In the eighth embodiment, from the fluorine-containing gas supply source F2, a fluorine-containing gas containing fluorine gas, krypton gas, and neon gas is supplied to the laser chamber 10. From the inert gas supply source B, an inert new gas containing krypton gas, neon gas, and a small amount of xenon gas is supplied to the laser chamber 10. From the xenon-containing gas cylinder 76, a xenon-containing gas containing krypton gas, neon gas, and xenon gas is added to an inert regenerated gas. The inert regenerated gas contains krypton gas, neon gas, and a small amount of xenon gas. Other than the above, the eighth embodiment is the same as the first embodiment.

Although not shown, the ninth embodiment of the present disclosure is the same as the second embodiment except that the ArF excimer laser apparatus in the second embodiment is replaced with a KrF excimer laser apparatus.

Figure 35:
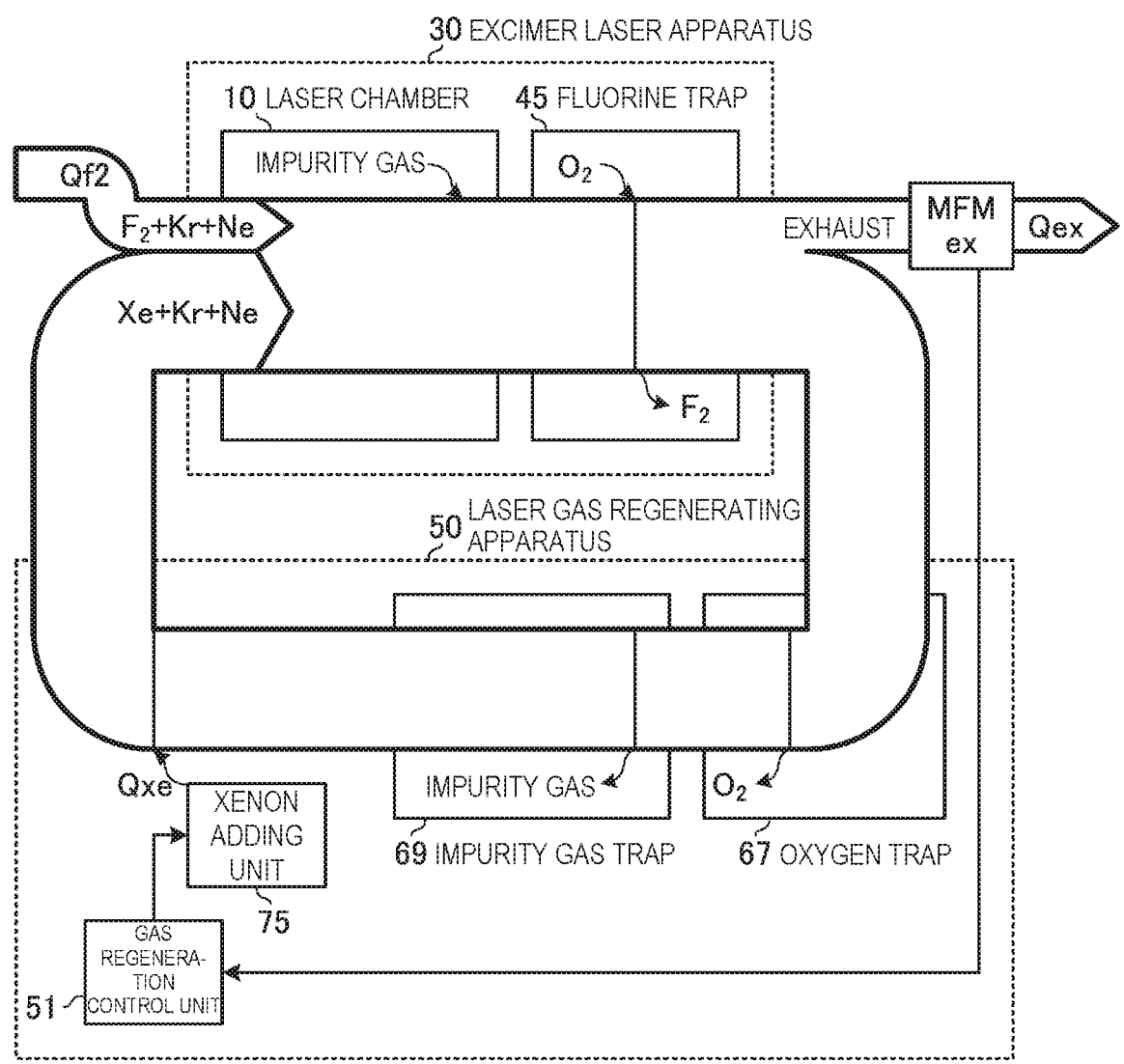
FIG. 35 is a flow diagram of a laser gas in a tenth embodiment of the present disclosure.

FIG. 35 is a flow diagram of a laser gas in the tenth embodiment of the present disclosure. The tenth embodiment includes a KrF excimer laser apparatus and a laser gas regenerating apparatus 50. A configuration of the tenth embodiment is the same as that of the third embodiment described with reference to FIG. 20. In the tenth embodiment, from the fluorine-containing gas supply source F2, a fluorine-containing gas containing fluorine gas, krypton gas, and neon gas is supplied to the laser chamber 10. From the inert gas supply source B, an inert new gas containing krypton gas, neon gas, and a small amount of xenon gas is supplied to the laser chamber 10. From the xenon-containing gas cylinder 76, a xenon-containing gas containing krypton gas, neon gas, and xenon gas is added to an inert regenerated gas. The inert regenerated gas contains krypton gas, neon gas, and a small amount of xenon gas.

Other than the above, the tenth embodiment is the same as the third embodiment.

Although not shown, the eleventh to fourteenth embodiments of the present disclosure are the same as the fourth to seventh embodiments except that the ArF excimer laser apparatus in the fourth to seventh embodiments is replaced with a KrF excimer laser apparatus.

In the laser gas regenerating apparatus according to the eighth to the fourteenth embodiments, the regenerated gas tank 81a or 81b described with reference to FIG. 31 or FIG. 32 may be used.

The KrF excimer laser apparatus according to the eighth to fourteenth embodiments may be used in the exposure apparatus 100 described with reference to FIG. 33.

Performance of the KrF excimer laser apparatus using a laser gas containing a small amount of xenon gas will be described later with reference to FIG. 37.

12. Range of Xenon Gas Concentration in which Performance of Laser Apparatus is Improved

12.1 Performance of ArF Excimer Laser Apparatus

Figure 36:
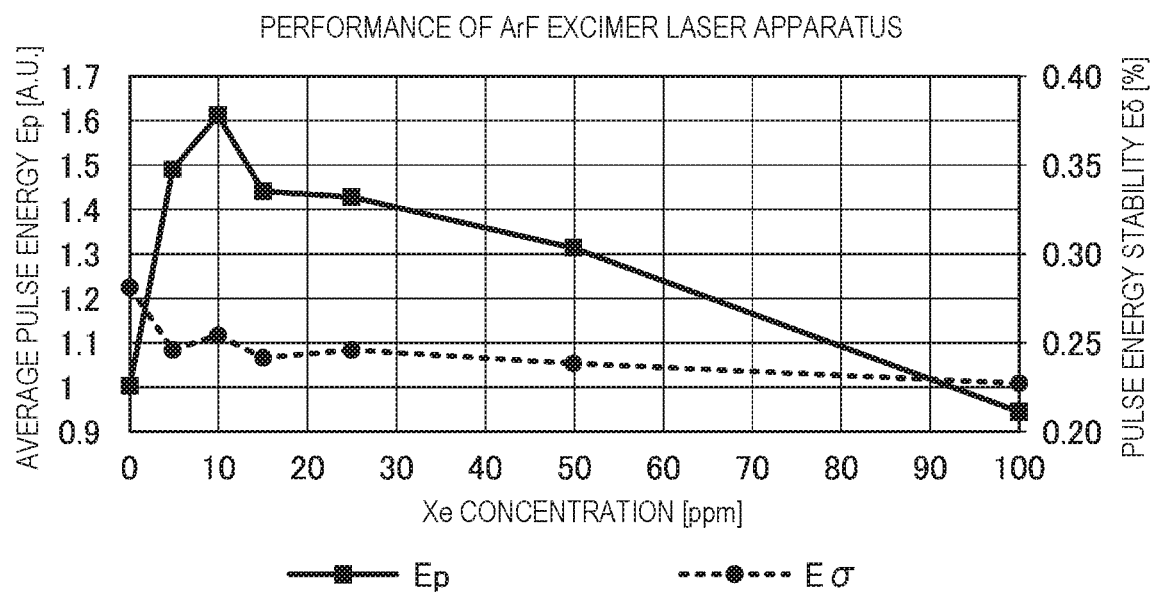
FIG. 36 is a graph showing performance of an ArF excimer laser apparatus relative to a xenon gas concentration.

FIG. 36 is a graph showing performance of the ArF excimer laser apparatus relative to the xenon gas concentration. FIG. 36 shows a result of measurement of performance of the ArF excimer laser apparatus at a repetition frequency of 6 kHz of a pulse laser beam. The performance of the ArF excimer laser apparatus includes average pulse energy Ep and pulse energy stability E$\sigma$. The average pulse energy Ep is represented by a proportion to average pulse energy when the xenon gas concentration is 0 ppm. The pulse energy stability E$\sigma$ is a value calculated as below using, for example, the average pulse energy Ep and standard deviation $\sigma$.

$$E\sigma = \sigma/Ep$$

Smaller values of the pulse energy stability E$\sigma$ represent the pulse energy being more stable with less variations.

As described below, when the laser chamber 10 holds a small amount of xenon gas, the performance of the ArF excimer laser apparatus may be improved as compared to when the xenon gas concentration is 0 ppm.

(1) When the xenon gas concentration is about 10 ppm, the highest average pulse energy Ep is obtained.
(2) When the xenon gas concentration is 1 ppm to 90 ppm, the average pulse energy Ep is higher than the average pulse energy when the xenon gas concentration is 0 ppm.
(3) When the xenon gas concentration is 3 ppm to 50 ppm, the average pulse energy Ep is higher than 1.3 times the average pulse energy when the xenon gas concentration is 0 ppm.
(4) When the xenon gas concentration is 4 ppm to 30 ppm, the average pulse energy Ep is higher than 1.4 times the average pulse energy when the xenon gas concentration is 0 ppm.
(5) When the xenon gas concentration is 6 ppm to 13 ppm, the average pulse energy Ep is higher than 1.5 times the average pulse energy when the xenon gas concentration is 0 ppm.
(6) In any of (1) to (5), the pulse energy stability E$\sigma$ is improved as compared to when the xenon gas concentration is 0 ppm.

Figure 38:
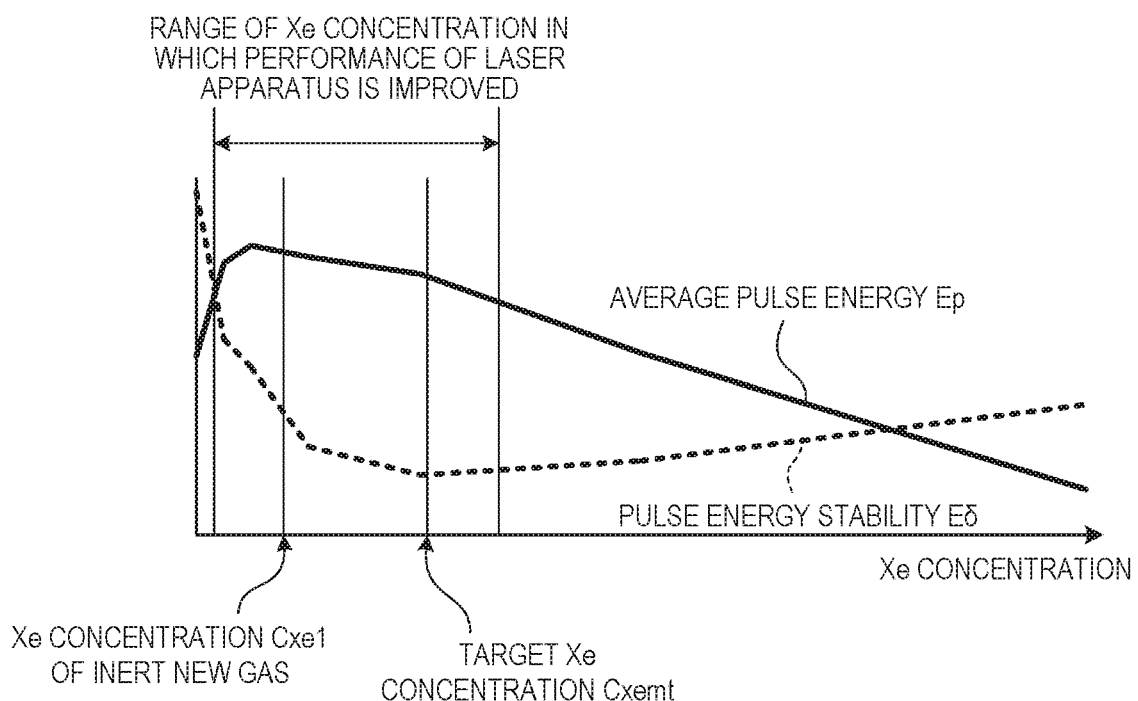
FIG. 38 is a graph illustrating a set value of a target xenon gas concentration Cxemt in a fifteenth embodiment of the present disclosure.

A target xenon gas concentration Cxemt described later with reference to FIG. 38 is set, for example, within any of the ranges in (1) to (5).

12.2 Performance of KrF Excimer Laser Apparatus

Figure 37:
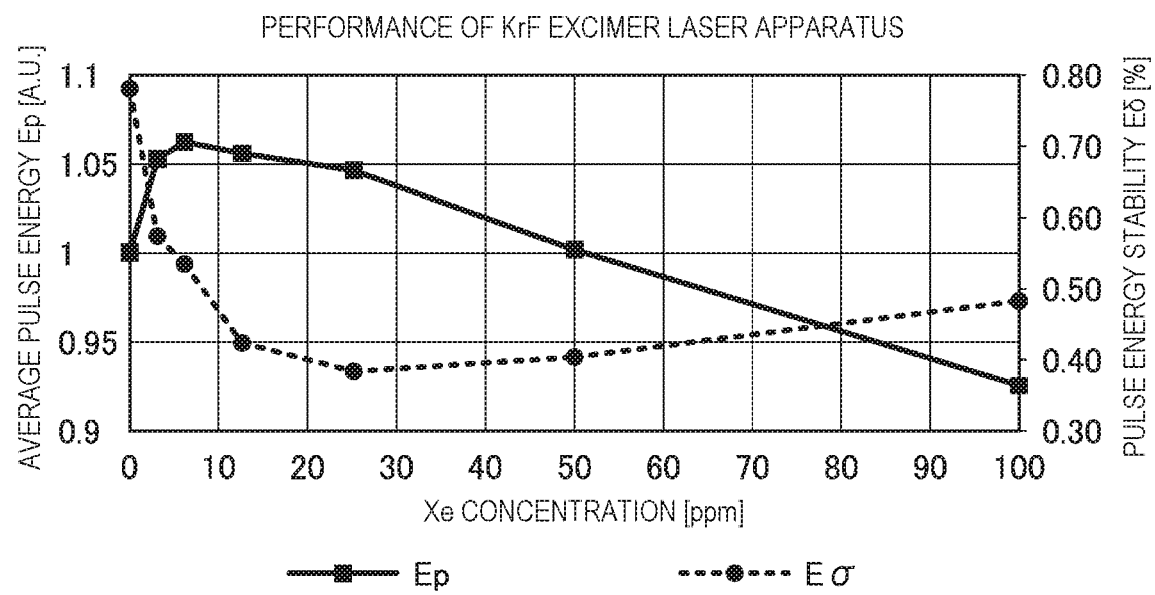
FIG. 37 is a graph showing performance of a KrF excimer laser apparatus relative to a xenon gas concentration.

FIG. 37 is a graph showing performance of the KrF excimer laser apparatus relative to the xenon gas concentration. FIG. 37 shows a result of measurement of performance of the KrF excimer laser apparatus at a repetition frequency of 6 kHz of a pulse laser beam. The performance of the KrF excimer laser apparatus includes average pulse energy Ep and pulse energy stability E$\sigma$. The average pulse energy Ep and the pulse energy stability E$\sigma$ are calculated by the same method as described in relation to the performance of the ArF excimer laser apparatus.

As described below, when the laser chamber 10 holds a small amount of xenon gas, the performance of the KrF excimer laser apparatus may be improved as compared to when the xenon gas concentration is 0 ppm.

(1) When the xenon gas concentration is about 6 ppm, the highest average pulse energy Ep is obtained.
(2) When the xenon gas concentration is 1 ppm to 50 ppm, the average pulse energy Ep is higher than the average pulse energy when the xenon gas concentration is 0 ppm.
(3) When the xenon gas concentration is 2 ppm to 30 ppm, the average pulse energy Ep is higher than 1.03 times the average pulse energy when the xenon gas concentration is 0 ppm.
(4) When the xenon gas concentration is 3 ppm to 20 ppm, the average pulse energy Ep is higher than 1.05 times the average pulse energy when the xenon gas concentration is 0 ppm.
(5) In any of (1) to (4), the pulse energy stability E$\sigma$ is improved as compared to when the xenon gas concentration is 0 ppm.

In particular, when the xenon gas concentration is equal to or higher than 6 ppm, the pulse energy stability E$\sigma$ is significantly improved. Thus, the range of the xenon gas concentration in which both the average pulse energy Ep and the pulse energy stability E$\sigma$ are improved is preferably 6 ppm to 50 ppm.

A target xenon gas concentration Cxemt described later with reference to FIG. 38 is set, for example, within any of the ranges in (1) to (4).

13. Target xenon gas concentration Cxemt considering reduction in xenon gas concentration FIG. 38 is a graph illustrating a set value of a target xenon gas concentration Cxemt in a fifteenth embodiment of the present disclosure.

In the fifteenth embodiment, the target xenon gas concentration Cxemt is set different from the target xenon gas concentration Cxect in the laser chamber 10 described in the first and third embodiments. The xenon-containing gas is added such that the xenon gas concentration when the fluorine-containing gas is mixed with the xenon-containing gas is equal to the target xenon gas concentration Cxemt.

13.1 Relationship Between Xenon Gas Concentration Cxe1 of Inert New Gas and Target Xenon Gas Concentration Cxemt The target xenon gas concentration Cxemt is set within the range of the xenon gas concentration in which performance of the laser apparatus is improved. The xenon gas concentration at which performance of the laser apparatus is improved is, for example, as described with reference to FIG. 36 or FIG. 37.

Further, the target xenon gas concentration Cxemt is set to a value higher than a xenon gas concentration Cxe1 of the inert new gas supplied from the inert gas supply source B.

In the ArF excimer laser apparatus, the xenon gas concentration at which performance of the laser apparatus is improved is, for example, equal to or lower than 90 ppm. Thus, the target xenon gas concentration Cxemt is preferably set to a value higher than the xenon gas concentration Cxe1 of the inert new gas and equal to or lower than 90 ppm.

In the KrF excimer laser apparatus, the xenon gas concentration Cxe1 at which performance of the laser apparatus is improved is, for example, equal to or lower than 50 ppm. Thus, the target xenon gas concentration Cxemt is preferably set to a value higher than the xenon gas concentration Cxe1 of the inert new gas and equal to or lower than 50 ppm.

The xenon gas concentration Cxe1 of the inert new gas is set within the range of the xenon gas concentration in which performance of the laser apparatus is improved. The xenon gas concentration at which performance of the laser apparatus is improved is, for example, as described with reference to FIG. 36 or FIG. 37. The xenon gas concentration Cxe1 of the inert new gas is lower than the target xenon gas concentration Cxemt.

In the ArF excimer laser apparatus, the xenon gas concentration Cxe1 of the inert new gas is, for example, 6 ppm to 13 ppm, preferably 8 ppm to 12 ppm.

In the KrF excimer laser apparatus, the xenon gas concentration Cxe1 of the inert new gas is, for example, 6 ppm to 25 ppm, preferably 8 ppm to 15 ppm.

Other than the above, the fifteenth embodiment is the same as the first to fourteenth embodiments.

The reason why the target xenon gas concentration Cxemt is set to a value higher than the xenon gas concentration Cxe1 of the inert new gas will be described below.

The present disclosure allows a necessary addition amount Qxe of the xenon-containing gas to be estimated based on the supply amount Qf2 of the fluorine-containing gas or the exhaust amount Qex of the laser gas, unlike the comparative example using an expensive xenon concentration meter. Thus, if an amount of xenon trapped by the impurity gas trap 69 or the like is substantially negligible, the first to fourteenth embodiments allow accurate adjustment of the xenon gas concentration in the laser chamber 10.

However, in the laser gas regenerating apparatus 50, not only impurity gas is trapped from the laser gas discharged from the laser chamber 10, but also part of xenon gas may be trapped for some reasons. Thus, repeating regeneration of the laser gas may slightly reduce the xenon gas concentration.

On the other hand, as described with reference to FIG. 36 and FIG. 37, there may be a certain allowable range of the xenon gas concentration in which performance of the laser apparatus is improved.

Thus, in the fifteenth embodiment, the target xenon gas concentration Cxemt is set to a higher value within the range of the xenon gas concentration in which performance of the laser apparatus is improved. Thus, even if part of xenon gas is trapped for some reasons, the xenon gas concentration in the laser chamber 10 falls within the range of the xenon gas concentration in which performance of the laser apparatus is improved.

For example, before start of operation of the laser gas regenerating apparatus 50, the inert new gas is supplied from the inert gas supply source B and the fluorine-containing gas is supplied from the fluorine-containing gas supply source F2 to the laser chamber 10. The xenon gas concentration in the laser chamber 10 when the fluorine-containing gas is mixed with the inert new gas is slightly lower than the xenon gas concentration Cxe1 of the inert new gas.

The laser gas regenerating apparatus 50 is operated with the target xenon gas concentration Cxemt set to a value higher than the xenon gas concentration Cxe1 of the inert new gas, and thus the xenon gas concentration in the laser chamber 10 gradually approaches the target xenon gas concentration Cxemt. Even if part of xenon gas is trapped for some reasons, the xenon gas concentration in the laser chamber 10 falls between the xenon gas concentration Cxe1 of the inert new gas and the target xenon gas concentration Cxemt. Thus, the xenon gas concentration in the laser chamber 10 falls within an allowable range, thereby suppressing reduction in performance of the laser apparatus.

13.2 Determination of Addition Amount Qxe of Xenon-Containing Gas Based on Supply Amount Qf2 of Fluorine-Containing Gas Determination of the addition amount Qxe of the xenon-containing gas based on the supply amount Qf2 of the fluorine-containing gas as in the first and second embodiments will be described.

In the fifteenth embodiment, a flow ratio of the addition amount Qxe of the xenon-containing gas to the supply amount Qf2 of the fluorine-containing gas is represented by Rf2. The ratio Rf2 is set as below such that the xenon gas concentration when the fluorine-containing gas is mixed with the xenon-containing gas is equal to the target xenon gas concentration Cxemt.

$$Rf2 = Cxemt/(Cxeb - Cxemt)$$

where Cxeb is the xenon gas concentration of the xenon-containing gas.

Like Equation 1, the addition amount Qxe of the xenon-containing gas is given by the equation below.

$$Qxe = Rf2 \cdot Qf2 \qquad \text{(Equation 3)}$$

13.3 Determination of Addition Amount Qxe of Xenon-Containing Gas Based on Exhaust Amount Qex of Laser Gas Determination of the addition amount Qxe of the xenon-containing gas based on the exhaust amount Qex of the laser gas exhausted outside the apparatus as in the third embodiment will be described.

In the fifteenth embodiment, when a flow ratio of the addition amount Qxe of the xenon-containing gas to the exhaust amount Qex of the laser gas is represented by Rex, the addition amount Qxe of the xenon-containing gas is given by the equation below like Equation 2.

$$Qxe = Rex \cdot Qex \qquad \text{(Equation 4)}$$

The supply amount Qf2 of the fluorine-containing gas can be expressed by the equation below with the exhaust amount Qex of the laser gas and the fluorine gas concentration Cf2 of the fluorine-containing gas.

$$Qf2 = Qex/(1 - \tfrac{1}{2} \cdot Cf2)$$

From this equation and Equation 3, the addition amount Qxe of the xenon-containing gas is given by the equation below.

$$Qxe = \{Rf2/(1 - \tfrac{1}{2} \cdot Cf2)\} Qex$$

From this equation and Equation 4, the ratio Rex of the addition amount Qxe of the xenon-containing gas to the exhaust amount Qex of the laser gas is given as below.

$$Rex = Rf2/(1 - \tfrac{1}{2} \cdot Cf2)$$

As in the fourth embodiment, the addition amount Qxe of the xenon-containing gas may be determined based on data on the exhaust amount Qex used by the gas control unit 47. In this case, the supply amount Qf2 of the fluorine-containing gas is substantially equal to the exhaust amount Qex.

Then, from Equation 3, the addition amount Qxe of the xenon-containing gas is given by the equation below.

$$Qxe = Rf2 \cdot Qex$$

The laser gas regenerating apparatus according to the fifteenth embodiment may use the regenerated gas tank 81a or 81b described with reference to FIG. 31 or FIG. 32.

The excimer laser apparatus according to the fifteenth embodiment may be used in the exposure apparatus 100 described with reference to FIG. 33.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more."

What is claimed is:

1. A laser gas regenerating apparatus which is configured to regenerate a discharged gas discharged from at least one ArF excimer laser apparatus and to supply the regenerated gas to the at least one ArF excimer laser apparatus, the at least one ArF excimer laser apparatus being connected to a first laser gas supply source configured to supply a first laser gas containing argon gas, neon gas, and xenon gas with a first concentration, the first laser gas being new gas, and to a second laser gas supply source configured to supply a second laser gas containing argon gas, neon gas, and fluorine gas, the second laser gas being new gas, the laser gas regenerating apparatus comprising:
    a data obtaining unit configured to obtain data on a supply amount of the second laser gas supplied to the at least one ArF excimer laser apparatus;
    a xenon adding unit configured to add, to the regenerated gas, a third laser gas containing argon gas, neon gas, and xenon gas with a second concentration higher than the first concentration the third laser gas being new gas; and
    a control unit configured to control, based on the supply amount of the second laser gas, an addition amount of the third laser gas by the xenon adding unit.

2. The laser gas regenerating apparatus according to claim 1, wherein
    the control unit controls the addition amount of the third laser gas by the xenon adding unit in proportion to the supply amount.

3. The laser gas regenerating apparatus according to claim 1, further comprising
    a measuring unit configured to measure the supply amount and transmit data on the supply amount to the data obtaining unit.

4. The laser gas regenerating apparatus according to claim 3, wherein
    the measuring unit includes a massflow meter arranged in a pipe connected between the second laser gas supply source and the at least one ArF excimer laser apparatus.

5. The laser gas regenerating apparatus according to claim 1, wherein
    the data obtaining unit receives measurement data from the massflow meter arranged in the pipe connected between the at least one ArF excimer laser apparatus and the second laser gas supply source and obtains data on the supply amount.

6. The laser gas regenerating apparatus according to claim 1, wherein
    the data obtaining unit receives and obtains data on the supply amount from the at least one ArF excimer laser apparatus.

7. The laser gas regenerating apparatus according to claim 1, further comprising
    a regenerated gas tank configured to hold and mix the regenerated gas added with the third laser gas by the xenon adding unit.

8. The laser gas regenerating apparatus according to claim 1, wherein the at least one ArF excimer laser apparatus includes a plurality of ArF excimer laser apparatuses.

9. The laser gas regenerating apparatus according to claim 8, wherein
    the supply amount is a sum of supply amounts of the second laser gas supplied to the ArF excimer laser apparatuses.

10. A laser gas regenerating apparatus which is configured to regenerate a discharged gas discharged from at least one ArF excimer laser apparatus and to supply the regenerated gas to the at least one ArF excimer laser apparatus, the at least one ArF excimer laser apparatus being connected to a first laser gas supply source configured to supply a first laser gas containing argon gas, neon gas, and xenon gas with a first concentration and to a second laser gas supply source configured to supply a second laser gas containing argon gas, neon gas, and fluorine gas, the laser gas regenerating apparatus comprising:
    a data obtaining unit configured to obtain data on a supply amount of the second laser gas supplied before passing through any one of the at least one ArF excimer laser apparatus to the at least one ArF excimer laser apparatus;
    a xenon adding unit configured to add, to the regenerated gas, a third laser gas containing argon gas, neon gas, and xenon gas with a second concentration higher than the first concentration; and
    a control unit configured to control, based on the supply amount of the second laser gas, an addition amount of the third laser gas by the xenon adding unit.

11. The laser gas regenerating apparatus according to claim 10, wherein
    the control unit controls the addition amount of the third laser gas by the xenon adding unit in proportion to the supply amount.

12. The laser gas regenerating apparatus according to claim 10, further comprising
    a measuring unit configured to measure the supply amount and transmit data on the supply amount to the data obtaining unit.

13. The laser gas regenerating apparatus according to claim 12, wherein
    the measuring unit includes a massflow meter arranged in a pipe connected between the second laser gas supply source and the at least one ArF excimer laser apparatus.

14. The laser gas regenerating apparatus according to claim 10, wherein
    the data obtaining unit receives measurement data from the massflow meter arranged in the pipe connected between the second laser gas supply source and the at least one ArF excimer laser apparatus and obtains data on the supply amount.

15. The laser gas regenerating apparatus according to claim 10, wherein
the data obtaining unit receives and obtains data on the supply amount from the at least one ArF excimer laser apparatus.

16. The laser gas regenerating apparatus according to claim 10, further comprising
a regenerated gas tank configured to hold and mix the regenerated gas added with the third laser gas by the xenon adding unit.

17. The laser gas regenerating apparatus according to claim 10, wherein
the at least one ArF excimer laser apparatus includes a plurality of ArF excimer laser apparatuses.

18. The laser gas regenerating apparatus according to claim 17, wherein
the supply amount is a sum of supply amounts of the second laser gas supplied to the ArF excimer laser apparatuses.

19. An electronic device manufacturing method comprising:
generating a laser beam with an excimer laser system, the excimer laser system including
at least one ArF excimer laser apparatus connected to a first laser gas supply source configured to supply a first laser gas containing argon gas, neon gas, and xenon gas with a first concentration, the first laser gas being new gas, and to a second laser gas supply source configured to supply a second laser gas containing argon gas, neon gas, and fluorine gas, the second laser gas being new gas, and
a laser gas regenerating apparatus configured to regenerate a discharged gas discharged from the at least one ArF excimer laser apparatus and to supply the regenerated gas to the at least one ArF excimer laser apparatus, the laser gas regenerating apparatus including a data obtaining unit configured to obtain data on a supply amount of the second laser gas supplied to the at least one ArF excimer laser apparatus, a xenon adding unit configured to add, to the regenerated gas, a third laser gas containing argon gas, neon gas, and xenon gas with a second concentration higher than the first concentration, the third laser gas being new gas, and a control unit configured to control, based on the supply amount of the second laser gas, an addition amount of the third laser gas by the xenon adding unit;
outputting the laser beam to an exposure apparatus; and
exposing a photosensitive substrate to the laser beam within the exposure apparatus.

20. An electronic device manufacturing method comprising:
generating a laser beam with an excimer laser system, the excimer laser system including
at least one ArF excimer laser apparatus connected to a first laser gas supply source configured to supply a first laser gas containing argon gas, neon gas, and xenon gas with a first concentration and to a second laser gas supply source configured to supply a second laser gas containing argon gas, neon gas, and fluorine gas, and
a laser gas regenerating apparatus configured to regenerate a discharged gas discharged from the at least one ArF excimer laser apparatus and to supply the regenerated gas to the at least one ArF excimer laser apparatus, the laser gas regenerating apparatus including a data obtaining unit configured to obtain data on a supply amount of the second laser gas supplied before passing through any one of the at least one ArF excimer laser apparatus to the at least one ArF excimer laser apparatus, a xenon adding unit configured to add, to the regenerated gas, a third laser gas containing argon gas, neon gas, and xenon gas with a second concentration higher than the first concentration, and a control unit configured to control, based on the supply amount of the second laser gas, an addition amount of the third laser gas by the xenon adding unit;
outputting the laser beam to an exposure apparatus; and
exposing a photosensitive substrate to the laser beam within the exposure apparatus.

21. A laser gas regenerating apparatus which is configured to regenerate a discharged gas discharged from at least one KrF excimer laser apparatus and to supply the regenerated gas to the at least one KrF excimer laser apparatus, the at least one KrF excimer laser apparatus being connected to a first laser gas supply source configured to supply a first laser gas containing krypton gas, neon gas, and xenon gas with a first concentration, the first laser gas being new gas, and to a second laser gas supply source configured to supply a second laser gas containing krypton gas, neon gas, and fluorine gas, the second laser gas being new gas, the laser gas regenerating apparatus comprising:
a data obtaining unit configured to obtain data on a supply amount of the second laser gas supplied to the at least one KrF excimer laser apparatus;
a xenon adding unit configured to add, to the regenerated gas, a third laser gas containing krypton gas, neon gas, and xenon gas with a second concentration higher than the first concentration, the third laser gas being new gas; and
a control unit configured to control, based on the supply amount of the second laser gas, an addition amount of the third laser gas by the xenon adding unit.

22. The laser gas regenerating apparatus according to claim 21, wherein
the control unit controls the addition amount of the third laser gas by the xenon adding unit in proportion to the supply amount.

23. The laser gas regenerating apparatus according to claim 21, further comprising
a measuring unit configured to measure the supply amount and transmit data on the supply amount to the data obtaining unit.

24. The laser gas regenerating apparatus according to claim 23, wherein
the measuring unit includes a massflow meter arranged in a pipe connected between the second laser gas supply source and the at least one KrF excimer laser apparatus.

25. The laser gas regenerating apparatus according to claim 21, wherein
the data obtaining unit receives measurement data from the massflow meter arranged in the pipe connected between the at least one KrF excimer laser apparatus and the second laser gas supply source and obtains data on the supply amount.

26. The laser gas regenerating apparatus according to claim 21, wherein
the data obtaining unit receives and obtains data on the supply amount from the at least one KrF excimer laser apparatus.

27. The laser gas regenerating apparatus according to claim 21, further comprising
a regenerated gas tank configured to hold and mix the regenerated gas added with the third laser gas by the xenon adding unit.

28. The laser gas regenerating apparatus according to claim 21, wherein
the at least one KrF excimer laser apparatus includes a plurality of KrF excimer laser apparatuses.

29. The laser gas regenerating apparatus according to claim 28, wherein
the supply amount is a sum of supply amounts of the second laser gas supplied to the KrF excimer laser apparatuses.

30. A laser gas regenerating apparatus which is configured to regenerate a discharged gas discharged from at least one KrF excimer laser apparatus and to supply the regenerated gas to the at least one KrF excimer laser apparatus, the at least one KrF excimer laser apparatus being connected to a first laser gas supply source configured to supply a first laser gas containing krypton gas, neon gas, and xenon gas with a first concentration and to a second laser gas supply source configured to supply a second laser gas containing krypton gas, neon gas, and fluorine gas, the laser gas regenerating apparatus comprising:
a data obtaining unit configured to obtain data on a supply amount of the second laser gas supplied before passing through any one of the at least one KrF excimer laser apparatus to the at least one KrF excimer laser apparatus;
a xenon adding unit configured to add, to the regenerated gas, a third laser gas containing krypton gas, neon gas, and xenon gas with a second concentration higher than the first concentration; and
a control unit configured to control, based on the supply amount of the second laser gas, an addition amount of the third laser gas by the xenon adding unit.

31. The laser gas regenerating apparatus according to claim 30, wherein
the control unit controls the addition amount of the third laser gas by the xenon adding unit in proportion to the supply amount.

32. The laser gas regenerating apparatus according to claim 30, further comprising
a measuring unit configured to measure the supply amount and transmit data on the supply amount to the data obtaining unit.

33. The laser gas regenerating apparatus according to claim 32, wherein
the measuring unit includes a massflow meter arranged in a pipe connected between the second laser gas supply source and the at least one KrF excimer laser apparatus.

34. The laser gas regenerating apparatus according to claim 30, wherein
the data obtaining unit receives measurement data from the massflow meter arranged in the pipe connected between the second laser gas supply source and the at least one KrF excimer laser apparatus and obtains data on the supply amount.

35. The laser gas regenerating apparatus according to claim 30, wherein
the data obtaining unit receives and obtains data on the supply amount from the at least one KrF excimer laser apparatus.

36. The laser gas regenerating apparatus according to claim 30, further comprising
a regenerated gas tank configured to hold and mix the regenerated gas added with the third laser gas by the xenon adding unit.

37. The laser gas regenerating apparatus according to claim 30, wherein
the at least one KrF excimer laser apparatus includes a plurality of KrF excimer laser apparatuses.

38. The laser gas regenerating apparatus according to claim 37, wherein
the supply amount is a sum of supply amounts of the second laser gas supplied to the KrF excimer laser apparatuses.

39. An electronic device manufacturing method comprising:
generating a laser beam with an excimer laser system, the excimer laser system including
at least one KrF excimer laser apparatus connected to a first laser gas supply source configured to supply a first laser gas containing krypton gas, neon gas, and xenon gas with a first concentration, the first laser gas being new gas, and to a second laser gas supply source configured to supply a second laser gas containing krypton gas, neon gas, and fluorine gas, the second laser gas being new gas, and
a laser gas regenerating apparatus configured to regenerate a discharged gas discharged from the at least one KrF excimer laser apparatus and to supply the regenerated gas to the at least one KrF excimer laser apparatus, the laser gas regenerating apparatus including a data obtaining unit configured to obtain data on a supply amount of the second laser gas supplied to the at least one KrF excimer laser apparatus, a xenon adding unit configured to add, to the regenerated gas, a third laser gas containing krypton gas, neon gas, and xenon gas with a second concentration higher than the first concentration, the third laser gas being new gas, and a control unit configured to control, based on the supply amount of the second laser gas, an addition amount of the third laser gas by the xenon adding unit;
outputting the laser beam to an exposure apparatus; and
exposing a photosensitive substrate to the laser beam within the exposure apparatus.

40. An electronic device manufacturing method comprising:
generating a laser beam with an excimer laser system, the excimer laser system including
at least one KrF excimer laser apparatus connected to a first laser gas supply source configured to supply a first laser gas containing krypton gas, neon gas, and xenon gas with a first concentration and to a second laser gas supply source configured to supply a second laser gas containing krypton gas, neon gas, and fluorine gas, and
a laser gas regenerating apparatus configured to regenerate a discharged gas discharged from the at least one KrF excimer laser apparatus and to supply the regenerated gas to the at least one KrF excimer laser apparatus, the laser gas regenerating apparatus including a data obtaining unit configured to obtain data on a supply amount of the second laser gas supplied before passing through any one of the at least one KrF excimer laser apparatus to the at least one KrF excimer laser apparatus, a xenon adding unit configured to add, to the regenerated gas, a third laser gas containing krypton gas, neon gas, and xenon gas with a second concentration higher than the first concentration, and a control unit configured to control, based on the supply amount of the second laser gas, an addition amount of the third laser gas by the xenon adding unit;

outputting the laser beam to an exposure apparatus; and exposing a photosensitive substrate to the laser beam within the exposure apparatus.

\* \* \* \* \*